(12) United States Patent
Snyder et al.

(10) Patent No.: US 8,801,953 B2
(45) Date of Patent: Aug. 12, 2014

(54) ZINTL PHASES FOR THERMOELECTRIC APPLICATIONS

(75) Inventors: G. Jeffrey Snyder, Pasadena, CA (US); Eric Toberer, Pasadena, CA (US); Alex Zevalkink, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 201 days.

(21) Appl. No.: 13/277,099

(22) Filed: Oct. 19, 2011

(65) Prior Publication Data

US 2012/0091404 A1 Apr. 19, 2012

Related U.S. Application Data

(60) Provisional application No. 61/394,409, filed on Oct. 19, 2010.

(51) Int. Cl.
- *H01B 1/02* (2006.01)
- *C01B 25/08* (2006.01)
- *C22C 24/00* (2006.01)
- *C22C 12/00* (2006.01)
- *C22C 30/00* (2006.01)
- *B22F 1/00* (2006.01)
- *B22F 3/10* (2006.01)

(52) U.S. Cl.
USPC ........ 252/62.3 T; 136/240; 423/299; 423/264

(58) Field of Classification Search
USPC .......... 252/62.3 T; 423/299, 264; 419/29, 33; 136/240; 420/415, 416, 579, 577, 576
See application file for complete search history.

(56) References Cited

FOREIGN PATENT DOCUMENTS

WO  WO 2012094046  7/2012

OTHER PUBLICATIONS

Verdier et al, Etude Structurale de Ca5Ga2As6:, Acta Cryst. (1976), B32, pp. 726-778.*
Sun et al, "Synthesis and crystal structure of a new Zintl phase Sr5In2Bi6", Journal of Alloys and Compounds, 421, Dec. 2005, pp. 190-194.*
Chemical Abstract citation 1988:562227, Cordier et al, "Strontium aluminum antimonide (Sr5Al2Sb6) and barium indium antimonide (Ba5In2Sb6). Two new Zintl phases with different chain anions", Zeitschrift fuer Naturforschung, B: Chemical Sciences, 43(4), (1988), pp. 463-466.*
Park et al, "Eu5In2Sb6, Eu5In2-xZnxSb6: rare earth zintl phases with narrow band gaps", J. Mater Chem, 12, Apr. 2002, pp. 1839-1843.*
Chemical Abstract Citation 1986:236008, Eisenmann et al, "Phases in boundary regions of Zintl concept: strontium tin phosphides (Sr5Sn2P6, SrSnP)", Journ. less-common Metals, 116(1), 1986, pp. 251-258.*
Chemical abstract citation 1986:217979, Eisenmann et al, "The first inoarsenidostannate(IV), Ca5Sn2As6", Zeitschrift Fuer Anorganische and Allgemeine Chem, 530, (1985), pp. 74-78.*

(Continued)

*Primary Examiner* — Carol M Koslow
(74) *Attorney, Agent, or Firm* — Brian T. Duke; Nixon Peabody LLP

(57) ABSTRACT

The inventors demonstrate herein that various Zintl compounds can be useful as thermoelectric materials for a variety of applications. Specifically, the utility of $Ca_3AlSb_3$, $Ca_5Al_2Sb_6$, $Ca_5In_2Sb_6$, $Ca_5Ga_2Sb_6$, is described herein. Carrier concentration control via doping has also been demonstrated, resulting in considerably improved thermoelectric performance in the various systems described herein.

6 Claims, 32 Drawing Sheets

(56) References Cited

OTHER PUBLICATIONS

Chemical Abstract citation 1985:123502, Cordier et al, "Perantimonidogallates and -indates: calcium perantimonidgallate (Ca5Ga2Sb6), calcium perantimonidoindate (Ca5In2Sn6) and strontium perantimonidoindate (Sr5In2Sb6)", Zeitschrift fuer Naturforschung, Teil B: Anorganische Chemie, Organische Chemie, 40B(1), (1985), pp. 5-8.*

Chemical abstract citation 1981: Cordier et al, "Zintl phases with complex anions: Study of calcium aluminum antimonate (Ca5Al2Sb6) and calcium aluminum arsenate (Ca3Al2As4)", Revue de Chimie Minerale, 18(1), (1981), pp. 9-18.*

Chemical abstract citation 1996:560182, Cordier et al, "Crystal structure of tribarium triarsenidoindate, Ba3InAs3", Zeitschrift fur Kristallographie, 211(9), 1996, pp. 632.*

Chemical abstract citation 1988:48031, Cordier et al, "Strontium gallium antimonate (Sr3GaSb3) and strontium indium phosphide (Sr3InP3), two new Zintl phases with complex anions", Zeitschrift fuer Naturforschung, B: Chemical Sciences, 42(10), (1987), pp. 1268-1272.*

Chemical abstract ciatation 1981:434510, "Cordier et al, Calcium aluminum arsenide (Ca3AlAs3)—an intermediate analog to chain silicates", Angewandt Chemi, 93(5), (1981), pp. 474.*

Chemical abstract ciatation 1984:464025, CXordier et al, "calcium antimonidoaluminate (Ca3AlSb3) and Calcium bismuthidoaluminate (Ca5Al2Bi6), two new Zintl phases with chain anions",Zeitschrift fuer Naturforschung, Teil B: Anorganische Chemie, Organische Chemie, 39B(6), (1984), pp. 727-732.*

Chemical abstract ciatation 1982:536903, Cordier et al, "Zintl phases with complex anions: Calcium arsenoaluminate (Ca3AlAs3) and barium antimonoaluminate (Ba3AlSb3)",,Zeitschrift fuer Naturforschung, Teil B: Anorganische Chemie, Organische Chemie, 37B(8), (1982), pp. 975-980.*

IPRP for PCT/US2011/056949, Apr. 23, 2013, one page.

ISR for PCT/US2011/056949, Aug. 3, 2012, 3 pages.

Written Opinion for PCT/US2011/056949, Aug. 3, 2012, 5 pages.

Kim, Sung-Jin et al. 'Ba44n8Sb16: Thermoelectric properties of a new layered Zintl phase with infinite zigzag Sb chains and pentagonal tubes'. Chem. Mater. '1999, 11, pp. 3151-3159 See p. 3156.

Yan, Yu Li et al. Crystal structure, electronic structure, and thermoelectric properties of Ca5Al2Sb6', Journal of Materials Chemistry, 2011, 21, pp. 12497-12502, Published online: Jul. 20, 2011 See abstract and p. 12497.

* cited by examiner

ZINTL PHASES FOR THERMOELECTRIC APPLICATIONS

CROSS-REFERENCE TO RELATED APPLICATIONS

This application claims priority from U.S. Provisional Patent Application No. 61/394,409, filed on Oct. 19, 2010, which is incorporated herein by reference in its entirety.

GOVERNMENT RIGHTS

The invention described herein was made in the performance of work under a NASA contract, and is subject to the provisions of Public Law 96-517 (35 USC202) in which the Contractor has elected to retain title.

FIELD OF INVENTION

The present invention relates to the use of advanced thermoelectrics for power generation.

BACKGROUND

Widespread use of thermoelectric energy generation is limited both by low efficiency, and by the expense and toxicity of current thermoelectric materials (e.g. PbTe). Zintl compounds are a potential source of environmentally benign, inexpensive materials, due to the large variety of allowed chemical substitutions and the Earth-abundance of some of the most common constituents. There is a need in the art for Zintl compounds that can be used for thermoelectric energy generation.

SUMMARY OF THE INVENTION

In certain embodiments, the invention teaches a Zintl compound of the formula $A_5B_2C_6$, wherein A is selected from the group consisting of: Ca, Sr, and Ba; B is selected from the group consisting of: Al, In, Ga, and Sn; and C is selected from the group consisting of: P, As, Sb, and Bi. In some embodiments, the compound is selected from the group consisting of: $Sr_5Al_2Sb_6$, $Ba_5In_2Sb_6$, $Ca_5Ga_2As_6$, $Ca_5Al_2Sb_6$, $Ca_5In_2Sb_6$, $Ca_5Ga_2Sb_6$, $Eu_5In_2Sb_6$, $Sr_5In_2Sb_6$, $Ca_5Sn_2As_6$, $Sr_5 Sn_2P_6$, $Ca_5Al_2Bi_6$, $Sr_5In_2Bi_6$, $Yb_5Al_2Sb_6$, and $Yb_5 In_2Sb_6$. In some embodiments, the composition has a carrier concentration, adapted to be controlled by substituting either Na or K on the A site. In certain embodiments, the composition has a carrier concentration, adapted to be controlled by substituting either Mn or Zn on the B site. In some embodiments, the composition has a carrier concentration, adapted to be controlled by substituting either Sn or Ge on the C site. In some embodiments, the compound is $Ca_5Al_2Sb_6$. In certain embodiments, the compound is $Ca_{5-x}Na_xAl_2Sb_6$. In certain embodiments, $0.0 \leq x \leq 1.0$. In some embodiments, the composition has a maximum thermoelectric figure of merit (zT) of greater than 0.6 at 1,000 K. In some embodiments, the compound is $Ca_5Mn_xAl_{2-x}Sb_6$. In some embodiments, $0.0 \leq x \leq 0.3$. In some embodiments, the composition has a maximum thermoelectric figure of merit (zT) of greater than 0.45. In certain embodiments, the compound is $Ca_5Zn_xAl_{2-x}Sb_6$. In certain embodiments, $0.0 \leq x \leq 0.2$. In some embodiments, the composition has a maximum thermoelectric figure of merit (zT) of greater than 0.35 at 900 K. In certain embodiments, the compound is $Ca_5In_2Sb_6$. In certain embodiments, the compound is $Ca_5In_{2-x}Zn_xSb_6$. In certain embodiments, $0.0 \leq x \leq 0.2$. In some embodiments, the composition has a maximum thermoelectric figure of merit (zT) of about 0.6 at 900 K. In some embodiments, the compound is $Ca_5Ga_2Sb_6$. In some embodiments, the compound is $Ca_5Ga_{2-x}Zn_xSb_6$. In certain embodiments, $0.0 \leq x \leq 0.3$. In certain embodiments, the composition has a maximum thermoelectric figure of merit (zT) of about 0.35.

In certain embodiments, the invention teaches a Zintl compound of the formula $A_3BC_3$, wherein A is selected from the group consisting of: Ca, Sr, and Ba; B is selected from the group consisting of: Al, In, Ga, and Sn; and C is selected from the group consisting of: P, As, Sb, and Bi. In some embodiments, the compound is selected from the group consisting of: $Ba_3GaSb_3$, $Sr_3GaSb_3$, $Ba_3AlSb_3$, $Eu_3GaP_3$, $Sr_3AlSb_3$, $Ba_3InAs_3$, $Ca_3AlAs_3$, $Ca_3InP_3$, $Ca_3AlSb_3$, $Ca_3GaAs_3$ $Eu_3InP_3$ and $Sr_3InP_3$. In certain embodiments, the composition has a carrier concentration, adapted to be controlled by substituting an element selected from either Na or K on the A site. In certain embodiments, the composition has a carrier concentration, adapted to be controlled by substituting an element selected from either Mn or Zn on the B site. In certain embodiments, the composition has a carrier concentration, adapted to be controlled by substituting an element selected from either Sn or Ge on the C site. In some embodiments, the compound is $Ca_3AlSb_3$. In certain embodiments, the compound is $Ca_{3-x}Na_xAlSb_3$ In certain embodiments, $0 \leq x \leq 0.06$. In certain embodiments, the composition has a maximum thermoelectric figure of merit (zT) of greater than or equal to 0.8 at 1,050 K.

In certain embodiments, the invention teaches a method for manufacturing a compound, including: providing a quantity of Ca; providing a quantity of Na, Zn, or Mn; providing a quantity of Al; providing a quantity of Sb; loading the elements into vials containing balls in a gas filled container; milling the reagents into a fine powder; hot pressing the fine powder; annealing the resulting substance; and cooling the resulting compound. In certain embodiments, the resulting compound is of a formula comprising $Ca_{5-x}Na_xAl_2Sb_6$. In some embodiments, $0.0 \leq x \leq 1.0$. In certain embodiments, the resulting compound is of a formula comprising $Ca_{3-x}Na_x$-$AlSb_3$. In certain embodiments, $0 \leq x \leq 0.06$. In certain embodiments, the resulting compound is of a formula comprising $Ca_5Mn_xAl_{2-x}Sb_6$. In certain embodiments, $0.0 \leq x \leq 0.3$. In certain embodiments, the resulting compound is of a formula comprising $Ca_5Zn_xAl_{2-x}Sb_6$. In certain embodiments, $0.0 \leq x \leq 0.2$.

In some embodiments, the invention teaches a method for manufacturing a compound, including: providing a quantity of In and a quantity of Sb; melting the In and Sb and subsequently quenching with water; providing a quantity of Ca, providing a quantity of Zn, providing an additional quantity of Sb; loading the elements into vials containing balls in a gas filled container; milling the reagents into a fine powder; and hot pressing the fine powder. In some embodiments, the resulting compound is of a formula comprising $Ca_5In_{2-x}Zn_xSb_6$. In certain embodiments, $0.0 \leq x \leq 0.2$.

In certain embodiments, the invention teaches a method for manufacturing a compound, including: providing a quantity of Ga and a quantity of Sb; melting the Ga and Sb and subsequently quenching with water; providing a quantity of Ca, providing a quantity of Zn, providing an additional quantity of Sb; loading the elements into vials containing balls in a gas filled container; milling the reagents into a fine powder; and hot pressing the fine powder. In certain embodiments, the resulting compound is of a formula comprising $Ca_5Ga_{2-x}Zn_xSb_6$. In certain embodiments, $0.0 \leq x \leq 0.3$.

In certain embodiments, the invention teaches a thermoelectric material, including a compound of the formula: $Ca_{5-x}Na_xAl_2Sb_6$. In certain embodiments, $0.0 \leq x \leq 1.0$.

In certain embodiments, the invention teaches a thermoelectric material, including a compound of the formula: $Ca_{3-x}Na_xAlSb_3$. In some embodiments, $0.0 \leq x \leq 0.06$.

In certain embodiments, the invention teaches a thermoelectric material, including a compound of the formula: $Ca_5Mn_xAl_{2-x}Sb_6$. In some embodiments, $0.0 \leq x \leq 0.3$.

In certain embodiments, the invention teaches a thermoelectric material, including a compound of the formula: $Ca_5Zn_xAl_{2-x}Sb_6$. In some embodiments, $0.0 \leq x \leq 0.2$.

In certain embodiments, the invention teaches a thermoelectric material, including a compound of the formula: $Ca_5In_{2-x}Zn_xSb_6$. In some embodiments, $0.0 \leq x \leq 0.2$.

In certain embodiments, the invention teaches a thermoelectric material, including a compound of the formula: $Ca_5Ga_{2-x}Zn_xSb_6$. In some embodiments, $0 \leq x \leq 0.3$.

DESCRIPTION OF THE INVENTION

All references cited herein are incorporated by reference in their entirety as though fully set forth. Unless defined otherwise, technical and scientific terms used herein have the same meaning as commonly understood by one of ordinary skill in the art to which this invention belongs. In certain instances, the specification teaches loading elements into vials and milling the elements into a fine powder. In preferred embodiments, multiple different elements are loaded into a single vial, and therefore the plural term "vials" refers to the vials used to generate multiple samples.

Figure 1:
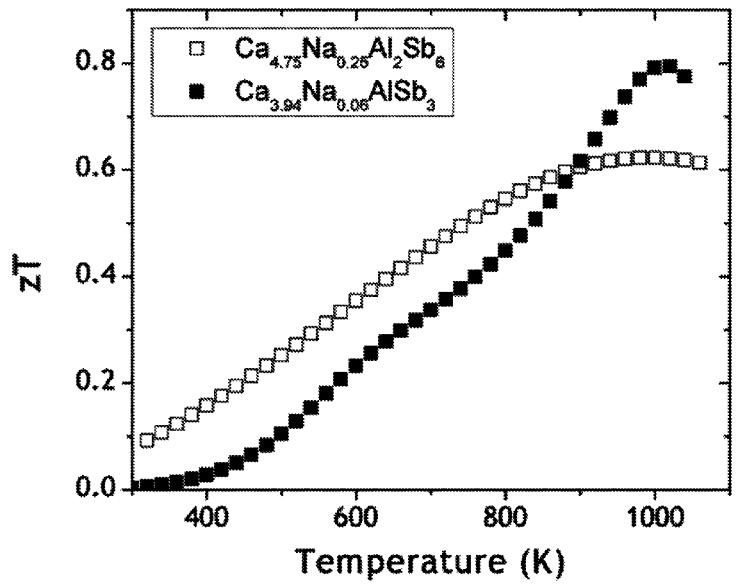
FIG. 1 demonstrates, in accordance with an embodiment of the invention, figure of merit of Na-doped $Ca_3AlSb_3$ ($4 \times 10^{19}$ h$^+$/cm$^3$) and $Ca_5Al_2Sb_6$ ($2 \times 10^2$ h$^+$/cm$^3$).
Figure 2:
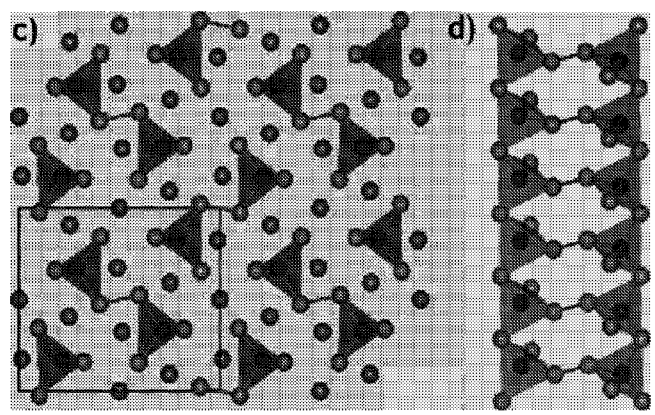
FIG. 2 demonstrates, in accordance with an embodiment of the invention, a) The orthorhombic unit cell of $Ca_5Al_2Sb_6$ (Pbam) viewed down the $AlSb_4$ tetrahedral chains. b) These tetrahedral chains are corner-sharing and connect to adjacent chains through covalent Sb—Sb bonds.

The Zintl compounds $Ca_3AlSb_3$ and $Ca_5Al_2Sb_6$ are interesting due to their complex crystal structures and their potential for permitting a wide variety of chemical substitutions. Both crystal structures are characterized by parallel chains of covalently bound $AlSb_4$ tetrahedra, packed between $Ca^{2+}$ cations. Due to the relative Ca deficiency, (and therefore electron deficiency) of $Ca_5Al_2Sb_6$, additional bonds form between the $AlSb_4$ chains, resulting in the ladder-like structure shown in FIG. 2. Carrier concentration control via $Na^{1+}$ doping on the $Ca^{2+}$ site has been demonstrated in both systems, resulting in improved thermoelectric performance. In addition to demonstrating Na doping on the Ca site in $Ca_5Al_2Sb_6$, the inventors have also demonstrated the use of both Zn and Mn as dopants on the Al site. $Mn^{2+}$ and $Zn^{2+}$ replace the $Al^{3+}$ ions, resulting in one free hole per substitution.

Resistivity measurements disclosed herein indicate that undoped $Ca_5Al_2Sb_6$ is a charge balanced semiconductor with a band gap of 0.5 eV, consistent with Zintl-Klemm charge counting rules. Substituting divalent calcium with monovalent sodium leads to the formation of free holes and a transition from insulating to metallic electronic behavior is observed. Seebeck measurements yield a hole mass of ~2 $m_e$, consistent with a structure containing both ionic and covalent bonding. The structural complexity of Zintl compounds has been implicated in their unusually low thermal conductivity values. Indeed, $Ca_5Al_2Sb_6$ possesses an extremely low lattice thermal conductivity (0.6 W/mK at 850 K) which approaches the minimum thermal conductivity limit at high temperature. A single parabolic band model is developed and predicts $Ca_{4.75}Na_{0.25}Al_2Sb_6$ possesses a near-optimal carrier concentration for thermoelectric power generation and a zT>0.6 is obtained at 1000 K. Beyond thermoelectric applications, the semiconductor $Ca_5Al_2Sb_6$ possesses a one-dimensional covalent structure which is amenable to interesting magnetic interactions when appropriately doped.

The present invention also discloses sodium doped $Ca_3AlSb_3$ as an Earth-abundant, not-toxic material with high thermoelectric efficiency for waste heat recovery. $Ca_3AlSb_3$ is found to be a charge-balanced semiconductor, as expected from Zintl charge counting conventions. The high temperature p-type electronic behavior of the doped samples is well described by a single parabolic band model. Electronic structure calculations reveal a valence band edge containing nested parabolic bands, which are dominated by Sb p states. The lattice thermal conductivity of $Ca_3AlSb_3$ is exceptionally low (0.6 W/mK at 1050 K), approaching the amorphous limit at high temperatures. At 1050 K, a maximum zT of 0.8 is obtained, attributed to a combination of low lattice thermal conductivity and a band gap sufficiently large to delay the detrimental effect of minority carriers on the Seebeck coefficient until high temperatures.

Based upon the analysis and findings disclosed herein, good thermoelectric behavior is anticipated following carrier concentration optimization in the closely related $A_5B_2C_6$ and $A_3BC_3$ Zintl compounds listed in Table 1 disclosed herein, where: "A"=Ca, Sr, Ba; "B"=Al, In, Ga, Sn; and "C"=P, As, Sb, Bi. As further disclosed herein, carrier concentration control can be accomplished by substituting Na or K on the "A" site; Mn or Zn on the "B" site; Sn or Ge on the "C" site.

In fact, the inventors have investigated $Ca_5In_2Sb_6$ and $Ca_5Ga_2Sb_6$, both of which are iso-structural analogues to $Ca_5Al_2Sb_6$. Both materials are found to be intrinsic semiconductors with low lattice thermal conductivity, and have been doped, as disclosed herein, with $Zn^{2+}$ on the $Ga^{3+}$ or $In^{3+}$ site to control carrier concentration.

Unless otherwise stated, carrier density and carrier concentration are used interchangeably in the instant disclosure.

In some embodiments, the numbers expressing quantities of ingredients, properties such as molecular weight, reaction conditions, and so forth, used to describe and claim certain embodiments of the application are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

In certain embodiments, the present invention teaches a Zintl compound, of the formula: $A_5B_2C_6$. In some embodiments, "A" is selected from the group consisting of: Ca, Sr, and Ba; "B" is selected from the group consisting of: Al, In, Ga, and Sn; and "C" is selected from the group consisting of: P, As, Sb, and Bi. In some embodiments, the compound is selected from the group consisting of: $Sr_5Al_2Sb_6$, $Ba_5In_2Sb_6$, $Ca_5Ga_2As_6$, $Ca_5Al_2Sb_6$, $Ca_5In_2Sb_6$, $Ca_5Ga_2Sb_6$, $Eu_5In_2Sb_6$, $Sr_5In_2Sb_6$, $Ca_5Sn_2As_6$, $Sr_5Sn_2P_6$, $Ca_5Al_2Bi_6$, $Sr_5In_2Bi_6$, $Yb_5Al_2Sb_6$, and $Yb_5In_2Sb_6$. In an embodiment, the compound is $Ca_5Al_2Sb_6$. In an embodiment, the compound is $Ca_5In_2Sb_6$. In an embodiment, the compound is $Ca_5Ga_2Sb_6$. One of skill in the art would readily appreciate that alternative compounds with similar properties could be substituted for those disclosed above.

In some embodiments, the carrier concentration in the above compounds is controlled by substituting an element selected from the group consisting of: Na, K and the like on the "A" site, and/or Mn, Zn and the like on the "B" site, and/or Sn, Ge, and the like on the C site. In certain embodiments, the formula for the compound is $Ca_{5-x}Na_xAl_2Sb_6$. In certain embodiments, $0.0 \leq x \leq 1.0$. In certain embodiments, the compound has a maximum thermoelectric figure of merit (zT) of greater than 0.6 at 1,000 K. In certain embodiments, the formula for the compound is $Ca_5Mn_xAl_{2-x}Sb_6$. In certain embodiments, $0.0 \leq x \leq 0.3$. In certain embodiments, the formula for the compound is $Ca_5Zn_xAl_{2-x}Sb_6$. In certain embodiments, $0.0 \leq x \leq 0.2$. In some embodiments, the formula for the compound is $Ca_5In_{2-x}Zn_xSb_6$. In certain embodiments, $0.0 \leq x \leq 0.2$. In some embodiments, the compound has a maximum thermoelectric figure of merit (zT) of about 0.6 at 900 K. In certain embodiments, the formula for the compound is $Ca_5Ga_{2-x}Zn_xSb_6$. In certain embodiments, $0.0 \leq x \leq 0.3$.

In certain embodiments, the present invention teaches a Zintl compound, of the formula: $A_3BC_3$. In some embodiments, "A" is selected from the group consisting of: Ca, Sr, and Ba; "B" is selected from the group consisting of: Al, In, Ga, and Sn; and "C" is selected from the group consisting of: P, As, Sb, and Bi.

In certain embodiments, the compound is selected from the group consisting of: $Ba_3GaSb_3$, $Sr_3GaSb_3$, $Ba_3AlSb_3$, $Eu_3GaP_3$, $Sr_3AlSb_3$, $Ba_3InAs_3$, $Ca_3AlAs_3$, $Ca_3InP_3$, $Ca_3AlSb_3$, $Ca_3GaAs_3$ $Eu_3InP_3$ and $Sr_3InP_3$. In an embodiment, the compound is $Ca_3AlSb_3$. In some embodiments, the carrier concentration in the above compound is controlled by substituting an element selected from the group consisting of: Na, K, and the like on the "A" site, and/or Mn, Zn and the like on the B site, and/or Sn, Ge and the like on the C site. In certain embodiments, the formula of the compound is $Ca_{3-x}Na_xAlSb_3$ In certain embodiments, $0.0 \leq x \leq 0.06$. In some embodiments, the compound has a maximum thermoelectric figure of merit (zT) of greater than or equal to 0.8 at 1050 K.

In certain embodiments, a quantity of one selection each of "A", "B" and "C" from above are provided, with or without one or more substitute elements described above. The reagents are loaded into vials containing balls in a gas filled container. The reagents are milled into a fine powder. The resulting powder is then hot pressed. The resulting product is then annealed and subsequently cooled. The vials used in the above process can be made of stainless steel. One of skill in the art would readily appreciate that the vials may be made of other substances with similar properties, suitable for the inventive process. Likewise, this aspect of the inventive process could readily be accomplished by a number of equivalent means. In some embodiments, the balls are made of stainless steel. In other embodiments, the balls are made of other substances with similar properties, suitable for this aspect of the inventive process. In some embodiments, the box is a glove box. One of skill in the art would readily appreciate the box could be any container of suitable dimensions and characteristics to perform the required milling. In some embodiments, the gas is argon. One of skill in the art would readily appreciate that other gases with similar properties could be used in the alternative. In certain embodiments, the mixtures are milled for 1 hour. One of skill in the art would readily appreciate the mixtures could be milled for 1-2 hours. Milling can be accomplished using a SPEX Sample Prep 8000 Series Mixer/Mill. One of skill in the art would readily appreciate that the milling could be accomplished with other similar devices, with similar characteristics and/or like function. In certain embodiments, the fine powder that results from the ball milling is hot pressed in high density graphite dies (POCO). In some embodiments, 1.4 tons of force is used on a 12 mm diameter surface. One of skill in the art would readily appreciate that alternative amounts of force could be effectively applied. Merely by way of example, 1-1.5 tons of force can be used. In some embodiments, a maximum temperature of 973 K is applied for 2 hours during hot pressing. In other embodiments a maximum temperature of between 800-1100 K is applied for 2-8 hours during hot pressing. In certain embodiments, the hot pressing is followed by a stress free anneal at 873 K and a 3 hour cool down under vacuum. In other embodiments, a stress-free anneal at a temperature of between 600-900 K is applied for 1-2 hours. One of skill in the art would readily appreciate that different temperatures and pressures could be used in order to synthesize the compounds of the present invention using the aforementioned methods, or methods similar thereto.

In certain embodiments, compounds of the formula $Ca_{5-x}Na_xAl_2Sb_6$, $0.0 \leq x \leq 1.0$ are synthesized by ball milling elemental reagents followed by hot pressing. Starting with 99.99% Ca dendrites, 99.95% Na chunks, 99% Al shot, and 99.5% Sb lumps, the elements are loaded into stainless steel vials with stainless steel balls in an argon filled glove box. The mixtures are milled for 1 hour using a SPEX Sample Prep 8000 Series Mixer/Mill. The fine powder that results from ball milling is hot pressed in high density graphite dies (POCO) using 1.4 tons of force on a 12 mm diameter surface. A maximum temperature of 973 K for 2 hours in argon is used during hot pressing, followed by a stress-free anneal at 873 K and a 3 hour cool down under vacuum. One of skill in the art would readily appreciate that compounds of the formulas $Ca_5Mn_xAl_{2-x}Sb_6$, $0.0 \leq x \leq 0.3$ and $Ca_5Zn_xAl_{2-x}Sb_6$, $0.0 \leq x \leq 0.2$ could be made using substantially the same protocol above, merely by substituting appropriate quantities of the requisite materials to achieve the desired results.

For compounds of the formula $Ca_5In_{2-x}Zn_xSb_6$, $0.0 \leq x \leq 0.2$, InSb is formed as a precursor by melting 99.999% In shot from Alpha Aesar and 99.5% Sb lumps from Sigma-Aldrich in vacuum sealed, carbon-coated quartz ampoules at 600 C for 10 h, and then quenching in water. Stoichiometric amounts of the crushed InSb precursor, 99.99% Ca dendrites, 99.99% Zn shot, and 99.5% Sb lumps from Sigma-Aldrich are loaded into stainless-steel vials with stainless-steel balls in an argon-filled glove box. The contents are dry ball-milled for 1 h using a SPEX Sample Prep 8000 Series Mixer/Mill. The resulting fine powder is hot-pressed in high-density graphite dies (POCO) in argon using 110 MPa of pressure. Before applying pressure, samples are held for 2 h at 723 K to ensure complete reaction of any remaining InSb, then consolidated for 3 h at 973 K, followed by a 3 h stress-free cool down.

One of skill in the art would readily appreciate that compounds of the formula $Ca_5Ga_{2-x}Zn_xSb_6$, $0.0 \leq x \leq 0.3$, could be made using substantially the same protocol above, merely by substituting appropriate quantities of the requisite materials to achieve the desired results.

In certain embodiments, compounds of the formula $Ca_{3-x}Na_xAlSb_3$, $0 \leq x \leq 0.06$, are synthesized by ball milling elemental reagents followed by hot pressing. Starting with 99.99% Ca dendrites, 99.95% Na chunks, 99% Al shot, and 99.5% Sb lumps, the elements are loaded into stainless steel vials with stainless steel balls in an argon filled glove box. The mixtures are milled for 90 minutes using a SPEX Sample Prep 8000 Series Mixer/Mill. The fine powder that results from ball milling is hot pressed in high density graphite dies (POCO) using 1.2 tons of force on a 12 mm diameter surface. A maximum temperature of 973 K for 2 hours in argon is used during hot pressing, followed by a stress-free anneal at 873 K and a 3 hour cool down under vacuum. Care is taken at every step to avoid oxidation of the powder.

In some embodiments, the invention teaches a method of using a Zintl compound of the formula $A_5B_2C_6$ as a thermoelectric material, where: "A" is selected from the group consisting of: Ca, Sr and Ba; "B" is selected from the group consisting of: Al, In, Ga and Sn; and "C" is selected from the group consisting of: P, As, Sb and Bi. In some embodiments, carrier concentration control can be accomplished by substituting Na, K or the like on the "A" site, and/or Mn, Zn or the like on the "B" site, and/or Sn, Ge or the like on the "C" site.

In some embodiments, the Zintl compound used as a thermoelectric material is selected from the group consisting of: $Sr_5Al_2Sb_6$, $Ba_5In_2Sb_6$, $Ca_5Ga_2As_6$, $Ca_5Al_2Sb_6$, $Ca_5In_2Sb_6$, $Ca_5Ga_2Sb_6$, $Eu_5In_2Sb_6$, $Sr_5In_2Sb_6$, $Ca_5Sn_2As_6$, $Sr_5Sn_2P_6$, $Ca_5Al_2Bi_6$, $Sr_5In_2Bi_6$, $Yb_5Al_2Sb_6$, and $Yb_5In_2Sb_6$. In some embodiments, the compound is a compound listed in Table 1 or Table 3.

In some embodiments, the invention teaches a method of using a Zintl compound of the formula $A_3BC_3$ as a thermoelectric material, where: "A" is selected from the group consisting of: Ca, Sr and Ba; "B" is selected from the group consisting of: Al, In, Ga and Sn; and "C" is selected from the group consisting of: P, As, Sb and Bi. In some embodiments, carrier concentration control can be accomplished by substituting Na, K or the like on the "A" site, and/or Mn, Zn or the like on the "B" site, and/or Sn, Ge or the like on the "C" site.

In some embodiments, the Zintl compound used as a thermoelectric material is selected from the group consisting of: $Ba_3GaSb_3$, $Sr_3GaSb_3$, $Ba_3AlSb_3$, $Eu_3GaP_3$, $Sr_3AlSb_3$, $Ba_3InAs_3$, $Ca_3AlAs_3$, $Ca_3InP_3$, $Ca_3AlSb_3$, $Ca_3GaAs_3$ $Eu_3InP_3$ and $Sr_3InP_3$.

In some embodiments, the invention teaches a method of using a compound of a formula comprising $Ca_{5-x}Na_xAl_2Sb_6$ as a thermoelectric material. In some embodiments, $0.0 \leq x \leq 1.0$.

In some embodiments, the invention teaches a method of using a compound of a formula comprising $Ca_5Mn_xAl_{2-x}Sb_6$ as a thermoelectric material. In some embodiments, $0.0 \leq x \leq 0.3$.

In some embodiments, the invention teaches a method of using a compound of a formula comprising $Ca_5Zn_xAl_{2-x}Sb_6$ as a thermoelectric material. In some embodiments, $0.0 \leq x \leq 0.2$.

In some embodiments, the invention teaches a method of using a compound of a formula comprising $Ca_5In_{2-x}Zn_xSb_6$ as a thermoelectric material. In some embodiments, $0.0 \leq x \leq 0.2$.

In some embodiments, the invention teaches a method of using a compound of a formula comprising $Ca_5Ga_{2-x}Zn_xSb_6$ as a thermoelectric material. In certain embodiments, $0.0 \leq x \leq 0.3$.

In some embodiments the invention teaches using a compound of a formula comprising $Ca_{3-x}Na_xAlSb_3$ as a thermoelectric material. In some embodiments, $0.0 \leq x \leq 0.06$.

In certain embodiments of the invention, one or more thermoelectric materials disclosed herein are used in a thermoelectric device. In some embodiments, a temperature gradient is applied to the thermoelectric device and electrical energy is collected. In some embodiments, electrical energy is applied to the thermoelectric material and heat is transferred from a first space at a first operation temperature to a second space at a second operation temperature, wherein the first operation temperature is lower than the second operation temperature.

Merely by way of example, thermoelectric modules including those made of materials disclosed herein are used to harness waste heat from automotive exhaust (500 K-800 K) to produce electricity and reduce $CO_2$ emissions.

One skilled in the art will recognize many methods and materials similar or equivalent to those described herein, which could be used in the practice of the present invention. Indeed, the present invention is in no way limited to the methods and materials described.

The following examples are for illustrative purposes only and are not intended to limit the scope of the disclosure or its various embodiments in any way.

EXAMPLES

Example 1

Advanced Thermoelectrics for Power Generation

Hall measurements indicate that $Ca_3AlSb_3$ and $Ca_5Al_2Sb_6$ are charge-balanced semiconductors, as predicted by Zintl valence-counting. Doping with sodium induces free holes, resulting in a maximum hole ($h^+$) carrier concentration of $4 \times 10^{19}$ $h^+/cm^3$ in $Ca_3AlSb_3$ and $2 \times 10^{20}$ $h^+/cm^3$ in $Ca_5Al_2Sb_6$ respectively. The doped $Ca_5Al_2Sb_6$ samples exhibit degenerate behavior, with resistivity that increases with temperature due to acoustic phonon scattering. In contrast, $Ca_3AlSb_3$ samples have an activated carrier mobility, which results in resistivity that decreases with temperature up to 600 K. Consistent with hall measurements, both compounds have large, positive Seebeck coefficients, which increase with increasing temperature. From resistivity measurements and the Seebeck coefficients, band gaps for $Ca_3AlSb_3$ and $Ca_5Al_2Sb_6$ are estimated to be 0.5 eV and 0.6 eV respectively.

Despite the large difference in average grain size (50 microns and 1 micron), the thermal conductivities of $Ca_5Al_2Sb_6$ and $Ca_3AlSb_3$ and are nearly identical, obeying the 1/T dependence expected for umklapp scattering. Both compounds were found to have extremely low lattice thermal conductivities (~0.6 W/mK at 700 K), approaching the amorphous limit at high temperature. This low lattice thermal conductivity appears to arise from the low group velocity of the optical modes and Umklapp scattering of the acoustic modes.

The low lattice thermal conductivities of these compounds, combined with band gaps sufficiently large to delay the onset of minority carrier activation to high temperatures, result in excellent thermoelectric performance. The figure of merit of $Ca_5Al_2Sb_6$ peaks at 0.6 at 1000 K, while that of $Ca_3AlSb_3$ peaks at 0.8 at 1060 K. In both cases, the most heavily doped samples resulted in the highest zT values. Due to the deleterious effect of minority carrier activation at high temperature, it is likely that higher zT values will be obtained if higher carrier concentrations can be reached. However, in both $Ca_3AlSb_3$ and $Ca_5Al_2Sb_6$ the obtainable carrier concentrations are restricted by the solubility limit of Na.

New Zintl Phases

There are several attractive opportunities for improving the zT of $Ca_3AlSb_3$ and $Ca_5Al_2Sb_6$. These include increasing carrier concentrations by using a different dopant type, increasing mobility at low temperatures by reducing grain boundary oxidation, and increasing mass density in an attempt to further decrease lattice thermal conductivity.

Both systems stand to benefit from increased carrier concentrations, which may shift the peak zT to higher temperatures by delaying the onset of minority carrier activation. In addition, from electronic structure calculations performed by Espen Flage-Larson at the University of Oslo, the inventors expect to find a heavy band at slightly higher hole concentrations in the $Ca_3AlSb_3$ system. This may lead to a larger effective mass and an enhanced Seebeck coefficient.

With this in mind, the inventors pursue synthesis and characterization of Zn-doped $Ca_3AlSb_3$ and $Ca_5Al_2Sb_6$. To date, Zn doped $Ca_5Al_2Sb_6$ has been synthesized, and a maximum carrier concentration of $4 \times 10^{20}$ has been obtained. Future work will include doping $Ca_3AlSb_3$ with Zn, and fully characterizing both Zn-doped systems.

Na-doped $Ca_3AlSb_3$ and Zn-doped $Ca_5Al_2Sb_6$ exhibit an activated mobility at temperatures below 600 K, most likely due to oxidation. This results in reduced conductivity, and therefore reduced zT, especially at low temperatures. By careful processing, the inventors are likely to be able to decrease grain boundary oxidation, and therefore increase mobility and conductivity.

While not wishing to be bound by any one particular theory, the low thermal conductivity of $Ca_3AlSb_3$ and $Ca_5Al_2Sb_6$ is perhaps their most promising characteristic. To improve understanding of the thermal properties of these materials, dilatometry measurements at JPL, combined with speed of sound measurements, will be used to determine their Gruneisen parameters. This will allow more accurate modeling of lattice thermal conductivity. In addition, it may be possible to reduce the lattice thermal conductivity in both compounds by substituting heavier elements on the Ca, Al, or Sb sites.

Good thermoelectric behavior, following carrier concentration optimization, is anticipated in the closely related $A_5B_2C_6$ and $A_3BC_3$ Zintl compounds shown in the table below. Here, "A"=Ca, Sr, Ba; "B"=Al, In, Ga, Sn; and "C"=P, As, Sb, Bi. Carrier concentration control can be accomplished by substituting Na or K on the "A" site; Mn or Zn on the "B" site; Sn or Ge on the "C" site.

TABLE 1

| | Compound | Anionic Moieties | Ref | Transport Literature |
|---|---|---|---|---|
| | $Sr_5Al_2Sb_6$ | spiral chains of corner sharing tetrahedra | [62] | |
| | $Ba_5In_2Sb_6$ | ladders formed from corner sharing tetrahedra and Sb—Sb bonds | [62] | |
| | $Ca_5Ga_2As_6$ | ladders formed from corner sharing tetrahedra and Sb—Sb bonds | [3] | |
| | $Ca_5Al_2Sb_6$ | ladders formed from corner sharing tetrahedra and Sb—Sb bonds | [63] | Inventors', Na doped |
| | $Ca_5In_2Sb_6$ | ladders formed from corner sharing tetrahedra and Sb—Sb bonds | [1] | |
| | $Ca_5Ga_2Sb_6$ | ladders formed from corner sharing tetrahedra and Sb—Sb bonds | [1] | |
| | $Eu_5In_2Sb_6$ | ladders formed from corner sharing tetrahedra and Sb—Sb bonds | [2] | YES, Zn doped |
| | $Sr_5In_2Sb_6$ | ladders formed from corner sharing tetrahedra and Sb—Sb bonds | [1] | |
| | $Ca_5Sn_2As_6$ | chains of corner charing $AlSb_4$ tetrahedra | [4] | |
| | $Sr_5Sn_2P_6$ | chains of corner charing $AlSb_4$ tetrahedra | [5] | |
| | $Ca_5Al_2Bi_6$ | ladders formed from corner sharing tetrahedra and Sb—Sb bonds | [63] | |
| | $Sr_5In_2Bi_6$ | ladders formed from corner sharing tetrahedra and Sb—Sb bonds | [6] | |
| | $Yb_5Al_2Sb_6$ | ladders formed from corner sharing tetrahedra and Sb—Sb bonds | [7], [8] | Yes- |
| | $Yb_5In_2Sb_6$ | ladders formed from corner sharing tetrahedra and Sb—Sb bonds | [9] | YES, undoped |
| | $Ba_3GaSb_3$ | pairs of edge sharing $AlSb_4$ tetrahedra | [10] | |
| | $Sr_3GaSb_3$ | spiral chains | [11] | |
| | $Ba_3AlSb_3$ | pairs of edge sharing $AlSb_4$ tetrahedra | [12] | |
| | $Eu_3GaP_3$ | pairs of edge sharing $AlSb_4$ tetrahedra | | |
| | $Sr_3AlSb_3$ | pairs of edge sharing $AlSb_4$ tetrahedra | [61] | |
| | $Ba_3InAs_3$ | chains of corner charing $AlSb_4$ tetrahedra | [13] | |
| | $Ca_3AlAs_3$ | chains of corner charing $AlSb_4$ tetrahedra | [12] | |
| | $Ca_3InP_3$ | chains of corner charing $AlSb_4$ tetrahedra | [10] | |
| | $Ca_3AlSb_3$ | chains of corner charing $AlSb_4$ tetrahedra | [63] | Inventors', Na doped |
| | $Ca_3GaAs_3$ | chains of corner charing $AlSb_4$ tetrahedra | [10] | |
| | $Eu_3InP_3$ | chains of corner charing $AlSb_4$ tetrahedra | [14] | magnetic properties |
| | $Sr_3InP_3$ | chains of corner charing $AlSb_4$ tetrahedra | [11] | |

Additional promising materials:

| | | Anion moiety | Ref | TE literature |
|---|---|---|---|---|
| | $KSb_2$ | edge sharing Sb hexagons | [38] | |
| | $K_3Sb$ | isolated $Sb^{3-}$ | [36, 39] | |
| | KSb | chiral chains of $(Sb^{1-})_n$ | 40, 41] | |
| | $BaSb_2$ | zig-zag chains of $(Sb^{1-})_n$ | [42, 43] | |
| | $BaSb_3$ | slabs of covalently bound Sb | | |
| | $Ba_5Sb_4$ | isolated $Sb^{3-}$ and $Sb^{4-}_2$ dimers | [45, 46] | |
| | $Ba_2Sb_3$ | $Sb^{8-}_6$ chains | [47, 48] [49] | |
| | $Ba_{11}Sb_{10}$ | isolated $Sb^{3-}$ and $Sb^{4-}_2$ dimers | [56] | |
| 0D | $Ca_5Sb_3$ | $Sb^{3-}$ | [57] | |
| 0D | $Ca_{11}Sb_{10}$ | $Sb_2^{4-}$ and $Sb^{3-}$ | [58] | |
| 1D | $CaSb_2$ | $Sb^{1-}$ zig-zag chains | [59] | |
| 0D | $Ca_{14}AlSb_{11}$ | $Sb_3^{7-}$, $AlSb_4^{9-}$, $Sb^{3-}$ | [60] | |
| 0D | $K_3Cs_6AlSb_4$ | $AlSb_3^{6-}$ and $Sb^{3-}$ | | |
| 2D | $Na_7Al_2Sb_5$ | slabs of corner-sharing $AlSb_4$ tetrahedra | [64] | |

TABLE 1-continued

| 2D | $Na_7Al_2Sb_3$ | slabs of corner-sharing $AlSb_4$ tetrahedra | [65] |
| 3D | $KAlSb_4$ | $AlSb_4$ tetrahedra linked via corner sharing and Sb—Sb bonds | [66] |
| 3D | AlSb | corner-sharing $AlSb_4$ tetrahedra (zinc blende) | [67] |

Example 2

Experiments I

The Zintl compound $Ca_5Al_2Sb_6$ for Low Cost Thermoelectric Power Generation Introduction The thermoelectric efficiency of a material is governed by its figure of merit zT ($zT=\alpha^2T/\rho\kappa$). High efficiency is obtained in materials that simultaneously possess a large Seebeck coefficient ($\alpha$), low electrical resistivity ($\rho$), and low thermal conductivity ($\kappa$). [1] Heavily doped semiconductors (carrier concentrations ranging from $10^{19}$ to $10^{21}$ carriers/cm$^3$) generally contain the most favorable combination of these three properties. To date, much of the focus in thermoelectrics has been on binary semiconductors with significant covalent character ($PbTe$, $Bi_2Te_3$).

Zintl compounds have emerged as a promising class of materials for thermoelectrics. [2-9] Zintls are composed of electropositive cations (alkali, alkaline-earth or rare earth) that donate their electrons to anions, which in turn form covalent bonds to satisfy valence. Many recently explored materials have exhibited good thermoelectric efficiency, arising from either high electronic mobility ($CeCoFe_3Sb_{12}$, $YbZn_2Sb_2$) or low lattice thermal conductivity ($Yb_{14}AlSb_{11}$, and $Ba_8Ga_{16}Ge_{30}$).

Most undoped Zintl compounds are charge balanced semiconductors with resistivity decaying with increasing temperature (associated with carrier activation). As good thermoelectric performance is realized in heavily doped semiconductors, carrier concentration control in Zintl compounds is crucial. For example, carrier concentration tuning has been demonstrated in the $Yb_{14}AlSb_{11}$ system with $Mn^{2+}$ or $Zn^{2+}$ on the $Al^{3+}$ site as well as co-doping with $La^{3+}$ on the $Yb^{2+}$ site. [6, 10, 11]

Some nominally undoped Zintl compounds also exhibit metallic behavior, presumably due to nonstoichiometry or the absence of a complete band gap (semimetals). For example, nominally undoped $YbZn_2Sb_2$ samples have exhibited carrier concentrations in excess of $10^{20}$ h$^+$/cm$^{-3}$. [12-14] $YbZn_2Sb_2$ appears to be a heavily doped semiconductor due to nonstoichiometry, rather than a semimetal, as the Seebeck coefficient is large and shows a clear loss of degeneracy at high temperature. In contrast, the metallic behavior in $Yb_{11}Sb_{10}$ appears to arise from the absence of a band gap, as expressed in the low, compensated Seebeck coefficient. [15] Among the $A_{11}MPn_9$ compounds, transport behavior indicative of both semimetallic and semiconducting band structures has been observed. [16-19]

Two structure types are formed by $A_5M_2Pn_6$ compounds: the $Ca_5Ga_2Sb_6$ and $Ba_5Al_2Bi_6$ structures. In both of these structures, corner-sharing chains of $MPn_4$ tetrahedra are bridged by $Pn_2$ dumbells to form infinite double chains ("ladders") which are parallel to each other. Differences in atomic radii leads to the development of two different chain packing configurations. The anionic building block is $(Al_2Sb_6)^{-10}$ while $5A^{+2}$ atoms are situated between the chains, providing overall valence balance. Valence counting in these anionic chains finds two $Sb^{-1}$ bridging across the chains, two $Sb^{-1}$ from the corner-sharing tetrahedra, and two $Sb^{-2}$ which are only bound to the aluminum. The two aluminum are each bound to four antimony, yielding a formal valence of −1.

Within the $Ca_5Ga_2Sb_6$ structure type, the transport properties of $Eu_5In_2Sb_6$ has been previously investigated. [20] Undoped samples showed a decreasing resistivity with temperature, indicative of carrier activation across a band gap. Alloying Zn onto the In site successfully yielded a sample with metallic transport properties. In the related $Ba_5Al_2Bi_6$ structure type, $Yb_5Al_2Sb_6$ and $Yb_5In_2Sb_6$ have been investigated. [21, 22] In both cases, metallic behavior was observed for nominally undoped materials. Optical measurements of $Yb_5In_2Sb_6$ yielded a band gap between 0.2-0.4 eV. [21]

In this work, the inventors pursued high temperature measurements of $Ca_{5-x}Na_xAl_2Sb_6$, of structure type $Ca_5Ga_2Sb_6$. This is a particularly attractive Zintl compound for reasons both fundamental and applied. On a fundamental level, there is a need to explore Zintl compounds which structurally bridge between the isolated (0D) covalent moieties of $Yb_{14}MnSb_{11}$ and the covalent slabs (2D) of $AZn_2Sb_2$ (A=Ca, Sr, Yb, Eu). The variety of 1D chain structures in the $A_5M_2Pn_6$ and $A_3M Pn_3$ compounds enable such comparisons. As well, these materials allow further exploration of trends in band mass, mobility, and lattice thermal conductivity in Zintl antimonides. From an application perspective, good thermoelectric performance in $Ca_{5-x}Na_xAl_2Sb_6$ would be attractive, as the constituents are reasonably nontoxic and abundant.

Example 3

Synthesis $Ca_{5-x}Na_xAl_2Sb_6$ (x=0, 0.05, 0.25, 0.5, and 1.0) samples were prepared by ball milling elemental reagents followed by hot pressing. Starting with 99.99% Ca dendrites from Sigma-Aldrich, and from Alpha Aesar: 99.95% Na chunks, 99% Al shot, and 99.5% Sb lumps, the elements were loaded into stainless steel vials with stainless steel balls in a argon filled glove box. The mixtures were milled for 1 hour using a SPEX Sample Prep 8000 Series Mixer/Mill. The fine powder that resulted from ball milling was hot pressed in high density graphite dies (POCO) using 1.4 tons of force on a 12 mm diameter surface. A maximum temperature of 973K for 2 hours in argon was used during hot pressing, followed by a stress-free anneal at 873K and a 3 hour cool down under vacuum.

Example 4

Characterization

Following hot pressing, the resulting polycrystalline ingots were sliced into disks (1 mm thick, 12 mm diameter) and the high temperature transport properties were characterized to 850K under dynamic vacuum at the Caltech thermoelectrics laboratory. Electrical resistivity was determined using the van der Pauw technique and the Hall coefficient was measured with a 2 T field and pressure-assisted contacts. The Seebeck coefficient was measured using Chromel-Nb thermocouples and by allowing the temperature gradient across the sample to oscillate from +/−10 K. A Netzsch LFA 457 was used to measure thermal diffusivity and the heat capacity was estimated using the method of Dulong-Petit. Powder XRD patterns were measured on a Philips XPERT MPD diffractometer operated at 45 kV and 40 mA.

The x=0.25 composition was additionally characterized to 1050K using the thermoelectric laboratory at the Jet Propulsion Laboratory. These instruments are similar to those found at Caltech, the details of these measurements can be found in Ref. [6].

Example 5

Results and Discussion

Figure 3:
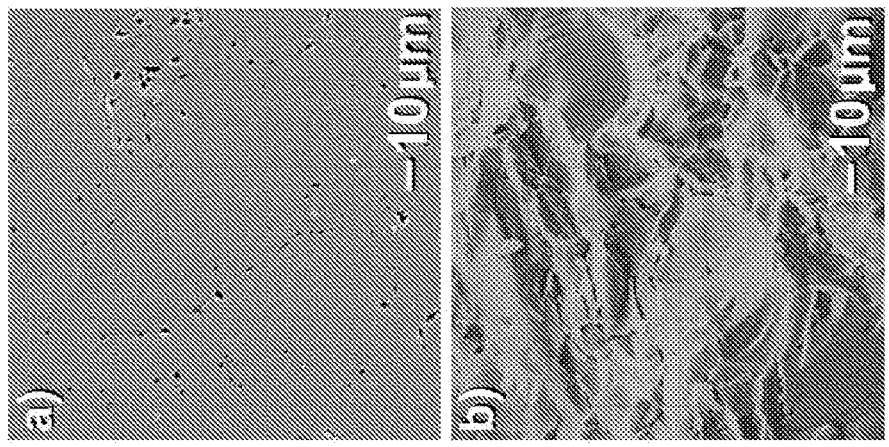
FIG. 3 demonstrates, in accordance with an embodiment of the invention, scanning electron micrographs of $Ca_{4.75}Na_{0.25}Al_2Sb_6$ following hot pressing with a density of 98% theoretical. Polished (a) and fracture surfaces (b) reveal grains as large as 50 μm in diameter.

Hot pressing of intrinsic $Ca_5Al_2Sb_6$ and Na doped samples yielded high density polycrystalline ingots (≥98% theoretical). Sample cross sections were investigated with scanning electron microscopy (SEM), which confirmed the high density of these samples, with few pores observed (FIG. 3). Despite the moderate pressure and temperature used during hot pressing, average grains sizes were found to be in excess of 10 μm by SEM.

Figure 5:
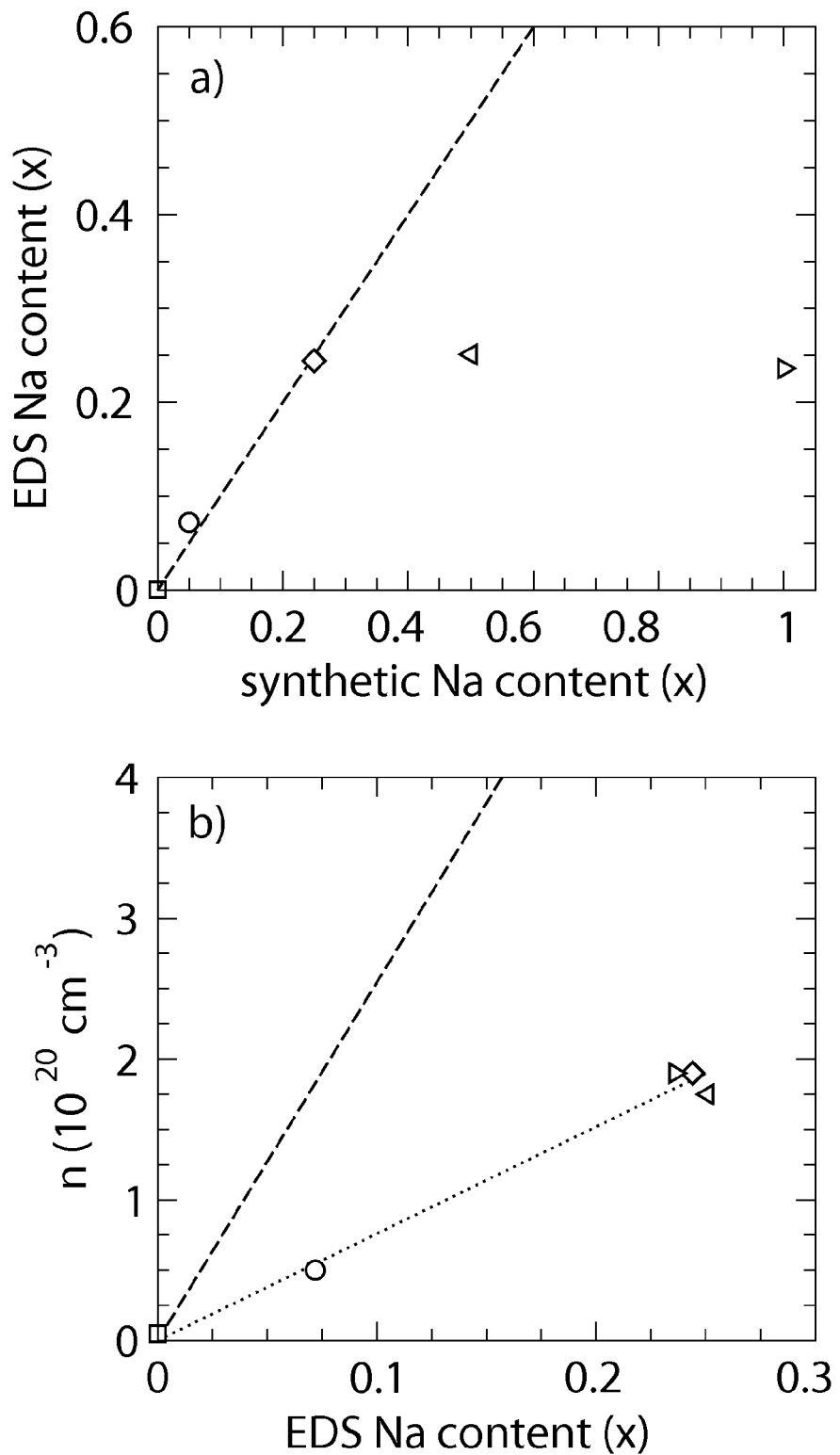
FIG. 5 demonstrates, in accordance with an embodiment of the invention, a) EDS measurements suggest Na levels in $Ca_{5-x}Na_xAl_2Sb_6$ track the synthetic composition well (dashed line) until a maximum Na level of x=0.25 is reached. b) Hall effect measurements likewise finds the carrier concentration does not exceed $2 \times 10^{20}$ h$^+$ cm$^{-3}$. Increasing Na content leads to increasing hole concentration, although at a reduced level than predicted by simple electron counting (dashed line).

No secondary phases were observed by EDS or backscattering mode SEM imaging. EDS analysis found Na in all alloyed samples, however a plateau in Na content was observed above x=0.25 (FIG. 5a). The dashed line in FIG. 5a shows the expected sodium content from the nominal synthetic stoichiometry. For compositions above x=0.25, an unidentified secondary phase was extruded out of the die during pressing. This suggests the material expelled during pressing was sodium rich, consistent with the variety of low melting phases in the Na—Sb and Na—Al phase diagram.

Figure 4:
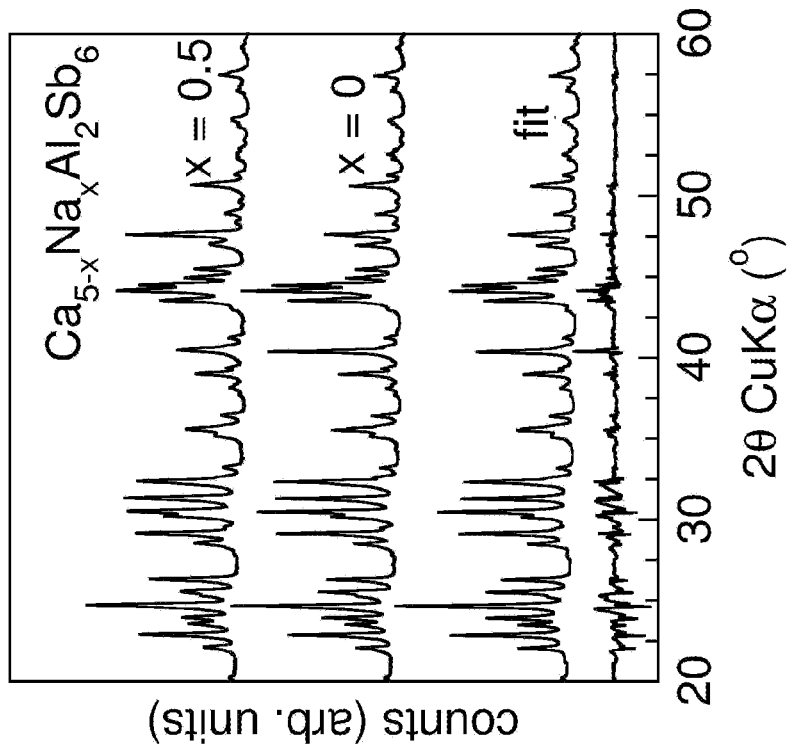
FIG. 4 demonstrates, in accordance with an embodiment of the invention, powder XRD patterns for $Ca_{5-x}Na_xAl_2Sb_6$ (x=0, 0.5) and Rietveld fit to the $Ca_5Al_2Sb_6$ structure and difference profile for the x=0 pattern. [23].

X-ray diffraction (XRD) patterns of polycrystalline slices of $Ca_{5-x}Na_xAl_2Sb_6$ were subject to Rietveld refinement using the known structure (Pbam). FIG. 4 shows two representative patterns: x=0 and 0.5. [23] Additionally, FIG. 4 shows the fit and difference profile for the x=0 phase. No secondary phases were observed in any of the XRD patterns. Na was selected as a dopant for Ca due to the similar ionic radii; it is thus not a surprise that no trend in unit cell parameters was observed with Na doping.

Electronic Properties

Figure 6:
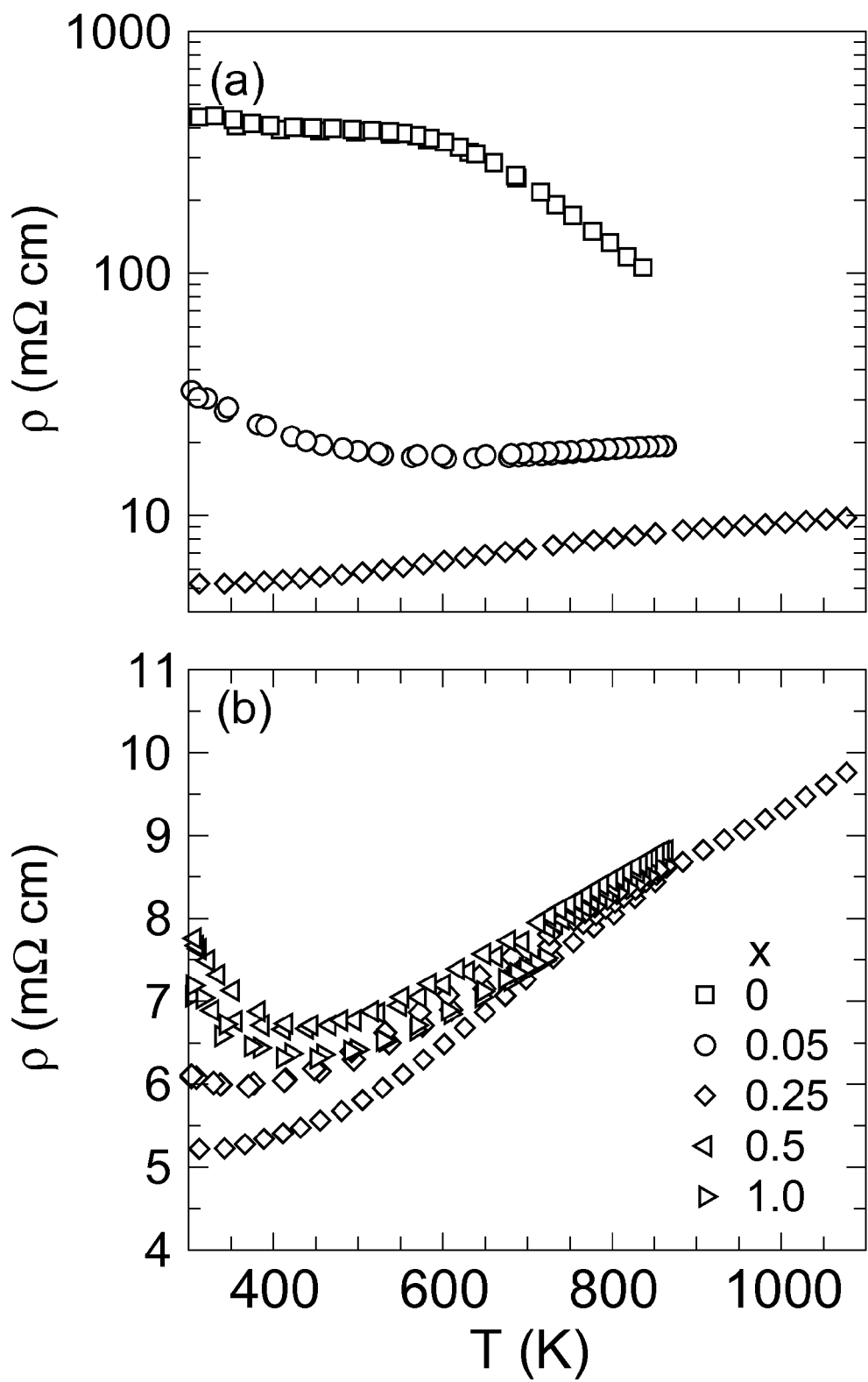
FIG. 6 demonstrates, in accordance with an embodiment of the invention, the resistivity of $Ca_{5-x}Na_xAl_2Sb_6$ decreases with increasing Na (and thus h$^+$) levels. At low carrier concentrations, the conduction is activated, whereas metallic conductivity limited by phonon scattering is apparent at high carrier concentrations.

In undoped $Ca_5Al_2Sb_6$, the inventors found decreasing resistivity with increasing temperature (FIG. 6a), suggesting carrier activation across a band gap. Fitting the high temperature behavior of the undoped sample ($\sigma \propto exp(E_g/2kT)$ for an intrinsic semiconductor), a band gap of 0.5 eV is obtained, similar to that obtained from $Yb_{14}AlSb_{11}$ (0.5 eV). [6]

Figure 9:
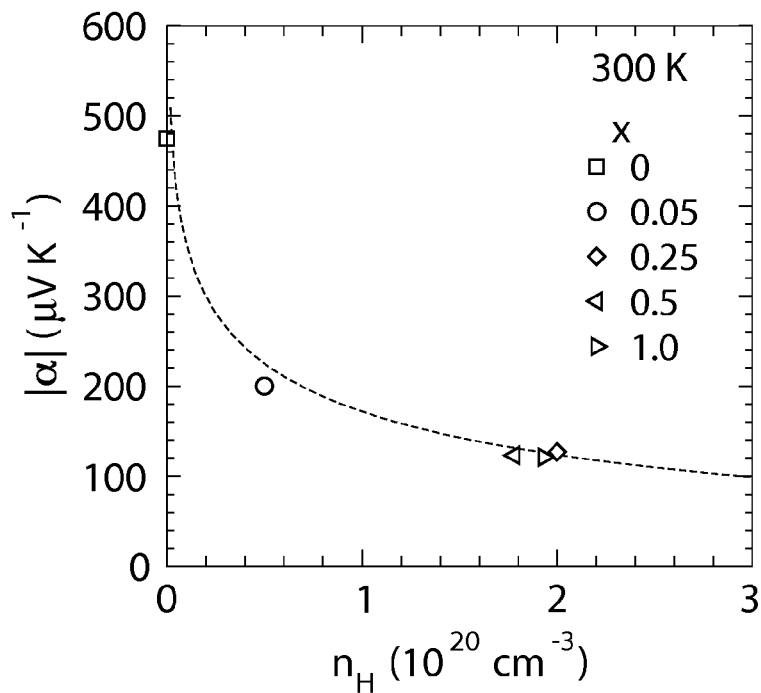
FIG. 9 demonstrates, in accordance with an embodiment of the invention, carrier concentration (n) dependence of room temperature Seebeck coefficients compared to a single parabolic band model with an effective mass of 2.2 m$_e$ FIG. 10 demonstrates, in accordance with an embodiment of the invention, high temperature Seebeck coefficients of $Ca_{5-x}N_xAl_2Sb_6$ shows decreasing magnitude with increasing carrier concentration (Na doping).

With low sodium doping (x=0.05), a decreasing resistivity with increasing temperature is likewise observed. Hall effect measurements yield the Hall carrier concentration ($n_H=1/R_He$, with Hall coefficient $R_H$ and electric charge e). A slight rise in carrier concentration with temperature (FIG. 7) is observed with Hall effect measurements in doped samples. The temperature dependence of the resistivity for x=0.05 arises from this slight carrier activation and the thermally activated carrier mobility (FIG. 9). The activated mobility may arise from the presence of a resistive grain boundary phase such as an oxide or may be due to carrier localization.

Figure 7:
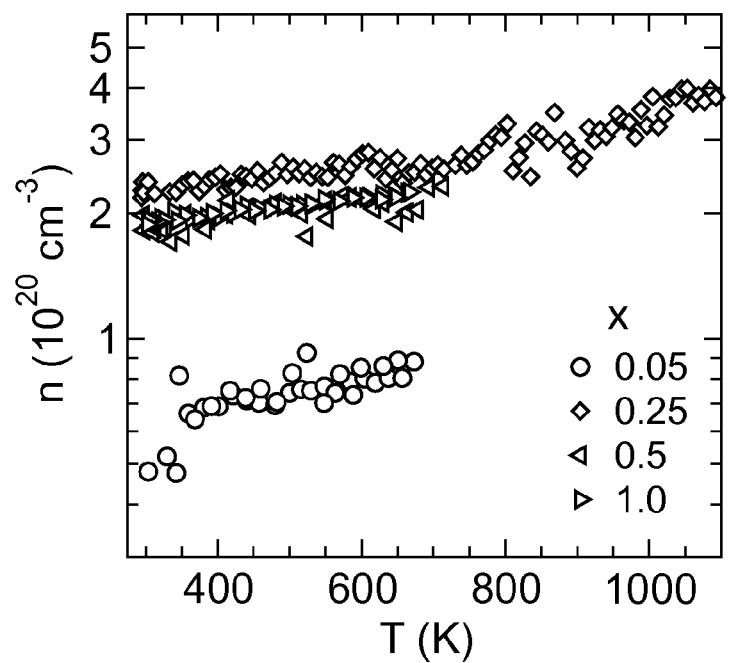
FIG. 7 demonstrates, in accordance with an embodiment of the invention, the Hall carrier concentration is constant with temperature for all $Ca_{5-x}Na_xAl_2Sb_6$ compositions, suggesting the successful formation of heavily doped semiconductors.
Figure 8:
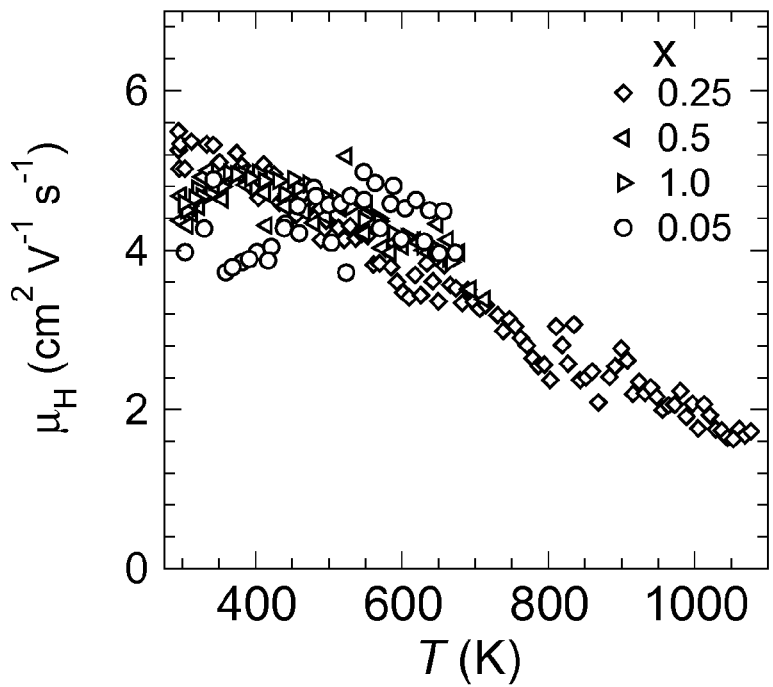
FIG. 8 demonstrates, in accordance with an embodiment of the invention, mobility (μ) across the $Ca_{5-x}Na_xAl_2Sb_6$ series from Hall effect measurements. Samples with low doping levels show some evidence for activated behavior leading to an increase in mobility with increasing temperature. The decay in mobility at higher temperatures is associated with phonon scattering.

At high doping levels (x≥20.25, the electrical resistivity is linear at high temperature (FIG. 6b) and the Hall carrier concentration is approximately temperature independent (FIG. 7). Generally, the mobility decays with increasing temperature, associated with phonon scattering. At low temperatures, the mobility shows a slightly positive slope and the resistivity briefly shows a negative slope with temperature. These observations suggest the activation effect in sample x=0.05 is again present, albeit at a lower level, in the samples here.

Extrinsic doping of $Ca_5Al_2Sb_6$ with sodium clearly yields a material with the properties of a heavily doped semiconductor. FIG. 5b shows the relationship between doping level and chemical carrier concentration (n) with increased alloying. The dashed line represents the theoretical n vs EDS x, calculated using Zintl-Klemm charge counting rules. The carrier concentration for samples above x=0.25 plateaued at $2 \times 10^{20}$ $cm^{-3}$. The measured carrier concentration is lower than expected from the EDS composition. While not wishing to be bound by any one particular theory, this difference may be due to compensating impurities which reduce the doping effectivity. Alternatively, extended defects may form which involve additional anionic bonding, thereby reducing the effective hole concentration.

The Seebeck coefficient of the nominally undoped sample is positive and reasonably large in magnitude, typical for nominally undoped Zintl antimonides. [6] The effect of Na-doping, and thus increasing carrier concentration, on the Seebeck coefficient is shown at 300K in FIG. 9. As generally expected, increased carriers leads to a decrease in Seebeck coefficient. Further analysis incorporates solutions to the Boltzmann transport equation within the relaxation time approximation. In the absence of minority carrier properties, a single parabolic band model is utilized. This model uses Eq. 1 and 2 to relate the Seebeck coefficient to the carrier concentration via the chemical potential ($\eta$) with $\lambda=0$ (acoustic phonon scattering). Here, $F_j(\eta)$ is the Fermi integral Eq 3, with $\zeta$ the reduced carrier energy. The dashed curve was generated using this single parabolic band model at room temperature with an effective mass (m* of 2.2 $m_e$). Good agreement is found with the measured room temperature Seebeck coefficients, suggesting a single parabolic band reasonably describes the valence band edge.

$$\alpha = \frac{\kappa}{e}\left(\frac{(2+\lambda)F_{1+\lambda}(\eta)}{(1+\lambda)F_\lambda(\eta)} - \eta\right) \quad (1)$$

$$n = 4\pi\left(\frac{2m*kT}{h^2}\right)^{\frac{3}{2}} F_{\frac{1}{2}}(\eta) \quad (2)$$

$$F_j(\eta) = \int_0^\infty \frac{\zeta^j \, d\zeta}{1+\text{Exp}[\zeta-\eta]} \quad (3)$$

Figure 10:
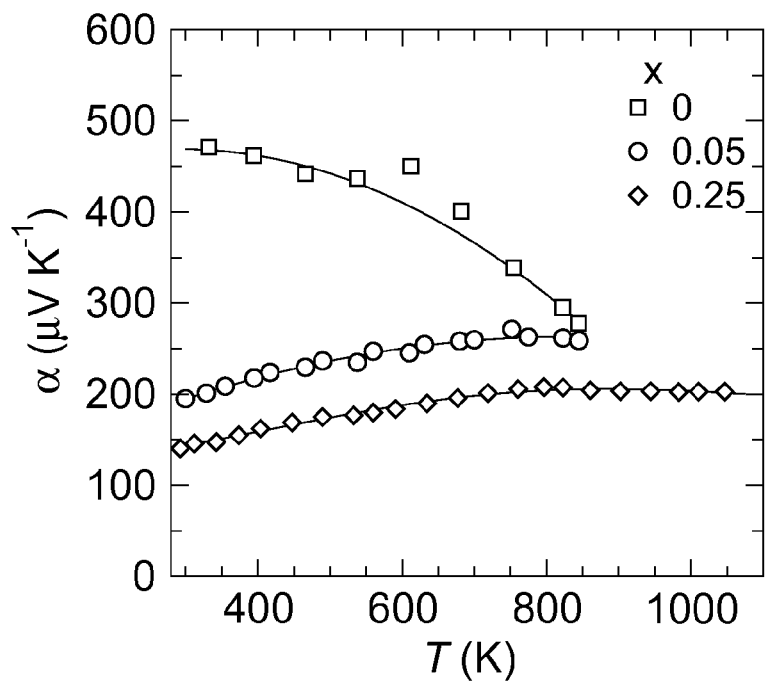

The high temperature Seebeck coefficients as functions of temperature are shown in FIG. 10. The nominally undoped sample shows a decaying Seebeck coefficient with increasing temperature, as carrier activation dominates transport. Linearly temperature dependent Seebeck coefficients are obtained with extrinsic doping, as expected for degenerate semiconductors. At high temperature, the Seebeck coefficient reaches a broad maximum due to minority carrier activation. From the maximum temperature and associated Seebeck coefficent, a thermal band gap of ~0.4 eV is calculated ($E_g \cong 2eT_{max}\alpha_{max}$).[24]

Thermal Properties

Figure 11:
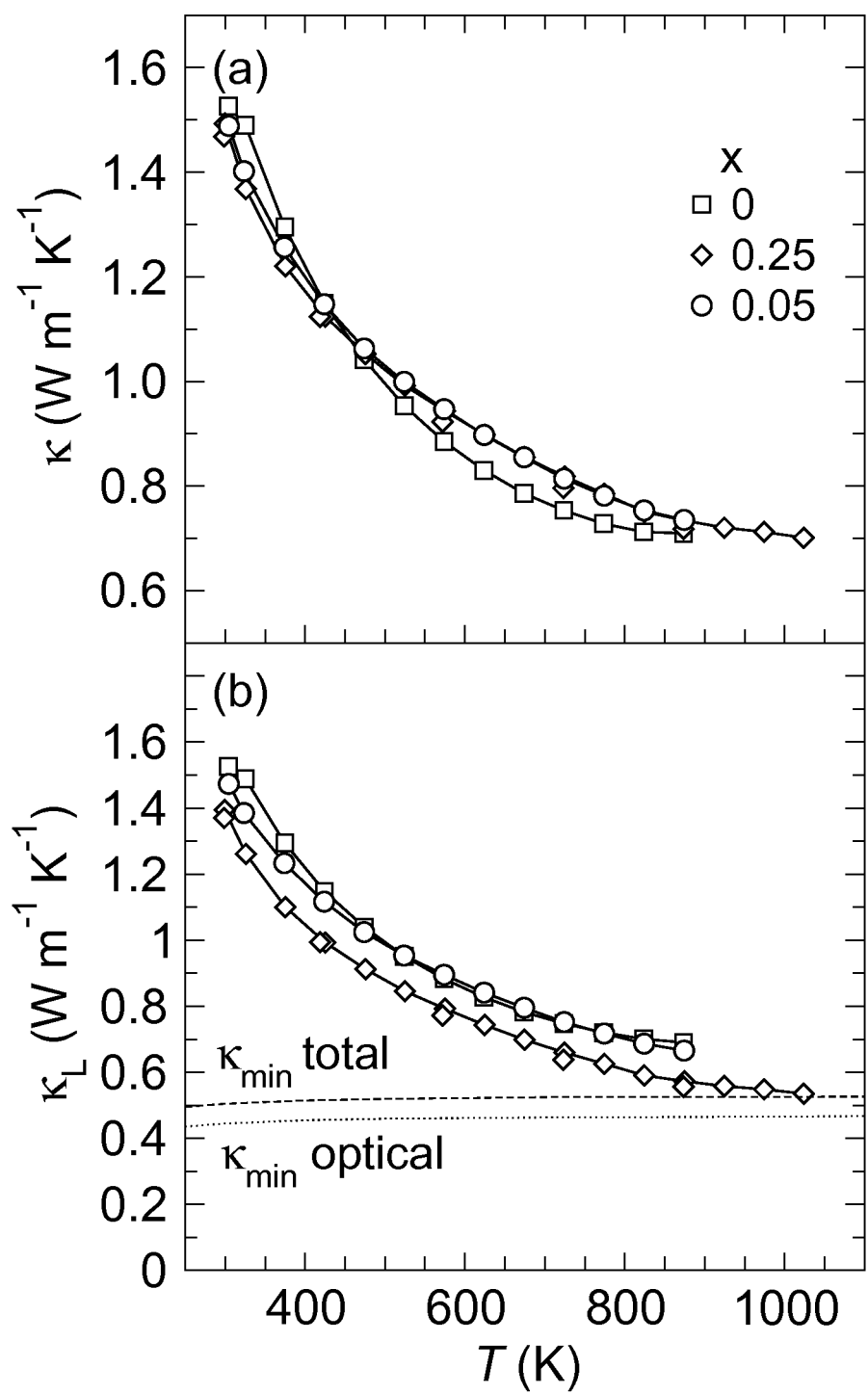
FIG. 11 demonstrates, in accordance with an embodiment of the invention, (a) total thermal conductivity and (b) the lattice component for $Ca_{5-x}Na_xAl_2Sb_6$. The minimum thermal conductivity is obtained from Eq. 7. By assessing the optical mode contribution to the minimum thermal conductivity ($\kappa_{min}$ optical), the experimental acoustic contribution can be estimated.

The thermal conductivity was calculated with $\kappa=DC_pd$ where D is thermal diffusivity, $C_p$ is heat capacity, and d is density. Here, the measured density and the Dulong-Petit approximation to the heat capacity ($C_p=0.33$ J $g^{-1}$ $K^{-1}$) were used. At high temperature anharmonic and electronic terms will provide slight additional contributions, as seen in $Yb_{14}MnSb_{11}$ and $La_3Te_4$. [25, 26] The electronic thermal conductivity, $\kappa_e$, is estimated here using the Wiedemann-Franz relationship ($\kappa_e = LT/\rho$). The temperature dependent Lorenz numbers were calculated using a single parabolic band model (Eq. 4, transport limited by acoustic phonon scattering), where the reduced Fermi energy is a function of the experimental Seebeck coefficient. Due to relatively low doping levels, $\kappa_e$ is minimal and the thermal conductivity ($\kappa = \kappa_L + \kappa_e + \kappa_B$) is dominated by the lattice ($\kappa_L$) and bipolar contributions ($\kappa_B$). Minimal bipolar effects are observed within the temperature range investigated. The total and lattice thermal conductivity are shown in part a and b of FIG. 11 respectively.

$$L = \frac{k^2}{e^2} \frac{3F_0(\eta)F_2(\eta) - 2F_1(\eta)^2}{F_0(\eta)^2} \quad (4)$$

Ultrasonic measurements at 300K yield longitudinal and transverse speeds of sounds of $\mu_l = 4093$ m/s; $\mu_t = 2399$ m/s. Eq. 5 yields a mean speed of sound of 2660 m/s ($\mu_m$, Eq. 5). These values are ~14% higher than the Zintl antimonide $SrZn_2Sb_2$. Such a difference can be readily rationalized; from the difference in density (d), an increase of 15% in the speed of sound ($\mu = (B/d)^{1/2}$) would be anticipated if the bulk moduli (B) of $SrZn_2Sb_2$ and $Ca_5Al_2Sb_6$ are identical. From the speed of sound values, an effective Debye temperature of 257K is obtained from Eq. 6.

$$v_m^3 = \frac{3}{v_l^{-3} + 2v_t^{-3}} \quad (5)$$

$$\phi_D = \frac{v_m \hbar}{k_b} \left(\frac{6\pi^2}{V}\right)^{1/3} \quad (6)$$

At high temperatures, FIG. 11b shows that $\kappa_L$ approaches the minimum thermal conductivity ($\kappa_{min}$, dashed line) calculated from Eq. 7. Such a low thermal conductivity likely arises from the structural complexity of $Ca_5Al_2Sb_6$. The vast majority of the heat capacity is in high frequency optical modes with near zero group velocity. The contribution of these modes to the thermal conductivity can be estimated using the expression for minimum thermal conductivity (Eq. 7). To isolate the optical contribution to $\kappa_{min}$, the high frequency edge of the acoustic branch $$\left(\left(\frac{\phi_i}{TN^{1/3}}\right), N = 26 \text{ atoms/primitive cell}\right)$$

sets the lower bound to the integral. This optical $\kappa_{min}$ is shown as the dotted line in FIG. 11b.

$$\kappa_{min} = \left(\frac{\pi}{6}\right)^{1/3} \frac{k_b}{V^{2/3}} \sum_i v_i \left(\frac{T}{\phi_i}\right)^2 \int_0^{\frac{\phi_i}{T}} \frac{x^3 e^x}{(e^x - 1)^2} dx \quad (7)$$

With this approximation for the optical contribution, the acoustic contribution is $\kappa_L - \kappa_{min,optical}$. The decay in $\kappa_{acoustic}$ with increasing temperature arises from increased Umklapp scattering. At high temperatures, Umklapp scattering leads to a near-minimum acoustic phonon mean free path.

The low thermal conductivity in $Ca_5Al_2Sb_6$ thus appears to arise from the low group velocity of the optical modes and Umklapp scattering of the acoustic modes. Further reduction in $\kappa_L$ could come from nanostructures to further suppress the acoustic mean free path and the investigation of $A_5M_2Pn_6$ compounds with higher mass densities.

Thermoelectric Figure of Merit

Figure 12:
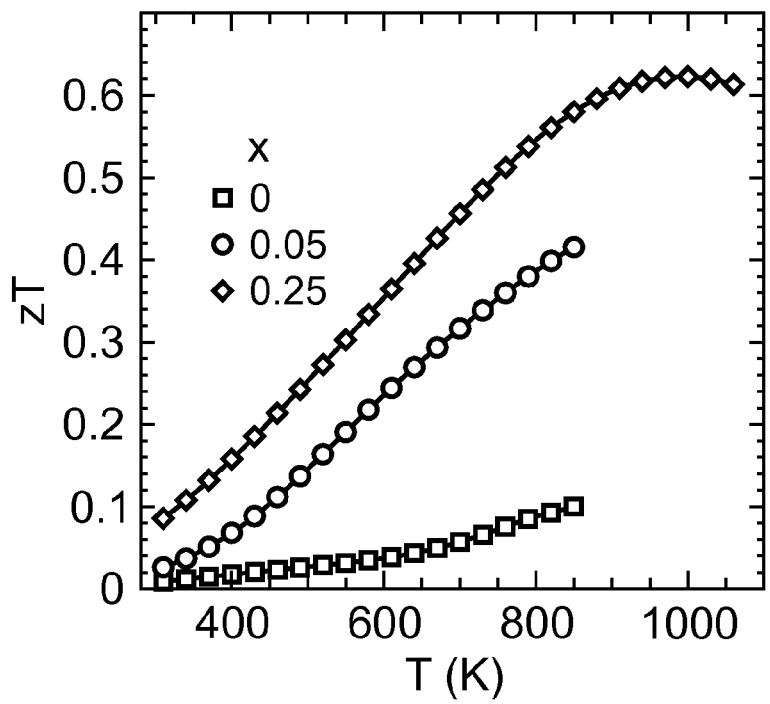
FIG. 12 demonstrates, in accordance with an embodiment of the invention, the high temperature thermoelectric figure of merit (zT) increases with increasing temperature. The optimization of zT with carrier concentration is described in FIG. 13.

From the high temperature transport measurements discussed above, the thermoelectric figure of merit (zT) can be estimated. FIG. 12 shows zT curves calculated for the x=0-0.25 compositions. A maximum zT value in excess of 0.6 is obtained at 1000 K.

Figure 13:
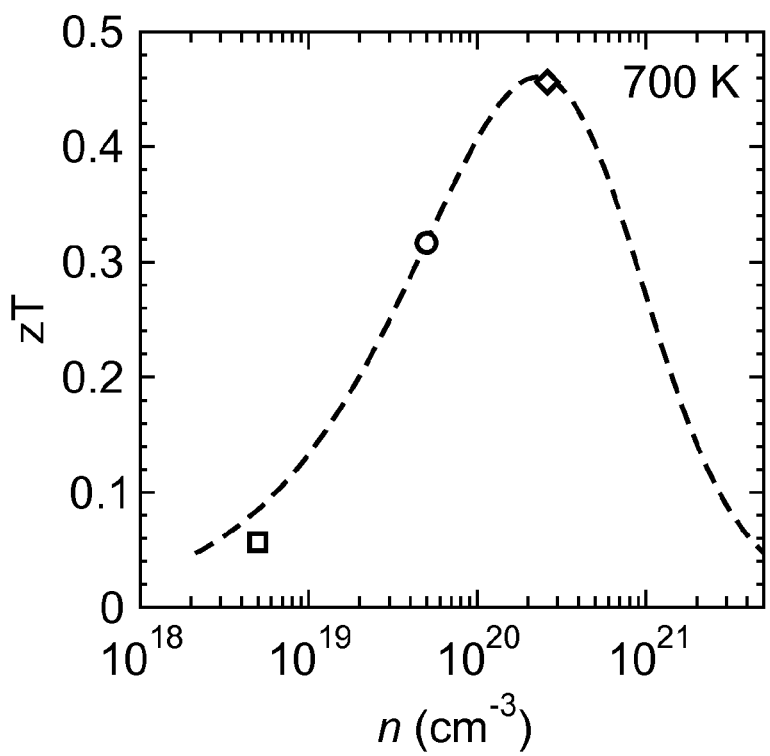
FIG. 13 demonstrates, in accordance with an embodiment of the invention, experimental zT versus carrier concentration at 700K. The solid line was generated using a single parabolic band model with parameters given in the text.

From the transport data, a single parabolic band model can be developed to determine the optimum carrier concentration. Here, the inventors have focused on transport at 700K, to avoid any error associated with thermally-induced minority carriers. The measured properties of the x=0.25 sample were used as inputs into Eq. 1 and 2 to yield an effective mass of 1.9 $m_e$. To determine the carrier concentration dependence of the mobility, Eq. 8 is used (yielding a $\mu_o$ of 4.7 cm$^2$ V$^{-1}$ s$^{-1}$). A constant value of the lattice thermal conductivity is used (0.76Wm-1 K-1), regardless of doping level. The result of this model is shown in FIG. 13, and yields good agreement with experiment across the measured carrier concentration regime. Note that this model is limited by the assumption of a single parabolic band. Considering the effects of minority carriers, this is likely a slight underestimation of the optimum carrier concentration. Above 1000 K, samples with greater doping should yield higher zT than the x=0.25 sample by remaining degenerate to higher temperatures.

$$\mu_H = \mu_0 \frac{(1/2 + 2\lambda)F_{2\lambda-1/2}(\eta)}{(1 + \lambda)F_\lambda(\eta)} \quad (8)$$

Beyond good thermoelectric performance, $Ca_5Al_2Sb_6$ is intriguing for magnetic investigations as the Al site should be suitable for transition metal substitution (as previously seen in $Yb_{14}AlSb_{11}$). [6, 27] While not wishing to be bound by any one particular theory, potentially, such materials could exhibit dilute magnetic semiconductor behavior or low dimensional magnetic behavior mediated by the anionic topology.

Example 6

Conclusions

Inspired by the excellent thermoelectric performance of $Yb_{14}MnSb_{11}$, this investigation of the high temperature transport properties of $Ca_5Al_2Sb_6$ reveals good thermoelectric performance and generally highlights the potential for Zintl compounds as thermoelectrics. The transport behavior of $Ca_5Al_2Sb_6$ is quite similar to $Yb_{14}MnSb_{11}$, with a large effective mass, low mobility, and low lattice thermal conductivity arising from structural complexity. The carrier concentration varies monotonically as a function of chemical dopant concentration and can reach levels associated with optimum performance ($10^{20}$ cm$^{-3}$). The large band gap (~0.5 eV) and low cost, light, nontoxic materials suggest that $Ca_5Al_2Sb_6$-based materials could be ideal for high temperature waste heat recovery.

Example 7

Additional Data

Further insight into the intrinsic electronic transport behavior of $Ca_5Al_2Sb_6$ is obtained from the electronic structure calculations. For thermoelectric materials, such calculations reveal the band mass, $m^*_{band}$, and degeneracy, $N_v$, near the band edge. Here, $m^*_{band}$ is determined by parabolic parameterization. The SPB effective mass, $m^*$, and $m^*_{band}$ are related via the band degeneracy according to $(m^*)^{3/2} = N_v (m^*_{band})^{3/2}$. As the mobility is determined by $m^*_{band}$, high band degeneracy is desirable in thermoelectric materials.

Figure 31:
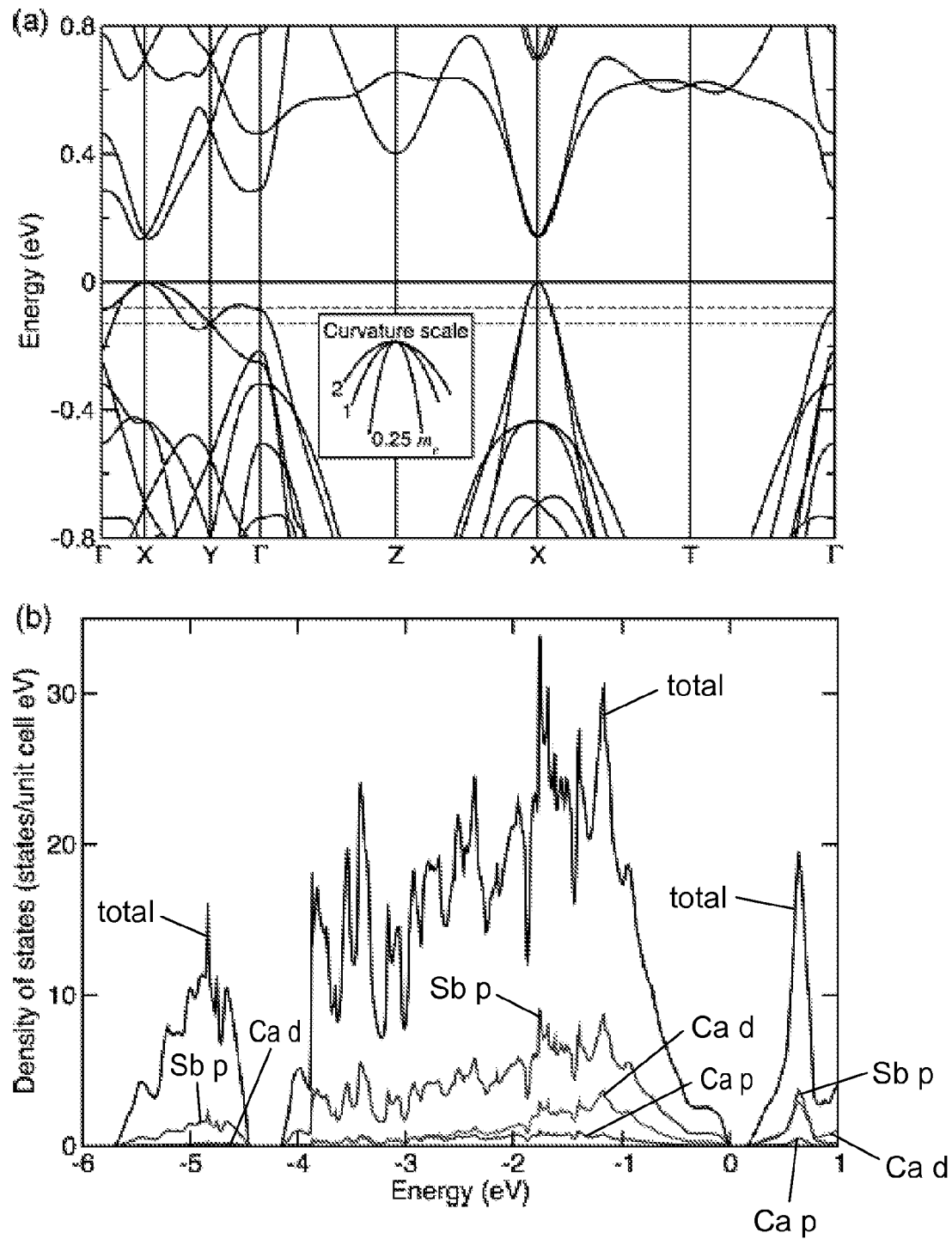
FIG. 31 demonstrates, in accordance with an embodiment of the invention, (a) the calculated $Ca_5Al_2Sb_6$ band structure shows a direct gap at X. The valence band edge consists of two nested hole pockets with band masses between 0.25 and 2 me, depending on the direction. The dashed lines at −0.08 and −0.13 eV correspond to 1 and $5 \times 10^{20}$ h⁺/cm³, respectively. (b) the density of states of $Ca_5Al_2Sb_6$ shows that the material is a semiconductor with Sb p states as the dominant influence near the valence band edge.

Consistent with the experimental results above, simple electron counting suggests $Ca_5Al_2Sb_6$ should be a semiconductor. The calculated band structure and density of states of $Ca_5Al_2Sb_6$ are shown in FIG. 31a and reveal a direct band gap of 0.15 eV at the X point. In the upper valence and lower conduction band, the main contributions to the density of states are the Sb p- and Ca d-states. As there is negligible Al contribution to the band edges, rigid band behavior can be expected when Zn is substituted for Al. This is consistent with the inventors' experimental observation that Zn has minimal effect on $m^*$.

The calculated band structure reveals nested bands at the X point, leading to a doubly degenerate band edge. An additional doubly degenerate band is found ~0.1 eV into the band, between Γ and Y. The energies corresponding to carrier concentrations of 1 and $5 \times 10^{20}$ cm$^{-3}$ are shown in FIG. 31b. The pocket of bands at ~0.1 eV and the anharmonicity away from the intrinsic band edge may lead to a breakdown of the SPB model at high doping concentrations.

Example 8

Zn- and Mn-Doped $Ca_5Al_2Sb_6$

In addition to Na doping on the Ca site in $Ca_5Al_2Sb_6$, the inventors have investigated both Zn and Mn as dopants on the Al site. $Mn^{2+}$ and $Zn^{2+}$ replace the $Al^{3+}$ ions, resulting in one free hole per substitution.

Samples were prepared using the same methods described for Na-doped $Ca_5Al_2Sb_6$. $Ca_5Mn_xAl_{2-x}Sb_6$ (x=0.05, 0.1, 0.2, 0.3) samples were dense, and had grain sizes similar to those of Na-doped $Ca_5Al_2Sb_6$. However, they contained about 5% of two different minority phases; $CaSb_2$ and $Ca_{11}Sb_{10}$. $Ca_5Zn_xAl_{2-x}Sb_6$ (x=0.02, 0.05, 0.1, 0.2) samples were less dense, and had smaller grain size.

Figure 32:
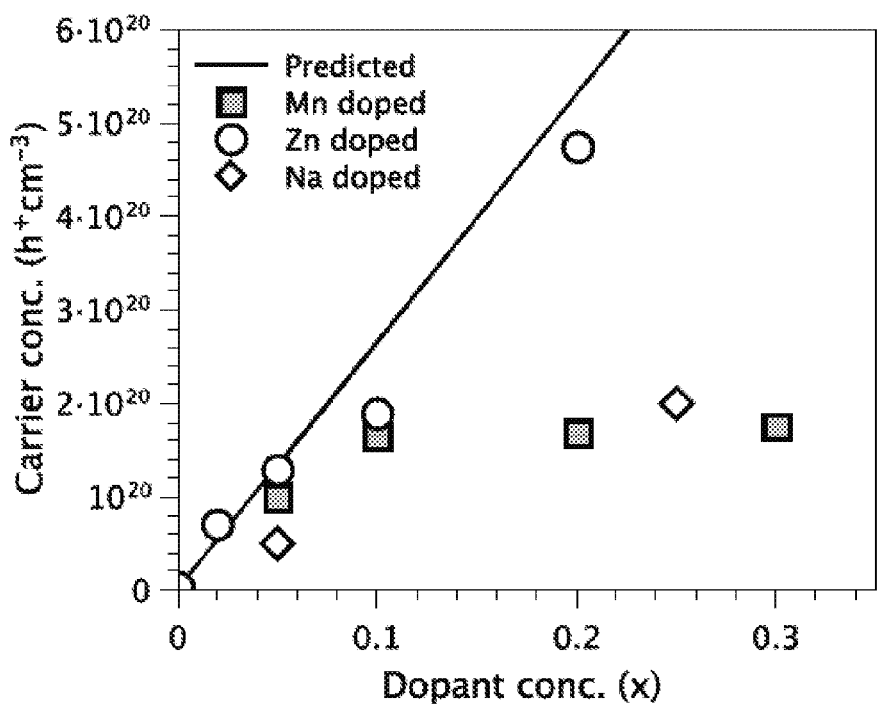
FIG. 32 demonstrates, in accordance with an embodiment of the invention, room temperature Hall carrier concentrations increase with dopant concentration for Mn-, Zn-, and Na-doped $Ca_5Al2Sb_6$. In practice, Na and Mn are not fully activated dopants relative to the predicted relationship assuming one free hole per dopant atom (solid line).

Hall measurements at room temperature show that the p-type carrier concentration in Zn-doped samples agrees well with the predicted concentration, as shown in FIG. 32. The highest hole concentration ($4.5 \times 10^{20}$ in $Ca_5Zn_{0.2}Al_{1.8}Sb_6$) was twice that obtained in Na-doped $Ca_5Al_2Sb_6$. Mn doping resulted in less than predicted hole concentrations, similar to the trend observed in Na-doped $Ca_5Al_2Sb_6$.

As reported for Na-doped $Ca_5Al_2Sb_6$, Mn- and Zn-doped $Ca_5Al_2Sb_6$ exhibit a transition from non-degenerate semiconducting behavior with increased dopant-concentration; lightly doped samples have resistivities that decrease with temperature, and Seebeck coefficients that roll over at low temperatures. Heavily doped samples exhibit increasing resistivity and Seebeck coefficients across the measured temperature range.

Figure 33:
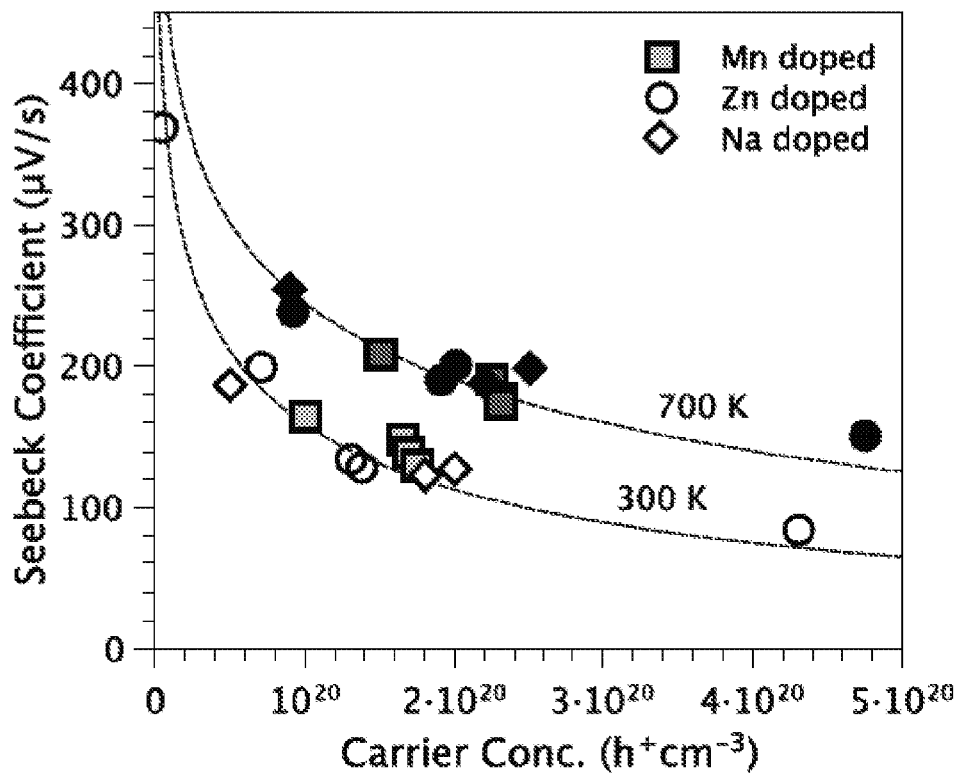
FIG. 33 demonstrates, in accordance with an embodiment of the invention, experimental Seebeck coefficients at 300 and 700 K of Mn-, Zn-, and Na-doped $Ca_5Al_2Sb_6$. Dashed curves were generated using a single parabolic band model with an effective mass of 1.8 $m_e$ and 2.0 $m_e$ for 300 K and 700 K, respectively.

The Pisarenko plot shown in FIG. 33 illustrates the dependence of the Seebeck coefficient on carrier concentration in Na-, Mn-, and Zn-doped $Ca_5Al_2Sb_6$. Within the measurement variation expected, $Ca_5Al_2Sb_6$ appears to be well described by a single parabolic band model (dashed curves), regardless of dopant type.

At optimum carrier concentrations, zT values in Zn- and Mn-doped $Ca_5Al_2Sb_6$ are slightly lower than that obtained in Na-doped $Ca_5Al_2Sb_6$. This is attributed to lower mobility found in Zn-doped samples (likely due to small grain size), and variability in each measurement. However, both dopants have the advantage of being less reactive than Na, and Zn allows for superior carrier concentration control.

Example 9

Iso-Structural Compounds; $Ca_5In_2Sb_6$ and $Ca_5Ga_2Sb_6$

The inventors have investigated $Ca_5In_2Sb_6$ and $Ca_5Ga_2Sb_6$, both of which are iso-structural analogues to $Ca_5Al_2Sb_6$. Both materials are found to be intrinsic semiconductors with low lattice thermal conductivity, and have been doped with $Zn^{2+}$ on the $Ga^{3+}$ or $In^{3+}$ site to control carrier concentration.

Details: $Ca_5In_2Sb_6$

This study investigates the electronic and thermal properties of $Ca_5In_{2-x}Zn_xSb_6$ (x=0, 0.02, 0.05, 0.1, 0.2). $Zn^{2+}$ acts as a p-type dopant on the $In^{3+}$ site in the otherwise charge-balanced $Ca_5In_2Sb_6$ (analogous to Zn-doped $Ca_5Al_2Sb_6$), allowing the study of a wide range of carrier concentrations. The inventors have used solutions to the Boltzmann transport equation, assuming rigid, single parabolic band behavior to analyze transport data and estimate the optimum carrier concentration for this system.

Example 10

Synthesis

InSb was formed as a precursor by melting 99.999% In shot from Alpha Aesar and 99.5% Sb lumps from Sigma-Aldrich in vacuum sealed, carbon-coated quartz ampoules at 600 C for 10 h, and then quenching in water. Stoichiometric amounts of the crushed InSb precursor, 99.99% Ca dendrites, 99.99% Zn shot, and 99.5% Sb lumps from Sigma-Aldrich were loaded into stainless-steel vials with stainless-steel balls in an argon-filled glove box. The contents were dry ball-milled for 1 h using a SPEX Sample Prep 8000 Series Mixer/Mill. The resulting fine powder was hot-pressed in high-density graphite dies (POCO) in argon using 110 MPa of pressure. Before applying pressure, samples were held for 2 h at 723 K to ensure complete reaction of any remaining InSb, then consolidated for 3 h at 973 K, followed by a 3 h stress-free cool down.

Results

Figure 34:
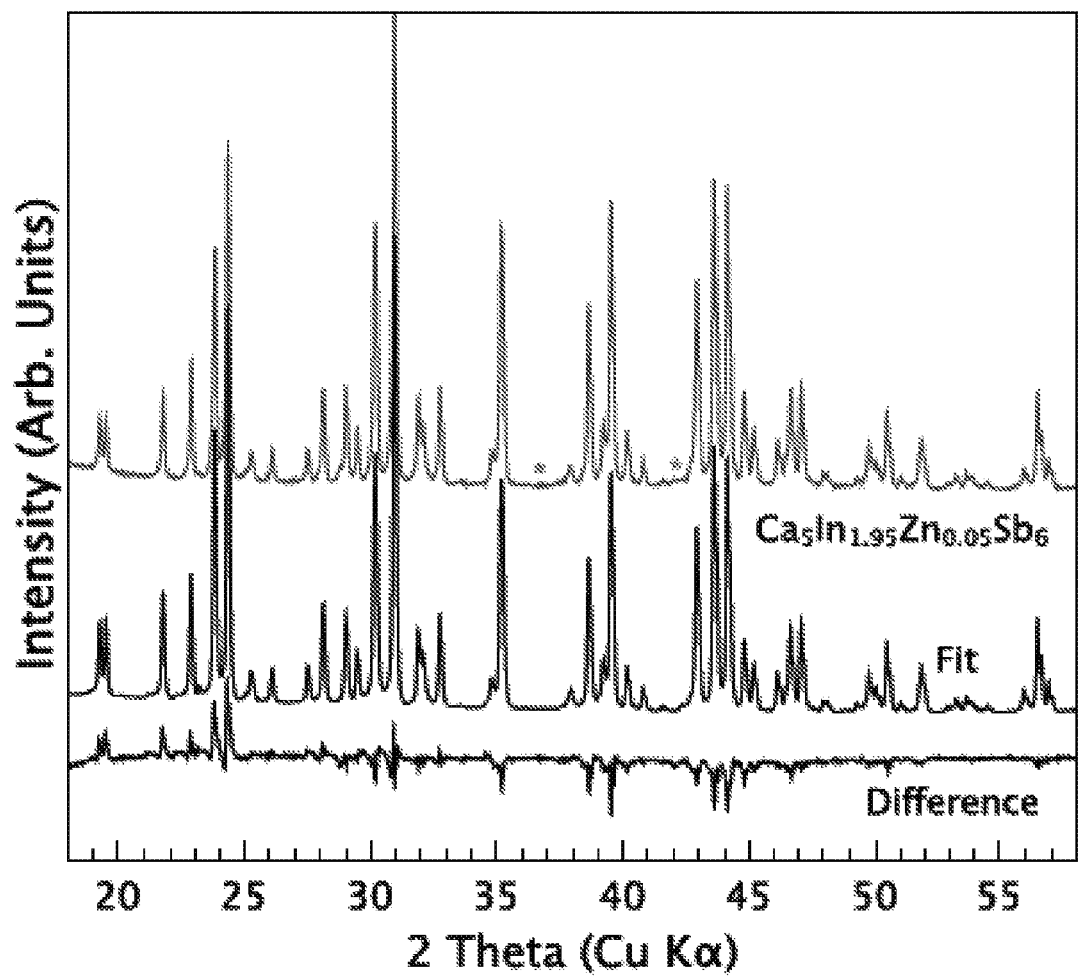
FIG. 34 demonstrates, in accordance with an embodiment of the invention, an XRD pattern of a polycrystalline slice of the x=0.05 sample, Rietveld fit using the known $Ca_5In_2Sb_6$ structure, and difference profile. Peaks belonging to an unidentified secondary phase are marked with asterisks.
Figure 35:
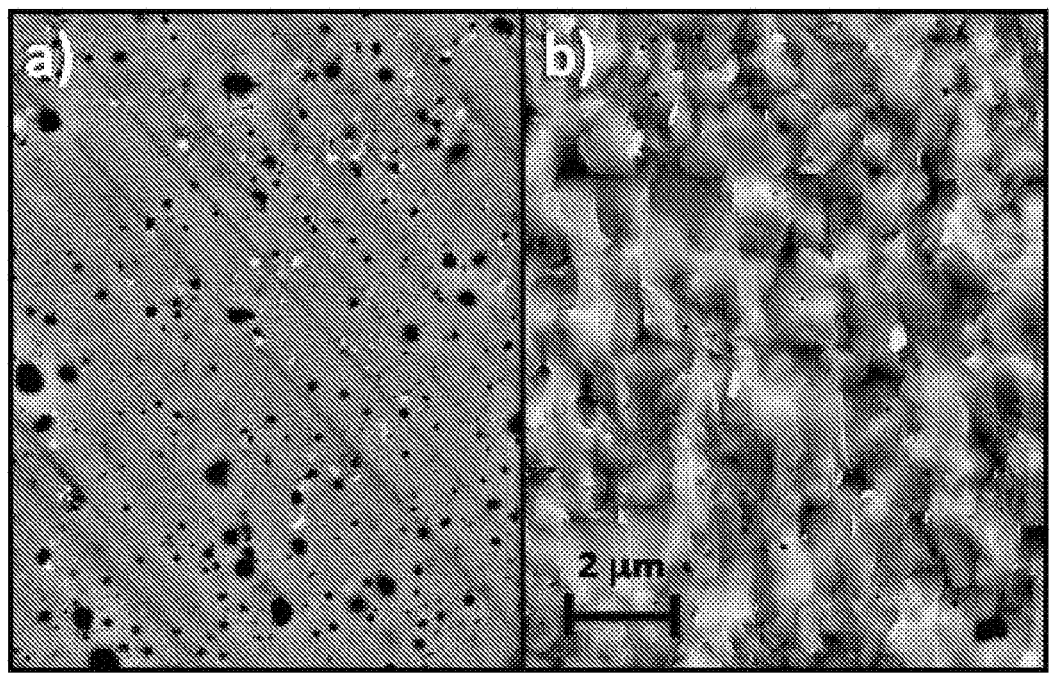
FIG. 35 demonstrates, in accordance with an embodiment of the invention, a) backscattered electron image of a polished surface of $Ca_5In_{1.9}Zn_{0.1}Sb_6$ showing representative phase fractions of $Ca_5In_2Sb_6$ (grey), a secondary phase (light grey), and pores (black). b) fracture surface of the same sample reveals grain sizes on the order of 1 µm.

The phase purity of the hot-pressed $Ca_5In_{2-x}Zn_xSb_6$ (x=0, 0.02, 0.05, 0.1, 0.2) samples was determined by X-ray diffraction (XRD) and scanning electron microscopy (SEM). FIG. 34 shows a representative XRD pattern, a Rietveld fit using the known crystal structure of $Ca_5In_2Sb_6$, and the difference profile. Two minority phase peaks are visible in the XRD pattern of each sample (marked by asterisks in FIG. 34). These peaks are consistent with SEM analysis, which revealed approximately 1-3\% of a secondary phase, visible as ~100 nm white flecks in the backscatter electron image in FIG. 35a. While these are too small for EDS measurements, their brightness indicates that they are Ca-poor relative to $Ca_5In_2Sb_6$.

The samples' geometric densities range from 95-97% of the theoretical density (4.90 g/cm$^3$ for pure Ca$_5$In$_2$Sb$_6$), consistent with the fraction of pores observed in SEM analysis. SEM images of fracture surfaces (FIG. 35b) reveal grain sizes on the order of a few microns. This is similar to Zn-doped Ca$_5$Al$_2$Sb$_6$ samples, but small compared to both Na- and Mn-doped Ca$_5$Al$_2$Sb$_6$, which had average grains sizes of 50-100 microns. Attempts to increase the grain size in Ca$_5$In$_2$Sb$_6$ by doubling the hot pressing time did not lead to appreciable improvements. No trends were observed in density, grain size, or phase purity as a function of Zn concentration.

Electronic Transport Properties

Figure 36:
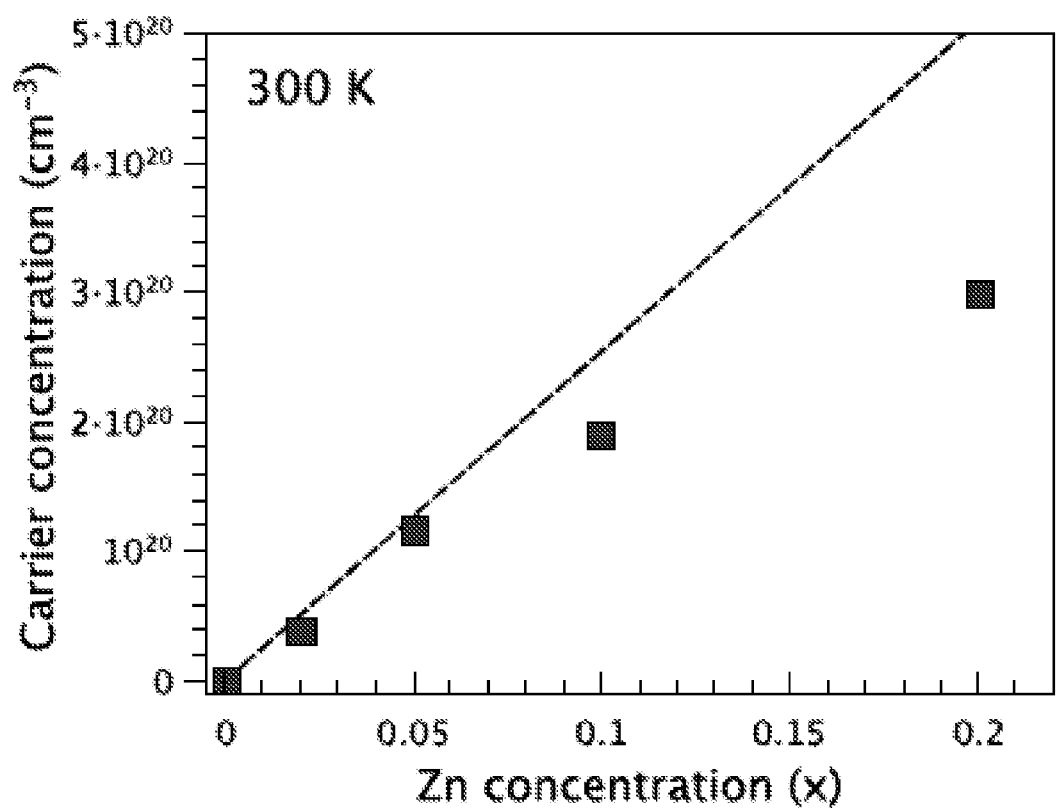
FIG. 36 demonstrates, in accordance with an embodiment of the invention, with increasing Zn content, the Hall carrier concentration at 300 K in $Ca_5In_{2-x}Zn_xSb_6$ increase as predicted by simple charge counting (dashed line) until x=0.1.

Like Ca$_5$Al$_2$Sb$_6$, Ca$_5$In$_2$Sb$_6$ should be an intrinsic semiconductor, assuming that it has a band gap. In practice, nominally undoped Ca$_5$In$_2$Sb$_6$ samples are found to be lightly hole doped (n=5×10$^{18}$ h$^+$/cm$^3$) at room temperature, likely due to impurities or slight deviations from stoichiometry. Upon doping, simple charge counting predicts that each Zn$^{2+}$ on an In$^{3+}$ site will lead to one free hole. The resulting relationship between carrier concentration (n) and x is shown as dashed line in FIG. 36. Room temperature Hall measurements reveal that n increases according to the predicted trend at low doping levels, but diverges downwards for x>0.1 (FIG. 36). Potential explanations for this reduced doping effectiveness include low Zn solubility, compensating defects, or extended lattice defects involving additional covalent bonds.

Figure 37:
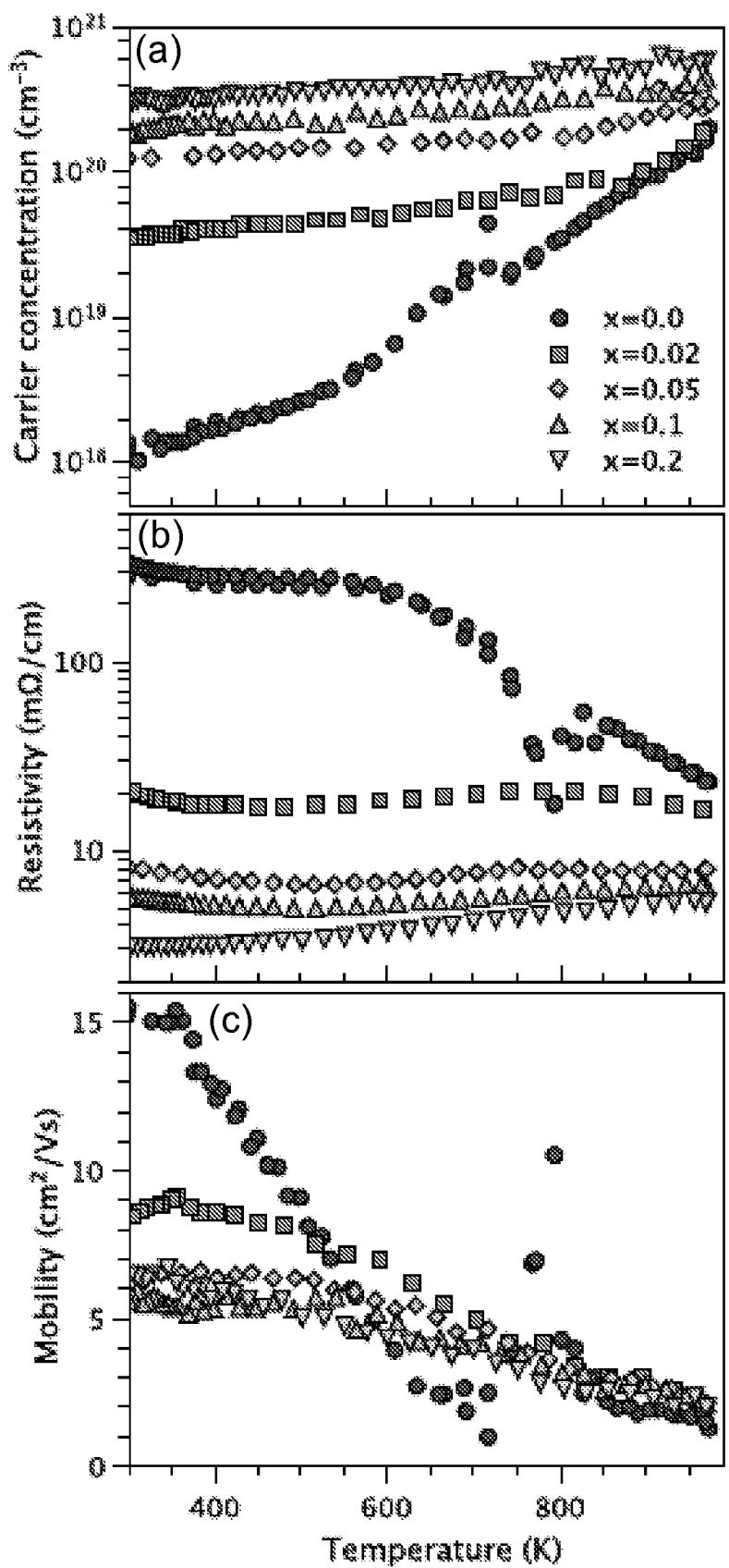
FIG. 37 demonstrates, in accordance with an embodiment of the invention, a) increasing carrier concentration in undoped $Ca_5In_2Sb_6$ is characteristic of an intrinsic semiconductor. b) Upon doping, the temperature dependence of ρ transitions from insulating to metallic behavior. c) The Hall mobility decreases both with temperature and Zn content.

Shown in FIG. 37a, the carrier concentration of undoped Ca$_5$In$_2$Sb$_6$ increases strongly as a function of temperature, likely due to activation of minority carriers across the band gap. This leads to the decrease in resistivity (ρ) with temperature shown in FIG. 37b, which is characteristic of intrinsic semiconductors. The discontinuity in the Hall and resistivity measurements at 725 K is most likely due to the phase change confirmed by DSC measurements in both undoped and doped Ca$_5$In$_2$Sb$_6$. As no hysteresis is observed on cooling from 973 K, the phase change is presumably reversible. A rough estimate of the band gap can be obtained from $\rho \propto e^{Eg/2\kappa T}$, if the decreasing resistivity at high temperature (T>800 K) is assumed to be due to thermal activation of carriers. The inventors obtained a slightly smaller band gap than that estimated for Ca$_5$Al$_2$Sb$_6$ (~0.6 eV). As illustrated in FIG. 37a, n increases and becomes less temperature dependent with increasing Zn content, but still shows evidence of thermal carrier activation at high temperatures. Correspondingly, the resistivity decreases by two orders of magnitude, and the temperature dependence transitions from insulating to metallic.

The Hall mobility (μ), calculated from ρ=1/ne, is shown in FIG. 37c. At room temp, the mobility of undoped Ca$_5$In$_2$Sb$_6$ is nearly twice that of Ca$_5$Al$_2$Sb$_6$, although it decreases rapidly with temperature. In doped samples, μ at room temperature is twice that of Zn-doped Ca$_5$Al$_2$Sb$_6$ which has similar grain size. In both doped and undoped samples, the temperature dependence of μ at high temperatures is consistent with acoustic phonon scattering (μ∝T$^{-\nu}$), where ν ranges from 1.5 to 2.5). At lower temperatures, additional scattering mechanisms are necessary to explain both the flattened temperature dependence in Zn-doped samples, as well as the sharp drop in p as a function of Zn content.

Figure 38:
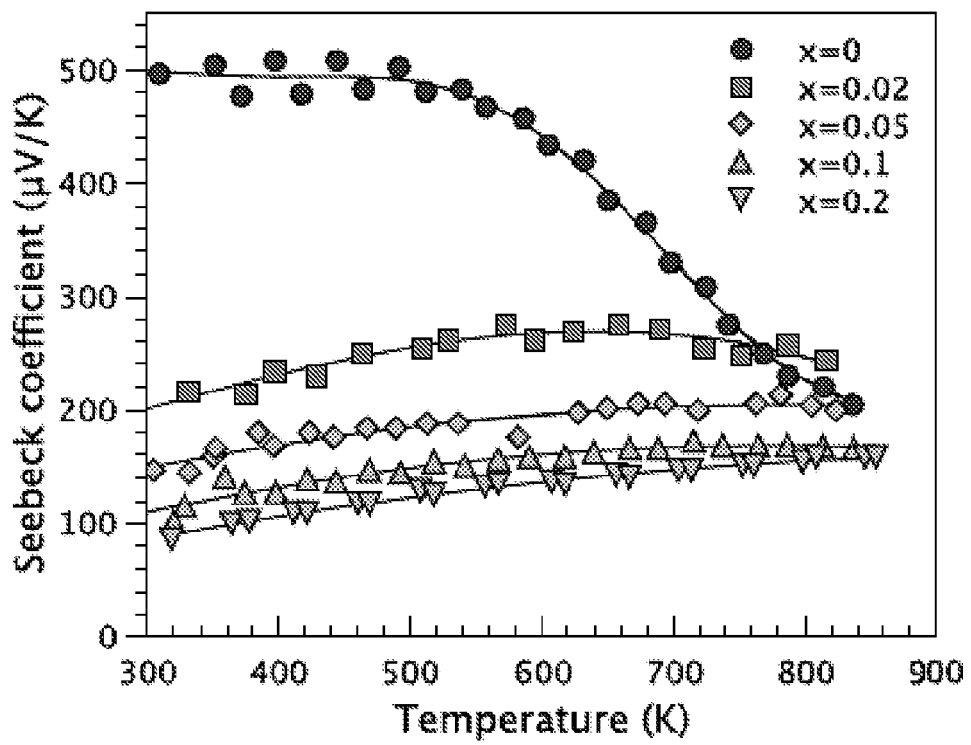
FIG. 38 demonstrates, in accordance with an embodiment of the invention, high temperature Seebeck coefficients of $Ca_5In_{2-x}Zn_xSb_6$ display increasingly linear behavior and decreased magnitude with increased Zn concentration.

Consistent with the inventors understanding of Ca$_5$In$_2$Sb$_6$ as an undoped, narrow-band gap semiconductor, undoped material has a large, positive Seebeck coefficient, which decreases with temperature due to thermally activated of minority carriers (FIG. 38). With doping, the transition from non-degenerate to degenerate behavior leads to a decrease in the magnitude of the Seebeck coefficients, as well as a more linear temperature dependence. The temperature and magnitude at which the Seebeck coefficient "rolls over" can be used as an additional tool (E$_g$=2 e α$_{max}$ T$_{max}$) to estimate the thermal band gap. This estimate suggests that Ca$_5$In$_2$Sb$_6$ has a smaller band gap than Ca$_5$Al$_2$Sb$_6$, confirming the trend deduced from resistivity measurements. The smaller band gap in Ca$_5$In$_2$Sb$_6$ can be understood qualitatively in terms of the electronegativity difference between Al and In (1.61 and 1.78 respectively). Electronic structure calculations have shown that Al states dominate the conduction band edge in Ca$_5$Al$_2$Sb$_6$. Replacing Al with the more electronegative In decreases the energy of the anti-bonding states at the conduction band edge, reducing E$_g$.

Figure 39:
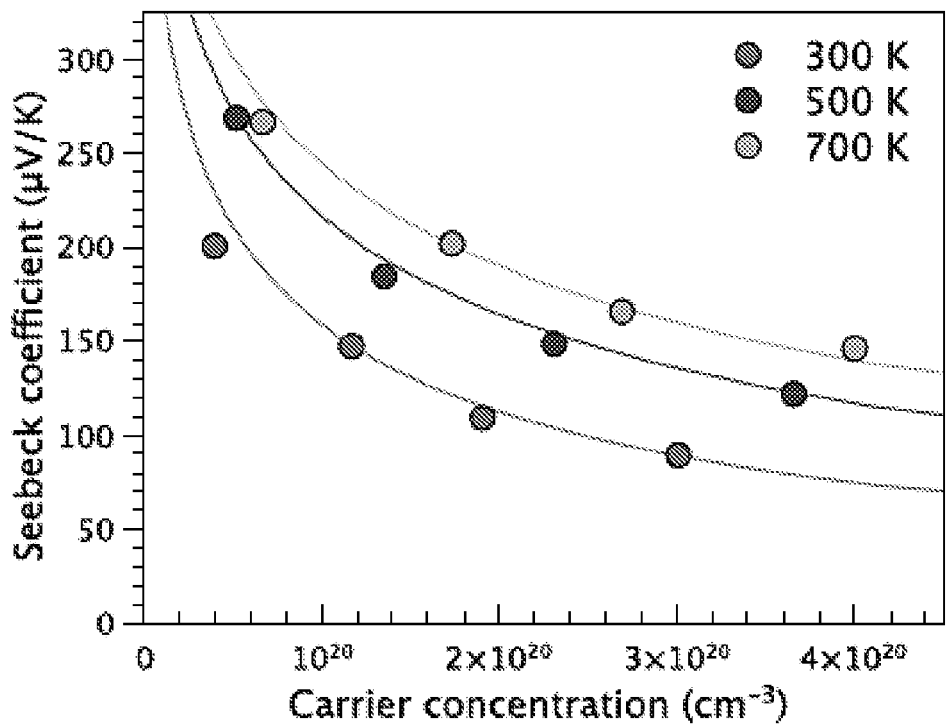
FIG. 39 demonstrates, in accordance with an embodiment of the invention, Seebeck coefficients decrease as a function of n predicted by a single parabolic band model (dashed curves). Effective masses of 2.0 $m_e$ (at 300 K and 500 K) and 1.8 $m_e$ (at 700 K) were calculated from the experimental α and n of the x=0.05 sample.

FIG. 39 illustrates the dependence of the Seebeck coefficient on n, which is determined by the geometry of the valence band. The solid curves show the predicted dependence at selected temperatures, assuming a parabolic valence band edge. This model utilizes classic solutions to the Boltzmann transport equations within the relaxation time approximation, and assumes that acoustic phonons are the dominant scattering source. A more complete description of this single parabolic band (SPB) model can be found in the following sources. In practice, the valence band edge of Ca$_5$In$_2$Sb$_6$ likely resembles that of Ca$_5$Al$_2$Sb$_6$, which is doubly degenerate at the Gamma point. The effective mass of Ca$_5$In$_2$Sb$_6$, as determined by an SPB model (2 m$_e$ at 300 and 500 K, and 1.8 m$_e$ at 700 K) is similar to that found in Ca$_5$Al$_2$Sb$_6$. This is intuitive, since the valence band edge is dominated by Sb states, and should not be significantly altered by the substitution of In for Al.

The calculated band structure of Ca$_5$Al$_2$Sb$_6$ suggests that significant deviations from parabolic should occur at energies corresponding to less than 5×10$^{20}$ h$^+$/cm$^3$, due both to additional bands and flattening of the bands contributing to transport. No deviations from the SPB model are observed within the investigated doping levels in Ca$_5$In$_{2-x}$Zn$_x$Sb$_6$, although if its valence band structure is similar to the Al analogue, beneficial effects may be realized at higher carrier concentrations.

Thermal Transport Properties

Due primarily to the complexity of its unit cell (26 atoms per cell), the lattice thermal conductivity in Ca$_5$Al$_2$Sb$_6$ approaches the minimum lattice thermal conductivity (~0.5 W/mK) at the temperature corresponding to it's maximum zT (~1000 K). While nanostructuring may reduce κ$_L$ at low temperatures in such materials by scattering long wavelength phonons, it is not expected to reduce the high temp κ$_L$ beyond the minimum lattice thermal conductivity. The most straightforward route to further reductions in κ$_L$ at high temperature is to reduce the speed of sound.

The speed of sound in a solid increases with a material's stiffness, and decreases with density according to equations 1 and 2. While the substitution of In for Al was motivated by the known difference in density, using speed of sound measurements, the inventors found that the stiffness also decreases upon substitution of the heavier In atoms. (Table 2). Thus, the observed 10% speed of sound reduction in Ca$_5$In$_2$Sb$_6$ is due to both increased density and decreased stiffness.

TABLE 2

|  | ρ g/cm$^2$ | G GPa | K GPa | v$_s$ m/s | v$_L$ m/s |
|---|---|---|---|---|---|
| Ca$_5$In$_2$Sb$_6$ | 4.90 | 22 | 38 | 2115 | 3710 |
| Ca$_5$Al$_2$Sb$_6$ | 4.31 | 26 | 41 | 2440 | 4170 |

TABLE 2-continued $$v_S = \sqrt{\frac{G}{d}}$$ Eq. 1

$$v_L = \sqrt{\frac{K + \frac{4}{3}G}{d}}$$ Eq. 2

Figure 40:
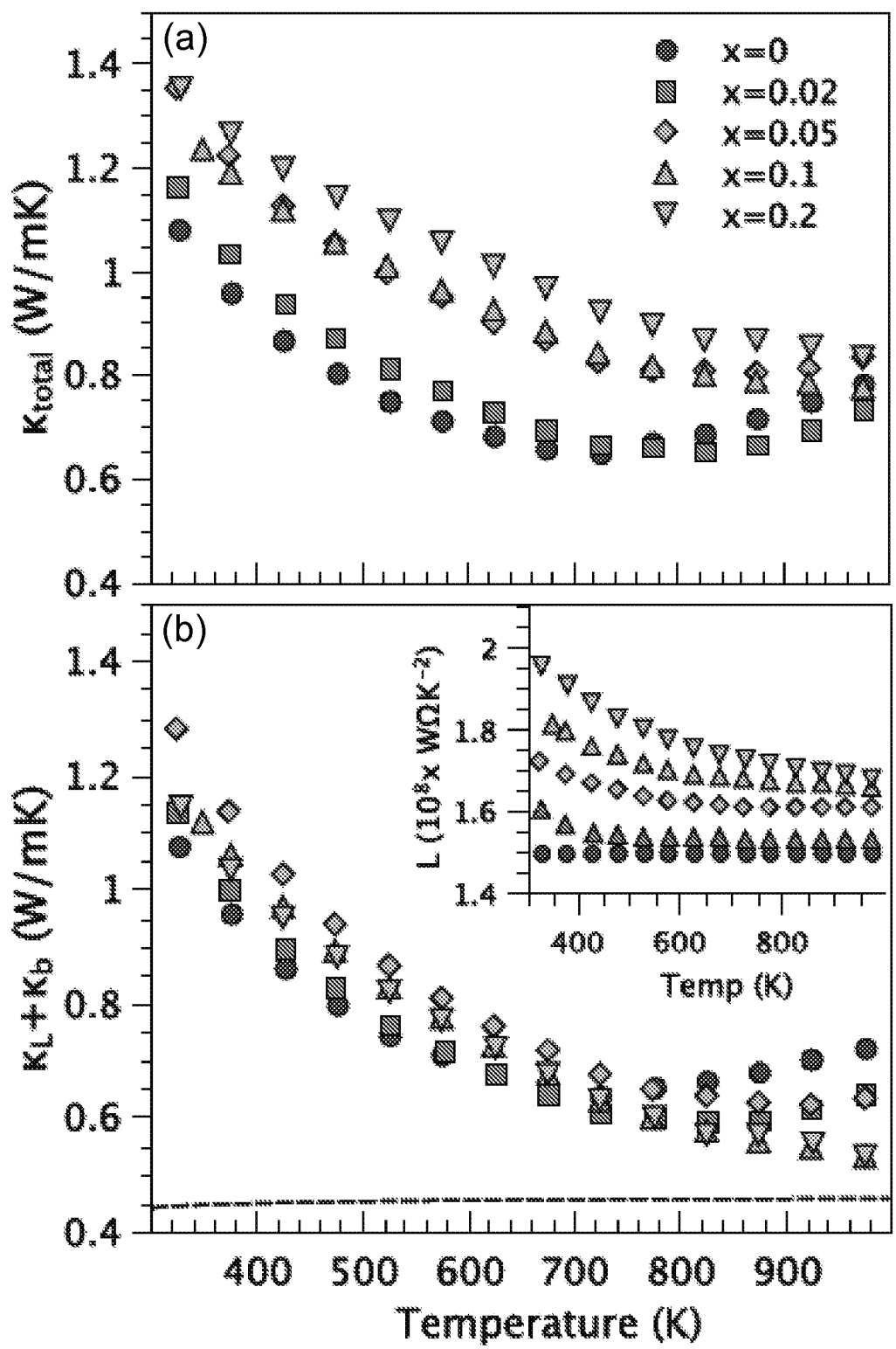
FIG. 40 demonstrates, in accordance with an embodiment of the invention, a) the total thermal conductivity and b) the combined lattice and bipolar thermal conductivity of $Ca_5In_{2-x}Zn_xSb_6$. The inset shows the temperature dependence of the Lorenz numbers in units of $10^8$ W/W K⁻², calculated using an SPB model.

The thermal conductivity (FIG. 40a) was calculated from thermal diffusivity (D) according to $\kappa = C_p D d$, where d is the geometric density, and $C_p$ is the Dulong Petit heat capacity. Although it is common to use the Dulong Petit value above $\Theta_D$, this usually leads to an underestimate of the true thermal conductivity, particularly at high temperatures. The electronic component of the thermal conductivity is estimated from the Wiedemann Franz relation ($\kappa_e = LT/\rho$), where the Lorenz number (L) is determined using the SPB model described above (Inset in FIG. 40b). At temperatures beyond the onset of minority carrier activation, the Lorenz numbers were determined by extrapolation. Subtracting the electronic contribution from $\kappa$ leaves both the lattice and bipolar terms, shown in FIG. 40b. In the undoped and lightly doped $Ca_5In_2Sb_6$, the bipolar term manifests itself as a rise in thermal conductivity at high temperatures. This occurs at lower temperatures and to a greater extent in $Ca_5In_2Sb_6$ than in $Ca_5In_2Sb_6$, further evidence that the band gap of the former is the narrower of the two. In the most heavily doped samples there is little evidence of a bipolar contribution. In these samples it can be seen that the lattice thermal conductivity is approaching the minimum lattice thermal conductivity of $Ca_5In_2Sb_6$, shown as the dashed curve in FIG. 40b. At 700 K, the difference in $\kappa_L$ between $Ca5In_{1.9}Zn_{0.1}Sb_6$ and $Ca_5Al_{1.9}Zn_{0.1}Sb_6$ is approximately 10%, consistent with the difference in their sound velocities.

Figure of Merit

Figure 41:
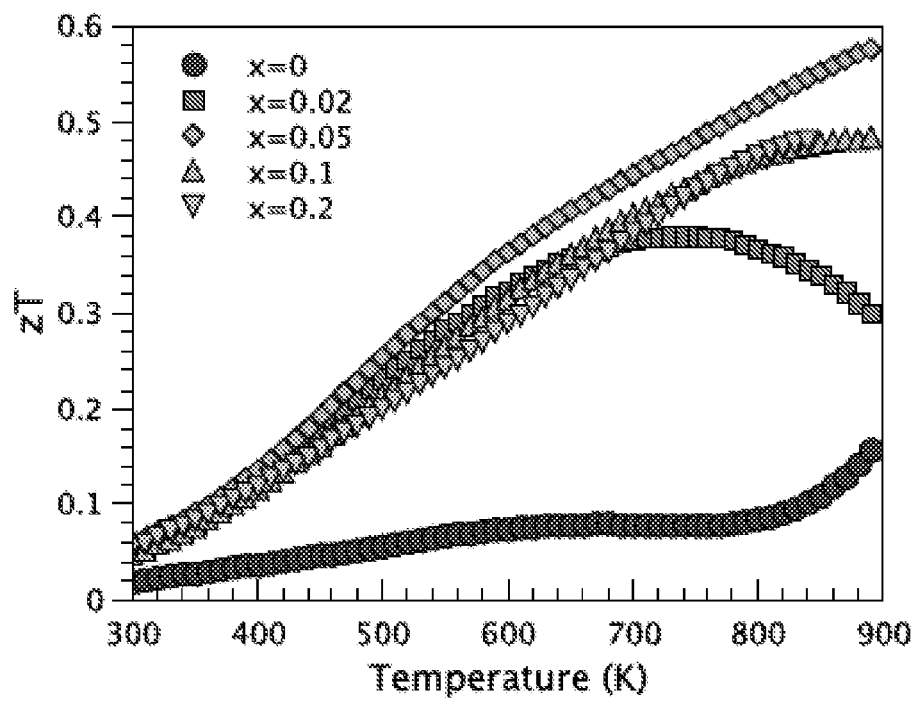
FIG. 41 demonstrates, in accordance with an embodiment of the invention, the figure of merit of $Ca_5In_{2-x}Zn_xSb_6$ samples is comparable to Na-doped $Ca_5Al_2Sb_6$ within the measured temperature range.
Figure 42:
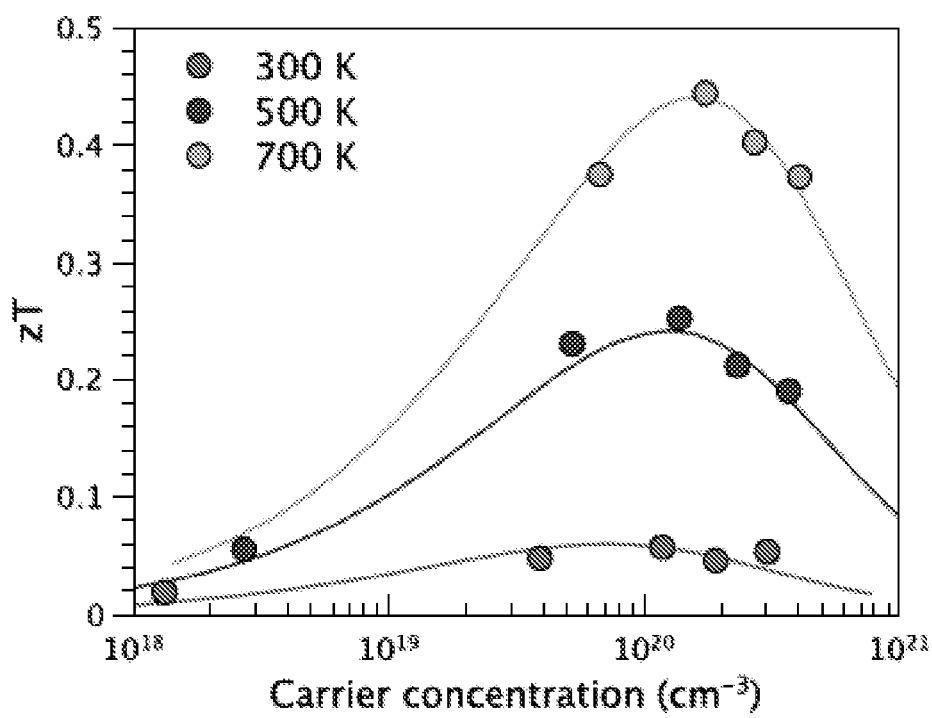
FIG. 42 demonstrates, in accordance with an embodiment of the invention, predicted by an SPB model, the figure of merit at 700 K is optimized at carrier concentrations in the low $10^{20,s}$.

The figure of merit of $Ca_5In_{2-x}Zn_xSb_6$ is shown as a function of temperature in FIG. 41. At 900 K, the maximum zT is slightly less than 0.6 in the x=0.05 sample. Although $Ca_5In_2Sb_6$ has higher mobility and lower lattice thermal conductivity than the Al analogue, ifs smaller band gap causes detrimental electronic and thermal effects, ultimately leading no improvement in the peak zT. To determine the optimal carrier concentrations required for maximum efficiency in $Ca_5In_2Sb_6$, the dependence of the Seebeck coefficient, mobility, and Lorenz number on n were calculated using the SPB model described above. From these, zT is obtained as a function of n at various temperatures, as shown by the solid curves in FIG. 42. The parameters used in this model were calculated from data obtained from the x=0.05 sample, and include the effective masses described in FIG. 39, $\kappa_L$ of 1.2, 0.9, and 0.7 W/mK, and intrinsic mobilities of 7.6, 6.9, and 5.3 cm$^2$/Vs at 300, 500 and 700 K, respectively. This model predicts an optimum carrier concentration in the low $10^{20}$'s at high temperature, in agreement with the inventors' experimental results. The undoped sample has not been included at 700 K, as the single band model does not account for minority carrier effects.

Conclusion

In Zn-doped $Ca_5In_2Sb_6$, both the speed of sound and minimum lattice thermal conductivity are found to be reduced relative to $Ca_5Al_2Sb_6$. $Ca_5In_2Sb_6$ analogue was also found to have superior electronic mobility. However, the band gap decreases upon substitution of In for Al, leading to a lower Seebeck coefficient at high temperatures, and a large bipolar contribution to the thermal conductivity. Doping $Ca_5In_2Sb_6$ with Zn allows for direct control of the transition from non-degenerate to degenerate semiconducting behavior, providing a route to carrier concentration optimization. Ultimately, a maximum zT of just under 0.6 was achieved at 900 K in optimally doped $Ca_5In_2Sb_6$.

Details: $Ca_5Ga_2Sb_6$

Preliminary results have been obtained on the thermoelectric properties of Zn-doped $Ca_5Ga_2Sb_6$. Synthesis of $Ca_5Ga_{2-x}Zn_xSb_6$ (x=0, 0.05, 0.1, 0.2, 0.3) samples was analogous to that described for $Ca_5In_2Sb_6$. However, samples begin to decompose at around 700 C, so transport measurements have only been performed to 600 C.

Figure 43:
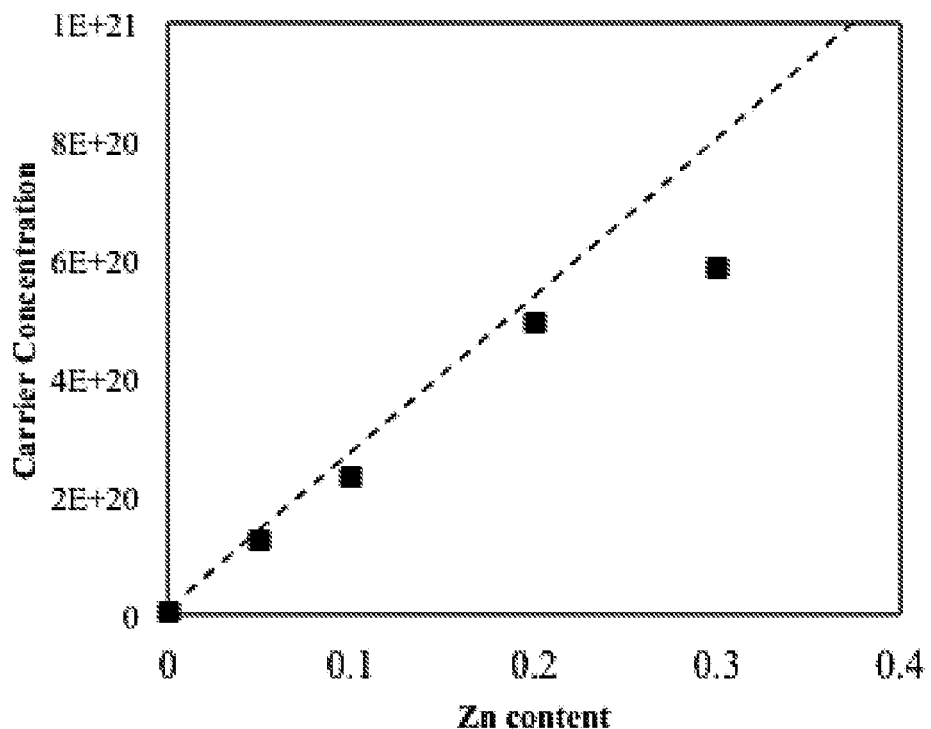
FIG. 43 demonstrates, in accordance with an embodiment of the invention, the carrier concentration in $Ca_5Ga_{2-x}Zn_xSb_6$ (x=0, 0.05, 0.1, 0.2, 0.3) increases monotonically with Zn content until x=0.2.

Undoped $Ca_5Ga_2Sb_6$ behaves as an intrinsic, small band gap semiconductor, with resistivity and Seebeck coefficient decreasing with temperature. As shown in FIG. 43, doping with Zn resulted in the predicted carrier concentration (dashed curve) up to x=0.2, beyond which the measured hole concentration was lower than predicted.

Figure 44:
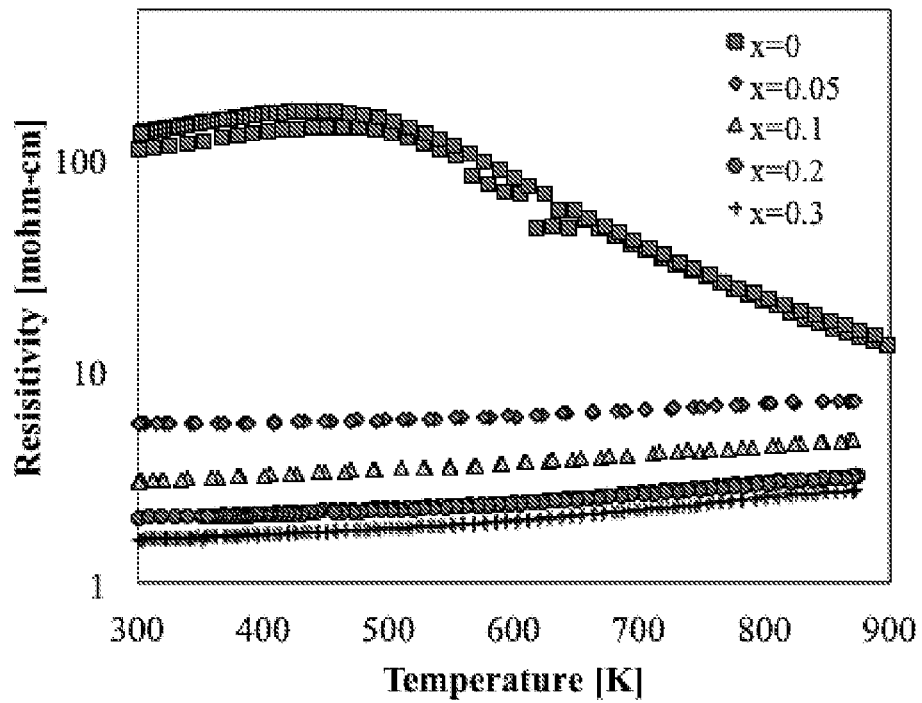
FIG. 44 demonstrates, in accordance with an embodiment of the invention, temperature dependence of resistivity transitions from insulating to metallic with increasing Zn content.
Figure 45:
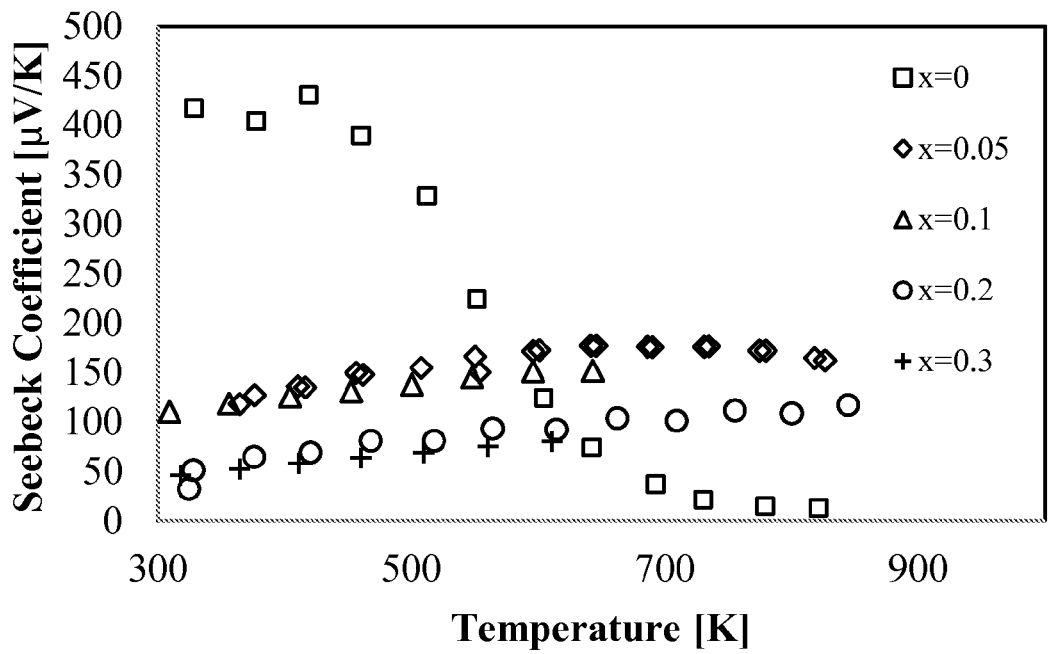
FIG. 45 demonstrates, in accordance with an embodiment of the invention, the Seebeck coefficient as a function of temperature.

With increasing Zn content, $Ca_5Ga_{2-x}Zn_xSb_6$ exhibits decreasing resistivity and Seebeck coefficients. The most heavily doped samples are degenerate semiconductors with linearly increasing Seebeck coefficients and resistivity. The resistivity of $Ca_5Ga_{2-x}Zn_xSb_6$ (x=0, 0.05, 0.1, 0.2, 0.3) is shown in FIG. 44 as a function of temperature. Seebeck coefficients are shown in FIG. 45 as a function of temperature.

Both the slope of the resistivity and the magnitude and temperature at which the Seebeck coefficient rolls over can be used to estimate the band gap of $Ca_5Ga_2Sb_6$. Both estimates predict a band gap that is smaller than that of both $Ca_5Al_2Sb_6$ and $Ca_5In_2Sb_6$.

Figure 46:
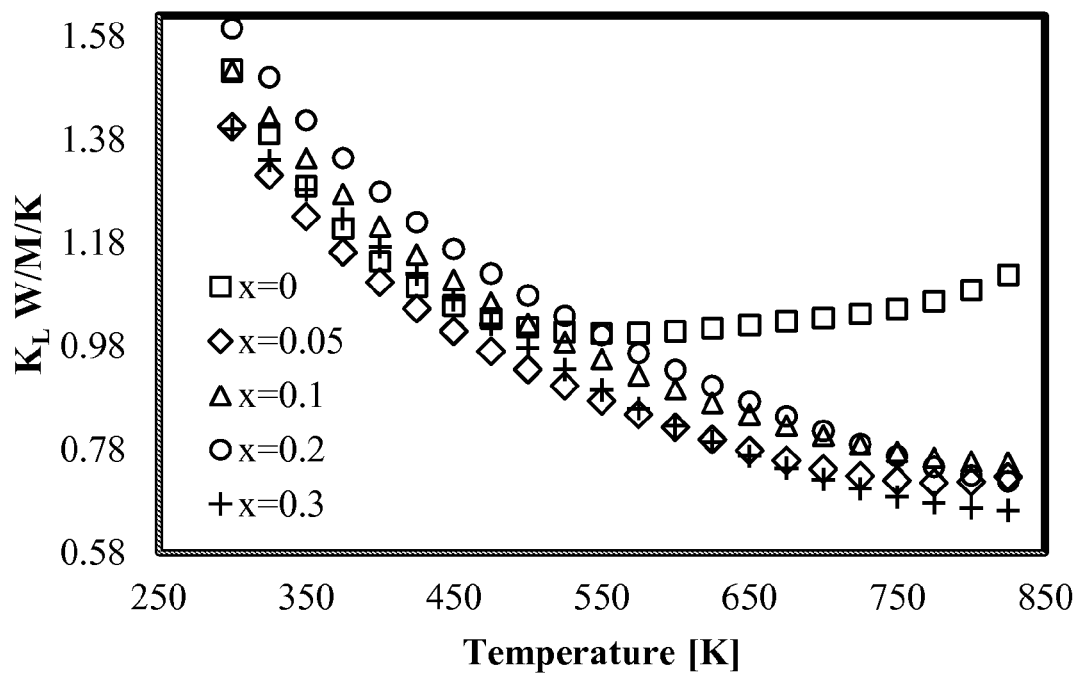
FIG. 46 demonstrates, in accordance with an embodiment of the invention, lattice thermal conductivity of $Ca_5Ga_{2-x}Zn_xSb_6$ (x=0, 0.05, 0.2).
Figure 47:
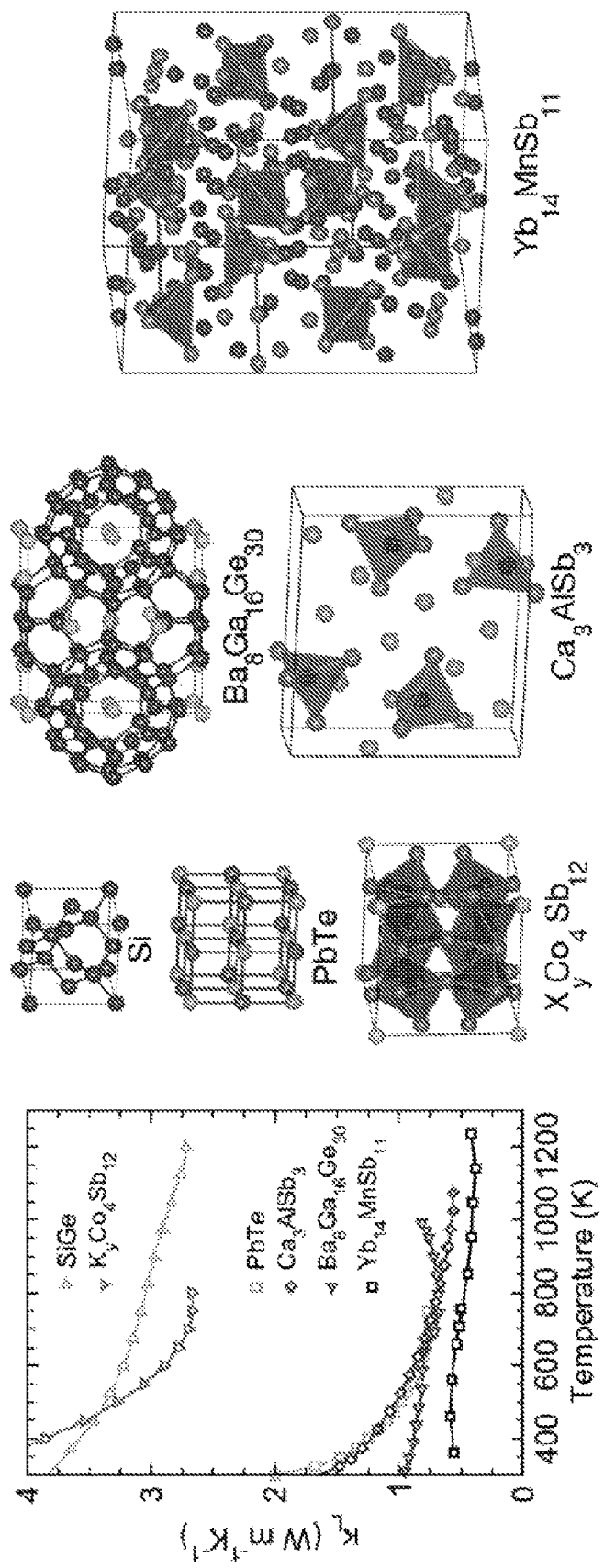
FIG. 47 demonstrates, in accordance with an embodiment of the invention, lattice thermal conductivities of bulk thermoelectric materials trend with both density and unit cell complexity. Zintl compounds $CA_3AlSb_3$ and $Yb_{14}AlSb_{11}$ have lattice thermal conductivities among the lowest reported lattice thermal conductivities in non-nanostructured materials.

The thermal conductivity was calculated from thermal diffusivity (D) according to $\kappa = C_p D d$, where d is the geometric density, and $C_p$ is the Dulong Petit heat capacity. The electronic component of the thermal conductivity is estimated from the Wiedemann Franz relation ($\kappa_e = LT/\rho$), where the Lorenz number (L) is determined using the SPB model described in the above Na-doped $Ca_5Al_2Sb_6$ section. Subtracting $\kappa_e$ from the total thermal conductivity gives the lattice thermal conductivity, $\kappa_L$, shown in FIG. 46. Preliminary results indicate that the lattice thermal conductivity of $Ca_5Ga_2Sb_6$ is similar to that found in $Ca_5Al_2Sb_6$. However, $Ca_5Ga_2Sb_6$ has a larger bipolar term, and does not reach its glassy minimum before beginning to decompose.

Example 11

Experiments II $Ca_3AlSb_3$: an Inexpensive, Non-Toxic Thermoelectric Material for Waste Heat Recovery Introduction The thermoelectric efficiency of a material is governed by its thermoelectric figure of merit, or zT ($zT = \alpha^2 T/\rho\kappa$). Therefore, a material suitable for thermoelectric applications must have a large Seebeck coefficient ($\alpha$), low resistivity ($\rho$) and low thermal conductivity ($\kappa$). This combination of properties is difficult to obtain due to the strongly coupled nature of $\alpha$, $\rho$, and the electronic component of $\kappa$ [1]. The lattice component of the thermal conductivity is generally considered to be the most decoupled property in zT, and is therefore often the focus of thermoelectric research. A trend between low lattice thermal conductivity and structural complexity has led to a particular interest in materials with complex crystal structures [2-4].

Widespread use of thermoelectric energy generation is limited both by low efficiency, and by the expense and toxicity of current thermoelectric materials (e.g. PbTe) [5]. Zintl compounds are a potential source of environmentally benign, inexpensive materials, due to the large variety of allowed chemical substitutions [2, 6, 7] and the Earth-abundance of some of the most common constituents. Zintl compounds are composed of electropositive cations that donate electrons to the more electronegative anions, which must in turn form covalent bonds to satisfy valence [8, 9]. The resulting mix of ionic and covalent bonding frequently leads to complex crystal structures with large unit cells. Good thermoelectric performance is generally found in heavily doped semiconductors with carrier concentrations on the order of $10^{19}$ to $10^{21}$ carriers/cm$^3$ [1]. It is therefore important to be able to control carrier concentration in Zintl compounds via doping. This has been successfully demonstrated in several Zintl antimonides including $Ca_5Al_2Sb_6$, and $Y13_{14}AlSb_{11}$, [10-13].

Figure 14:
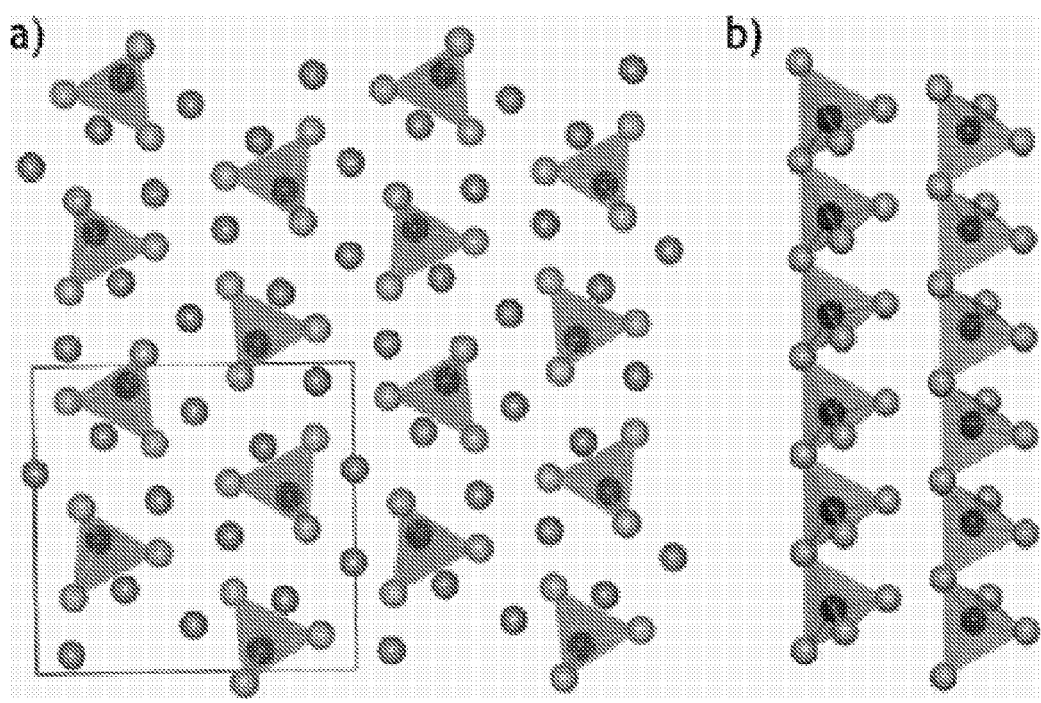
FIG. 14 demonstrates, in accordance with an embodiment of the invention, a) orthorhombic unit cell of $Ca_3AlSb_3$ (Space group Pnma) viewed in the [010] direction b) Infinite chains of corner sharing $AlSb_4$ tetrahedra.

Within the $A_3AlSb_3$ compounds (A=alkaline earth metals), two structure types are known; $Ca_3InP_3$ (Pnma) and $Ba_3AlSb_3$ (Cmca). $Ca_3AlSb_3$ forms in the $Ca_3InP_3$ structure type, composed of infinite chains of corner-sharing $AlSb_4$ tetrahedra (FIG. 14) [14]. In contrast, the $Ba_3AlSb_3$ structure type contains isolated pairs of edge-sharing $AlSb_4$ tetrahedra, yielding $Al_eSb_6$ anionic units [15, 16]. In both structure types, the A ions are situated between the tetrahedra moieties and provide overall charge balance.

Within the Zintl formalism, $Ca_3AlSb_3$ can be expressed as $Ca_3^{+2}Al_1^{-1}Sb_2^{-2}Sb_1^{-1}$, treating Al as part of the covalent anionic substructure. The aluminum atoms are bound to four antimony atoms, and therefore have an oxidation state of $-1$. Within the chains of $AlSb_4$ tetrahedra, the antimony atoms that are shared between two tetrahedra have two bonds and can be considered to have an oxidation state of $-1$. The remaining antimony have only one bond, corresponding to an oxidation state of $-2$. Situated between the chains are $Ca^{+2}$ ions, which provide overall charge balance. The formal oxidation states given here are a convenient construct, however, the actual extent of charge transfer is determined by electronegativity and the degree of ionic or covalent bonding. Treating Al as a cation yields the same conclusion; namely, $Ca_3AlSb_3$ is charge balanced.

Inspired by previous investigation of the thermoelectric properties of sodium-doped $Ca_5Al_2Sb_6$ [13], this work focuses on the high temperature thermal and electronic properties of $Ca_{3-x}Na_xAlSb_3$ (x=0, 0.03, 0.06, and 0.15). In addition to transport measurements, this study employs a combination of classic transport theory and electronic structure calculations to improve understanding of the relationship between chemical bonding and transport in $Ca_3AlSb_3$. The structure of $Ca_3AlSb_3$ is similar to $Ca_5Al_2Sb_6$ in that both are composed of infinite parallel chains of $AlSb_4$ tetrahedra. Compared with $Ca_3AlSb_3$, the relative deficiency of Ca in $Ca_5Al_2Sb_6$ leads to fewer electrons, therefore requiring covalent Sb—Sb bonds to fulfill valance balance. These additional bonds link the parallel chain moieties together, resulting in ladder-like structures, in contrast to the isolated chains of $Ca_3AlSb_3$. Beyond $Ca_3AlSb_3$ and $Ca_5Al_2Sb_6$, a variety of structure types with distinct tetrahedra moieties exist within the $A_3MPn_3$ and $A_5M_2Pn_6$ compounds, offering further opportunities for developing structure-property relationships in Zintl compounds [8, 9, 17].

Example 12

Synthesis

Bulk, polycrystalline $Ca_{3-x}Na_xAlSb_3$ (x=0, 0.03, 0.06, 0.15) samples were prepared by ball milling followed by hot pressing. Starting with 99.99% pure Ca dendrites from Sigma-Aldrich, and from Alpha Aesar: 99.95% Na chunks, 99% Al shot, and 99.5% Sb lumps, the elements were loaded into stainless-steel vials with stainless-steel balls in an argon-filled glove box. The reagents were milled for 90 minutes using a SPEX Sample Prep 8000 Series Mixer/Mill. The resulting fine powder was hot pressed in high density graphite dies (POCO) using 1.2 tons of force on a 12 mm diameter surface. A maximum temperature of 973 K for two hours in argon was used during hot pressing, followed by a stress-free anneal at 873 K and a three hour cool down under vacuum. Care was taken in every step to avoid oxidation of the powder.

Example 13

Characterization

The polycrystalline ingots resulting from hot pressing were sliced into disks 1 mm thick and 12 mm in diameter. X-ray diffraction (XRD) measurements were performed on polished slices using a Philips XPERT MPD diffractometer operated at 45 kV and 40 mA, and Rietveld analysis was performed using Philips X'Pert Plus software. XRD analysis and scanning electron microscopy using a Zeiss 1550 VP SEM was used to determine phase purity. Microprobe analysis with wavelength dispersive spectroscopy (WDS) using a JEOL JXA-8200 system was used to determine sodium content. Elemental Al and Sb, $NaAlSi_3O_8$, and $CaAl_2Si_2O_8$ were used for the Al, Sb, Na, and Ca standards, respectively. The high temperature electronic properties were characterized to 1073 K under dynamic vacuum at the Jet Propulsion Laboratory; electrical resistivity was determined using the Van der Pauw technique, and the Hall coefficient was measured with a 1.0 T field and pressure-assisted contacts. Details of the Seebeck coefficient measurements can be found in ref. [19]. A Netzsch LFA 457 was used to measure thermal diffusivity to 1073 K and the heat capacity was estimated using the method of Dulong-Petit.

Example 14

Electronic Structure Calculations

Electronic structure calculations were performed in the Vienna Ab-initio Simulation Package (VASP) [20, 21]. For the exchange and correlation the Perdew-Burke-Enzerhof generalized gradient approximation (PBE-GGA) [22] functional was used in the projector augmented-wave (PAW) formalism [23]. The experimental lattice constants and atom positions reported by Cordier et al. were used as input [14]. A k-point grid of 5×15×5 and an energy cutoff of 450 eV were necessary to converge the total energy to within a few meV.

In addition to the density of states and band structure, the inventors present real-space analysis of the bonds in the structure. The electron density difference (EDD) employed here is the difference between the electron density of the crystal and the overlapping, non-bonding, atomic electron densities (procrystal) [24]. The procrystal electron density is obtained by super-position of the electron density of the respective atoms in vacuum. For both the crystal and the procrystal, all-electron densities were regenerated after the initial run.

Example 15

Results and Discussion

Figure 15:
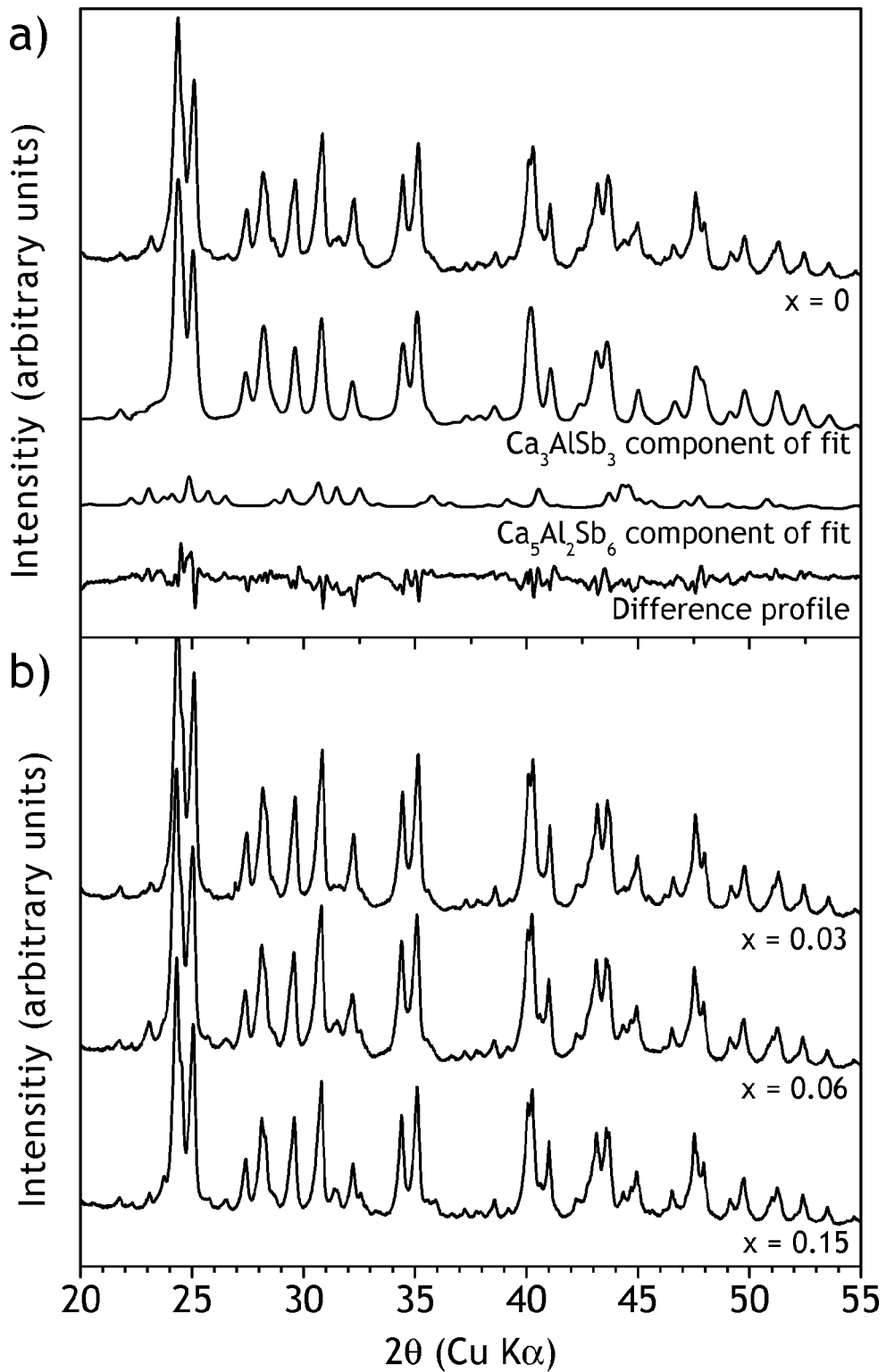
FIG. 15 demonstrates, in accordance with an embodiment of the invention, a) XRD pattern of x=0 sample and Rietveld fit using known crystal structures of $Ca_3AlSb_3$ and $Ca_5Al_2Sb_6$ [14, 18]. b) Similar amounts of $Ca_5Al_2Sb_6$ impurity phase are observed in all sodium doped samples FIG. 16 demonstrates, in accordance with an embodiment of the invention, scanning electron micrographs of a) polished and b) fractured surfaces of the x=0.06 sample reveal high density material and approximately 1 μm diameter grains. Black dots in (a) are voids revealed by polishing.

Ball milling of elemental reagents followed by hot pressing resulted in samples with densities in excess of 95%. X-ray diffraction (XRD) patterns of each polycrystalline sample (x=0, 0.03, 0.06, 0.15) are shown in FIG. 15. As the ionic radii of $Na^{+1}$ and $Ca^{+2}$ are nearly identical, no change in lattice parameter is expected from doping. XRD patterns were subject to Rietveld refinement using the known structures of $Ca_3AlSb_3$ and $Ca_5Al_2Sb_6$. FIG. 15a shows the $Ca_3AlSb_3$ and $Ca_5Al_2Sb_6$ components of the Rietveld fit for the x=0 sample, as well as a difference profile. All compositions were found to contain approximately 10 wt. % of the closely related $Ca_5Al_2Sb_6$ phase, possibly due to inadvertent Ca deficiency. Cordier et al. have also reported $Ca_5Al_2Sb_6$ as a secondary phase in their efforts to synthesize pure $Ca_3AlSb_3$ [14].

Figure 16:
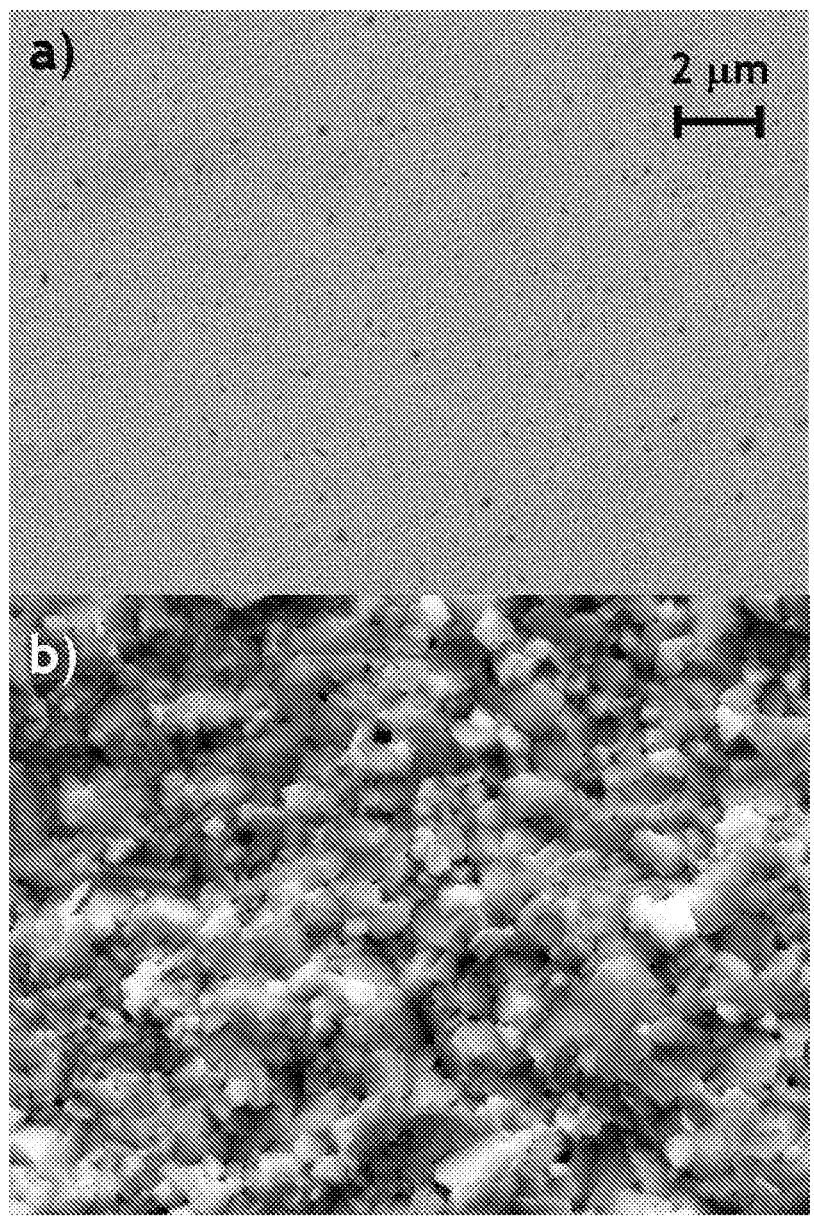

SEM images of polished and fracture surfaces of the x=0.06 sample are shown in FIG. 16. Scanning electron microscopy confirms the high density of the samples and reveals grains with diameters of approximately 1 μm. The small grain size may be due to the presence of $Ca_5Al_2Sb_6$ impurity phase pinning grain boundaries during growth or the relatively low hot-pressing temperature (973 K).

Figure 17:
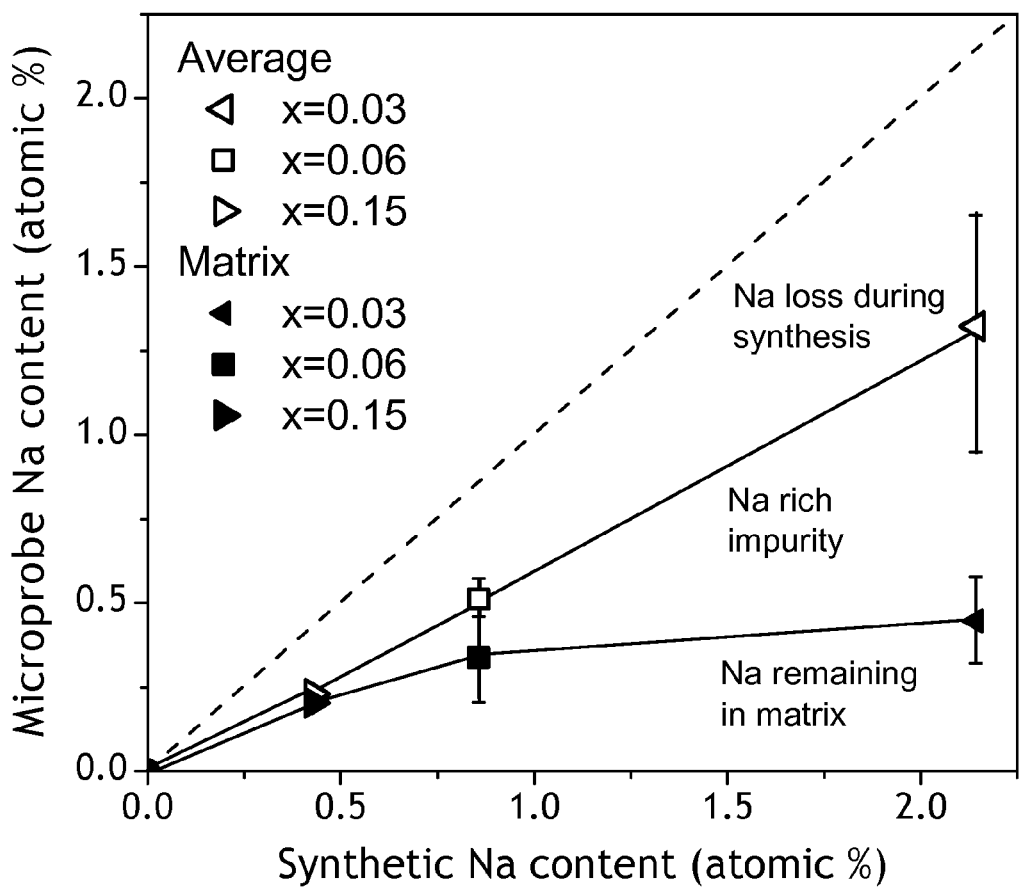
FIG. 17 demonstrates, in accordance with an embodiment of the invention, microprobe analysis suggests that some sodium loss occurs during synthesis, and that the solubility limit of sodium in $Ca_{3-x}Na_xAlSb_3$ is exceeded for x>0.06 (0.8 atomic %). Filled symbols indicate Na content of the matrix phases ($Ca_3AlSb_3$ and $Ca_5Al_2Sb_6$), while unfilled symbols represent total Na concentration, including the sodium rich impurity phase.

Microprobe analysis with wavelength dispersive spectroscopy (WDS) was used to identify impurity phases and to determine the average sodium content of each sample. WDS confirmed the presence of approximately 10 volume % of the $Ca_5Al_2Sb_6$ impurity phase in all samples, while also revealing a sodium-rich impurity phase in the x=0.15 sample. Where present, both impurity phases appear as approximately 1 μm grains, evenly distributed within the $Ca_3AlSb_3$ majority phase. FIG. 17 shows the concentration of sodium obtained from WDS versus synthetic sodium content. The unfilled symbols represent the average sodium concentration of each sample (including both impurity phases), obtained using a spot size of 30 μm averaged over 25 points on each sample. The deviation of the average sample sodium content from expected composition is attributed to sodium loss during synthesis. The filled symbols show the sodium content of the matrix, which consists of the $Ca_3AlSb_3$ and $Ca_5Al_2Sb_6$ phases. The large discrepancy between the average and matrix sodium concentration for the x=0.15 sample is due to the formation of the sodium rich impurity phase which makes an estimated 5 to 10 volume % of the sample. The formation of this phase suggests that the solubility limit of sodium in $Ca_3AlSb_3$ has been reached, and that a different dopant will be necessary to reach higher carrier concentrations.

Electronic Transport Properties

Figure 18:
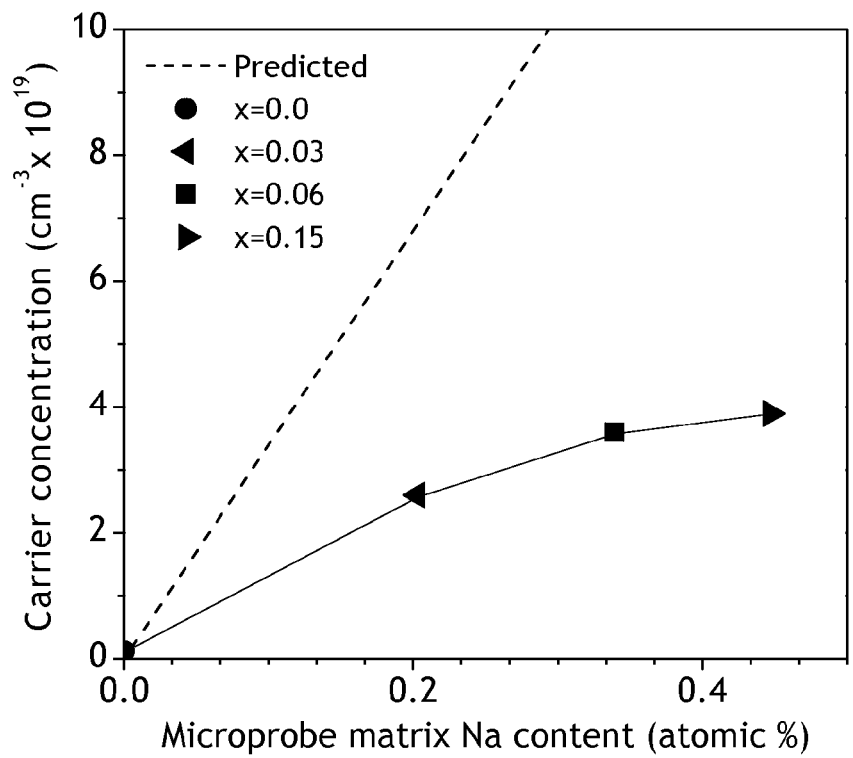
FIG. 18 demonstrates, in accordance with an embodiment of the invention, Hall carrier concentration (300 K) increases as a function of sodium content, although doping effectiveness is less than predicted by charge counting.

From the Zintl valence-counting formalism, nominally undoped $Ca_3AlSb_3$ is expected to be an intrinsic semiconductor. In practice, extrinsic defects lead to a measured Hall carrier concentration ($n_H = 1/R_H e$) of $10^{18}$ h+/cm$^3$ at room temperature. The room temperature $n_H$ versus microprobe sodium content is shown in FIG. 18. The carrier concentration expected from simple charge counting, assuming that each sodium atom contributes one free hole, is shown as a dashed line. Comparing the measured carrier concentrations to those predicted from charge counting, one finds that the experimental $n_H$ is significantly less than predicted. This is analogous to the low doping effectiveness observed in sodium doped $Ca_5Al_2Sb_6$ [13].

Figure 19:
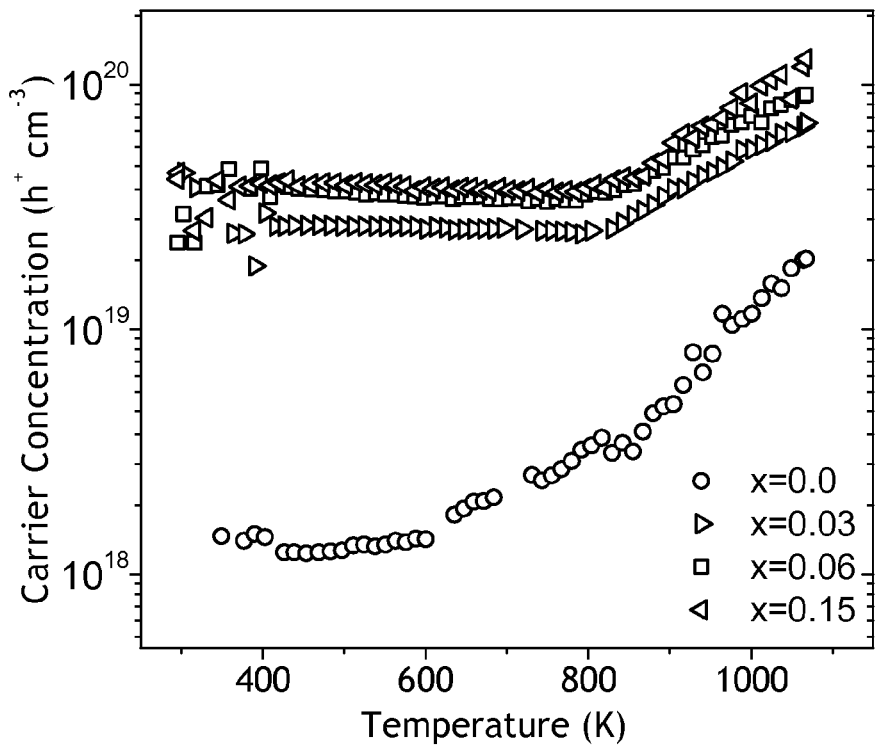
FIG. 19 demonstrates, in accordance with an embodiment of the invention, Hall carrier concentration of $Ca_{3-x}Na_xAlSb_3$ as a function of temperature. Doped samples exhibit extrinsic behavior to 800 K.

FIG. 19 illustrates the temperature dependence of $n_H$. Nominally undoped. $Ca_3AlSb_3$ exhibits increasing carrier concentration due to carrier activation beginning at 500 K. For the sodium doped samples, $n_H$ remains constant with temperature to approximately 800 K, indicative of extrinsic doping. The abrupt increase in carrier concentration beyond 800 K may be due to activation of minority carriers across the band gap, an increase in majority carrier concentration due to dopant solubility variation, or a phase change.

Figure 20:
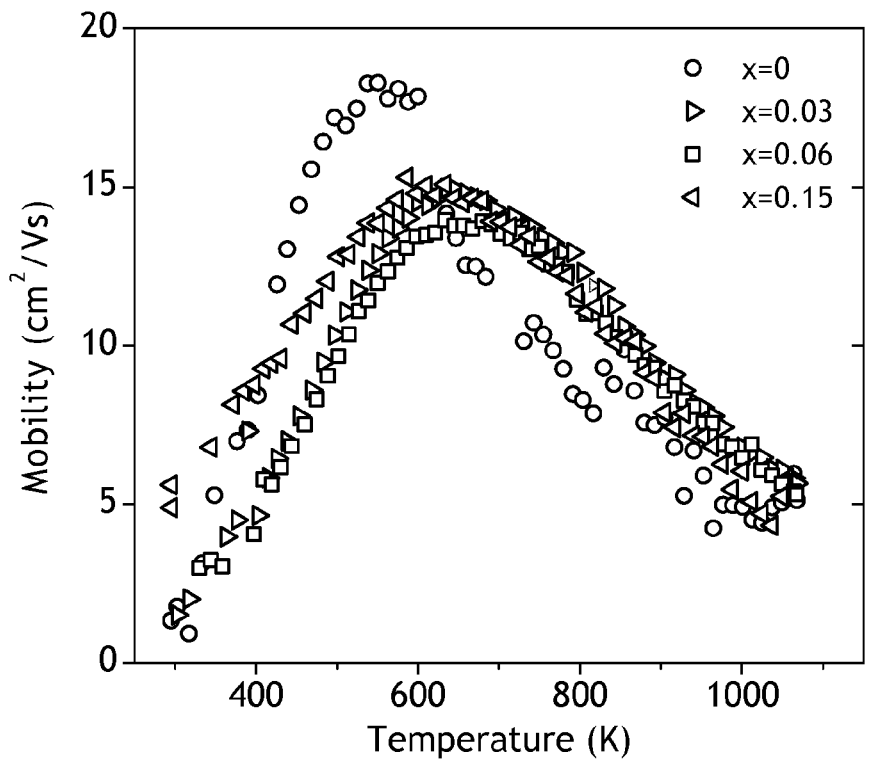
FIG. 20 demonstrates, in accordance with an embodiment of the invention, temperature dependence of Hall mobility in $Ca_{3-x}Na_xAlSb_3$ suggests an activated mobility at low temperature, and a mobility limited by phonon scattering at high temperature.

The Hall mobility as a function of temperature, calculated from measured $R_H$ and resistivity (ρ), is shown in FIG. 20. Matthiessen's rule approximates electronic mobility as the reciprocal sum of multiple mobility terms, each having an independent scattering mechanism $$\left( \frac{1}{\mu} = \sum_i \frac{1}{\mu i} \right).$$

Generally, one scattering mechanism limits the total mobility at extreme temperature ranges. In $Ca_3AlSb_3$, the mobility increases with temperature up to 600 K, possibly due to activation barriers such as oxide layers at the grain boundaries. Such an activated mobility would exhibit an exponential temperature dependence ($\mu = \mu_o e^{E_A/\kappa K_b T}$).

At high temperatures, mobility is generally limited by acoustic phonon scattering, for which the temperature dependence is given by the power law, $\mu_H \propto T^v$, where v is 1.5 for nondegenerate semiconductors and 1 for degenerate semiconductors [25]. A power law fit to the high temperature mobility data shown in FIG. 20 results in an exponent larger than 1.5. This may be related to the abrupt increase in carrier concentration above 800 K observed in FIG. 19, or a temperature dependent effective mass.

Figure 21:
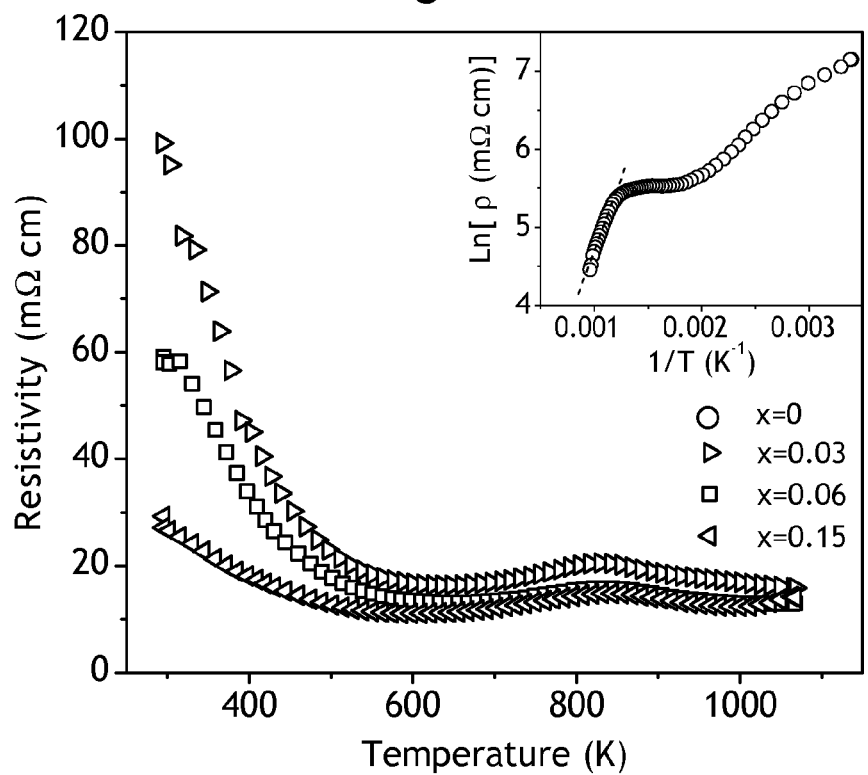
FIG. 21 demonstrates, in accordance with an embodiment of the invention, resistivity of $Ca_{3-x}Na_xAlSb_3$ as a function of temperature for heavily doped samples x=0.03, 0.06, 0.15. Inset: Ln[ρ] versus 1/T for x=0 sample. The high temperature linear fit results in a band gap of 0.6 eV using $\rho \propto e^{E_g/2\kappa_b T}$.

The temperature dependence of the resistivity (FIG. 21) follows from the carrier concentration and mobility (ρ=1/neμ). At high temperature, the resistivity of the nominally undoped sample exhibits an exponential decrease due to carrier activation across a band gap (FIG. 21, inset). A band gap of ~0.6 eV was estimated from the slope of the resistivity in this presumably intrinsic high temperature regime ($\rho \propto e^{E_g/2\kappa T}$).) This is similar to the band gap observed in both $Yb_{14}AlSb_{11}$ (0.5 eV) and in $Ca_5Al_2Sb_6$ (0.5 eV). Doping $Ca_3AlSb_3$ with sodium results in reduced resistivity due to increased carrier concentration. For the undoped and doped compositions, the negative slope of the resistivity at low temperatures is due to the increasing mobility in that temperature range. From 600-800 K, the resistivities of the sodium doped samples begin to increase with temperature as is expected for a degenerate semiconductor with mobility limited by phonon scattering. However, above 800 K, this trend is reversed, and the resistivity begins to decrease again due to the carrier activation discussed above.

Figure 22:
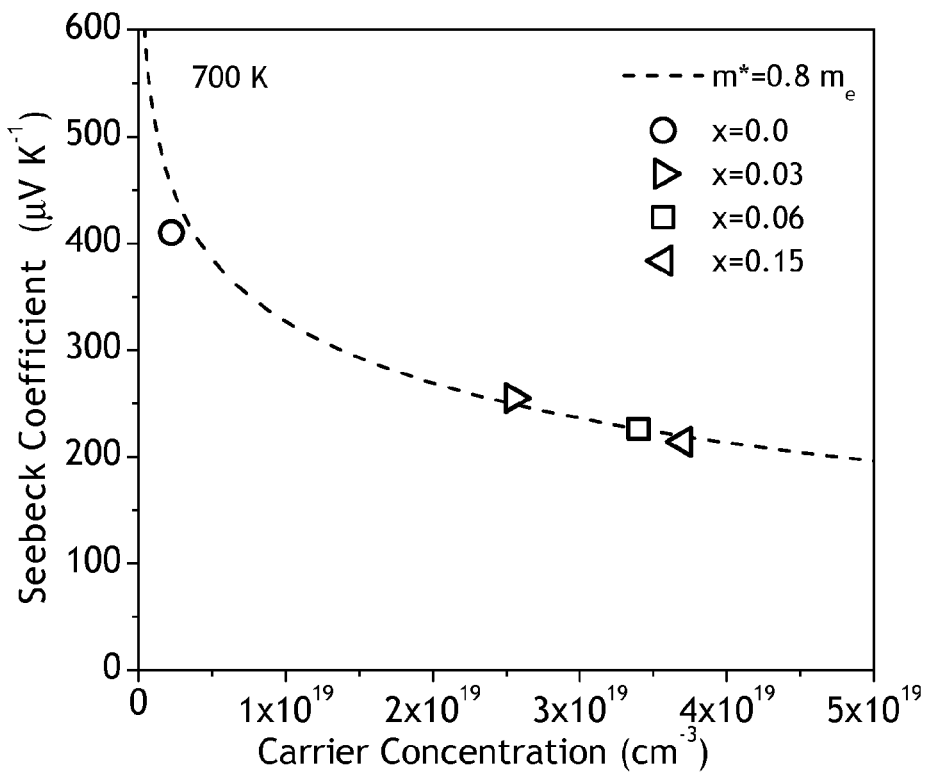
FIG. 22 demonstrates, in accordance with an embodiment of the invention, experimental Seebeck coefficients of $Ca_{3-x}Na_xAlSb_3$ as a function of carrier concentration. The dotted line was generated using a single parabolic band approximation and an effective mass of 0.8 m$_e$.

FIG. 22 illustrates the effect of doping on the Seebeck coefficients measured at 700 K. The Seebeck coefficients are large and positive, consistent with the relatively low carrier concentrations revealed by Hall effect measurements. As expected, increasing carrier concentration leads to a decrease in Seebeck coefficient. Solutions to the Boltzmann transport equation within the relaxation time approximation have been used to model the relationship between carrier concentration and the Seebeck coefficient via the reduced chemical potential, η (Equations 1 and 2).[26, 27] The full expression for the Fermi integral, $F_j(\eta)$ is given in equation 3, where ζ is the reduced carrier energy. Here, it is assumed a single carrier type is dominant, allowing use of a single parabolic band (SPB) model, and it is assumed λ=0 (acoustic phonon scattering).

$$\alpha = \frac{\kappa}{e} \left( \frac{(2+\lambda)F_{1+\lambda}(\eta)}{(1+\lambda)F_\lambda(\eta)} - \eta \right) \quad (1)$$

$$n = 4\pi \left(\frac{2m*k_bT}{h^2}\right)^{3/2} F_{1/2}(\eta) \quad (2)$$

$$F_j(\eta) = \int_0^\infty \frac{\zeta^j d\zeta}{1 + \text{Exp}[\zeta - \eta]} \quad (3)$$

This model was employed at 700 K because in this temperature regime acoustic phonon scattering becomes the dominant scattering mechanism, and extrinsic carriers still dominate electronic transport. An effective mass of 0.8 $m_e$ was calculated for this temperature using the measured α and $n_H$ from the x=0.06 sample in equations 1-3. This effective mass was used to generate a Pisarenko curve at 700 K, shown as the dashed line in FIG. 22. All of the samples fall on or near this curve, suggesting that the effective mass remains fairly constant within this carrier concentration range.

Figure 23:
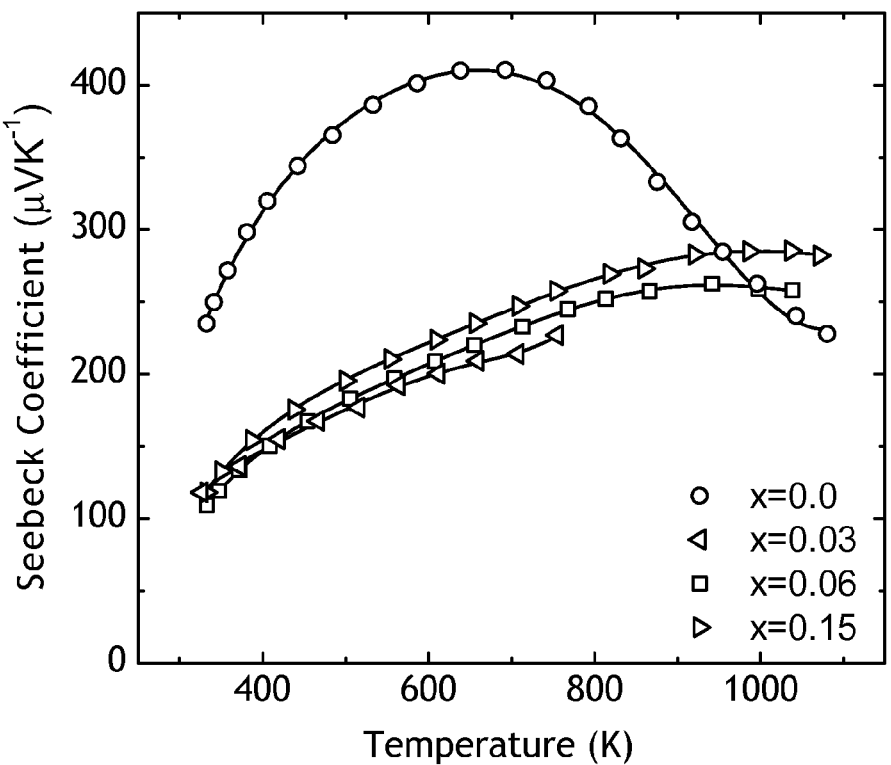
FIG. 23 demonstrates, in accordance with an embodiment of the invention, high temperature Seebeck coefficients of $Ca_{3-x}Na_xAlSb_3$ show degenerate behavior for the extrinsically doped, p-type compositions.

The trends in Seebeck coefficient as a function of temperature are shown in FIG. 23. The Seebeck coefficient of the nominally undoped sample peaks at 650 K, at which point thermally activated electrons cause a reduction in thermoelectric voltage, and a decaying Seebeck coefficient results. Samples with x=0.03-0.15 exhibit increasing Seebeck coefficients to high temperature, as expected for extrinsic semiconductors. At 1000 K, the x=0.06 sample appears to peak at 260 μV/K. From this, a band gap of 0.5 eV is estimated using $E_g = 2e\alpha_{max}T_{max}$ [28].

Electronic Structure Calculations

Figure 24:
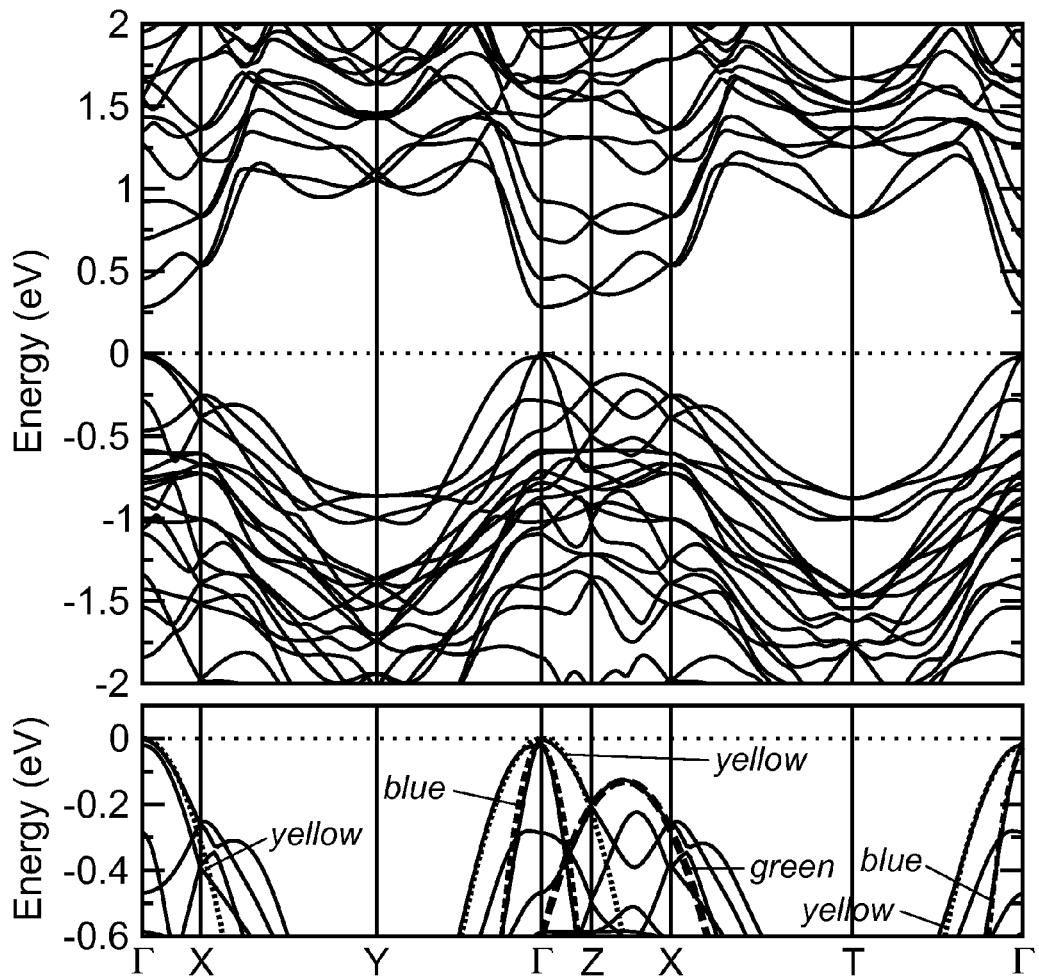
FIG. 24 demonstrates, in accordance with an embodiment of the invention, top panel: Calculated band structure of $Ca_3AlSb_3$. Bottom panel: Magnified band structure at the top of the valence band. The highest carrier concentration obtained experimentally corresponds to ~0.1 eV below the valence band edge. The blue, yellow, and green dashed curves are parabolas with effective masses of 0.15, 0.75, and 0.9 $m_e$.

Density functional theory calculations (DFT) are used here to gain a better understanding of electronic behavior in this compound and to guide chemical strategies for further optimization. The band structure of $Ca_3AlSb_3$ is shown in the top panel of FIG. 24, while the bottom panel displays only the top of the valence band. Centered at the Γ point, the valence band edge contains two asymmetric, overlapping bands which give the appearance of nested, parabolic light and heavy bands, as well as an offset band with a maximum at −0.13 eV. Parabolic fits are used to estimate the band masses of the effective light and heavy bands, as well as the offset band. The blue, yellow and green curves in the bottom panel of FIG. 24 are parabolas with effective masses of 0.15, 0.75, and 0.9 $m_e$ respectively. The most heavily doped sample in this study has a carrier concentration of $4\times10^{19}$ h$^+$/cm$^3$, corresponding to a Fermi level of approximately ~0.1 eV below the valence band edge. This suggests that the doped samples in this study have energies spanning the three highlighted bands at the top of the valence band. The electronic transport data reported here is reasonably well described by a single parabolic band model (FIG. 22). However, from FIG. 24, one might expect to observe a carrier concentration dependent effective mass. In particular, by doping to higher carrier concentrations (>5× $10^{19}$ h$^+$/cm$^3$) to probe deeper into the valence band, a larger effective mass and non-SPB behavior may result, due to the ever-increasing influence of the offset band (highlighted by the green curve in FIG. 24). This would be similar to the off-set band behavior observed in $La_3Te_4$ [29].

Figure 25:
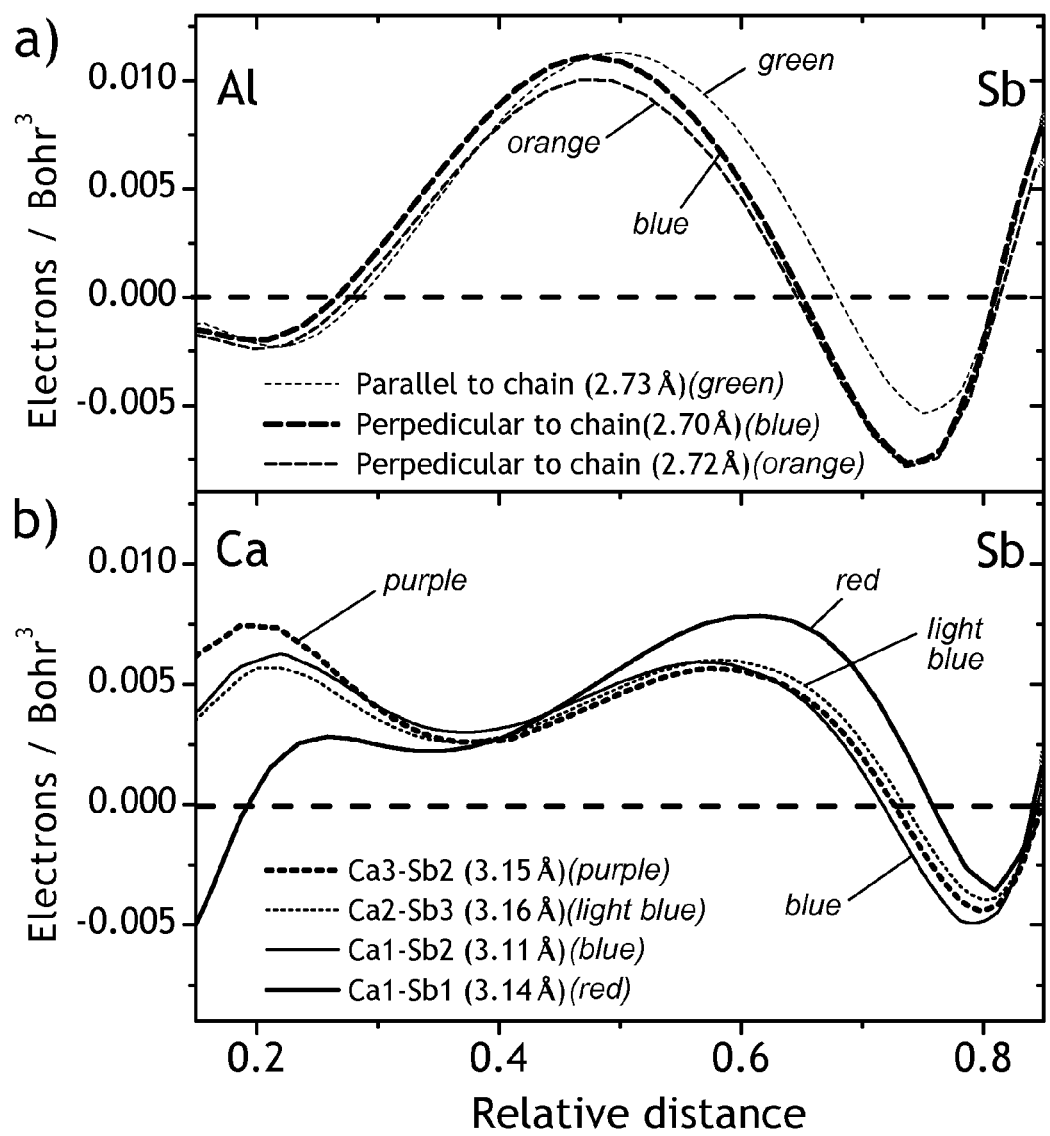
FIG. 25 demonstrates, in accordance with an embodiment of the invention, a) EDD line-scans show charge accumulation and depletion along a chain-forming Al—Sb bond (green), and two distinct Al—Sb bonds perpendicular to the chains (blue and orange). b) Representative Ca—Sb bonds (site designations correspond to ref. [14]).
Figure 26:
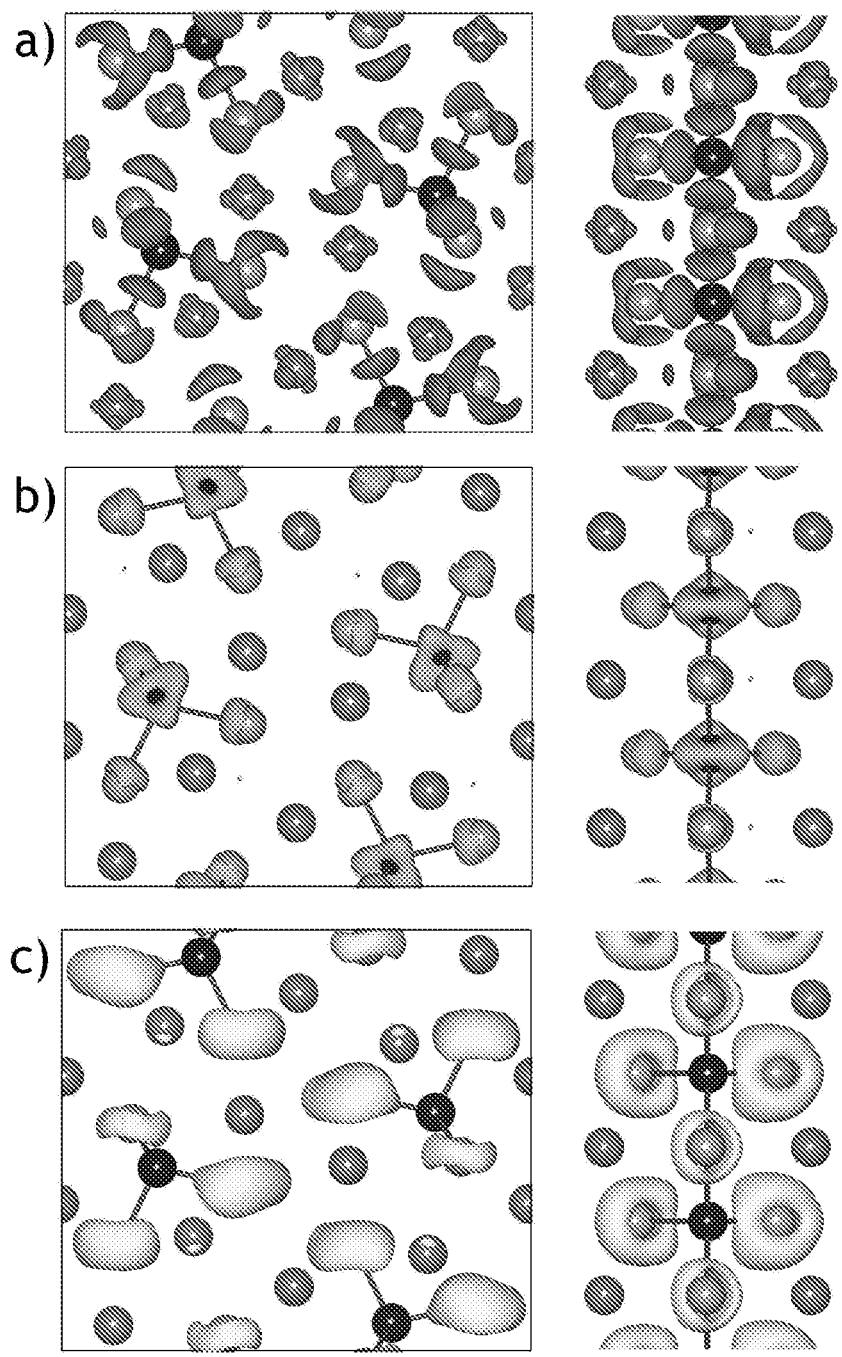
FIG. 26 demonstrates, in accordance with an embodiment of the invention, EDD isosurfaces show a) accumulation b) and depletion regions. c) Electron density map of valence band edge (−0.1 eV). Images are projections along [010] (left side) and [201] (right side) directions.

The traditional quantum mechanical description of covalent bonding is characterized by charge build-up between atoms. Thus, an intuitive approach to locating covalent bonds is to determine the location of increased electron density. This approach is pursued here, through post-processing of DFT calculations, which aids in the visualization of electron density reorganization. Electron density difference (EDD) maps have been generated by subtracting the super-positioned, non-interacting, atomic electron densities (procrystal) from the calculated electron density of $Ca_3AlSb_3$ [24]. EDD line-scans, shown in FIG. 25, illustrate the charge accumulation and depletion along both Al—Sb and Ca—Sb bonds. Part a) shows an Al—Sb bond forming the backbone of a tetrahedra chain (green curve) and two distinct Al—Sb bonds perpendicular to the chain (blue and orange curves). Symmetric accumulation of electron density between the atoms indicates that the Al—Sb bonds have covalent character, consistent with our understanding of bonding within the Zintl construct. This electron accumulation shows surprising symmetry, considering the large disparity in electronegativity of Al and Sb. In contrast, representative Ca—Sb line scans, shown in FIG. 25b, exhibit significant asymmetry in charge distribution, with the principle charge build-up nearer to the Sb side. EDD line scans of $SrZn_2Sb_2$ have shown similar features [30]. To further illustrate the bonding environment in $Ca_3AlSb_3$, EDD isosurfaces in FIG. 26 depict (a) charge accumulation and (b) depletion. Charge build-up at the mid-point between the Al and Sb atoms, indicative of covalent bonding, is readily observed.

Figure 27:
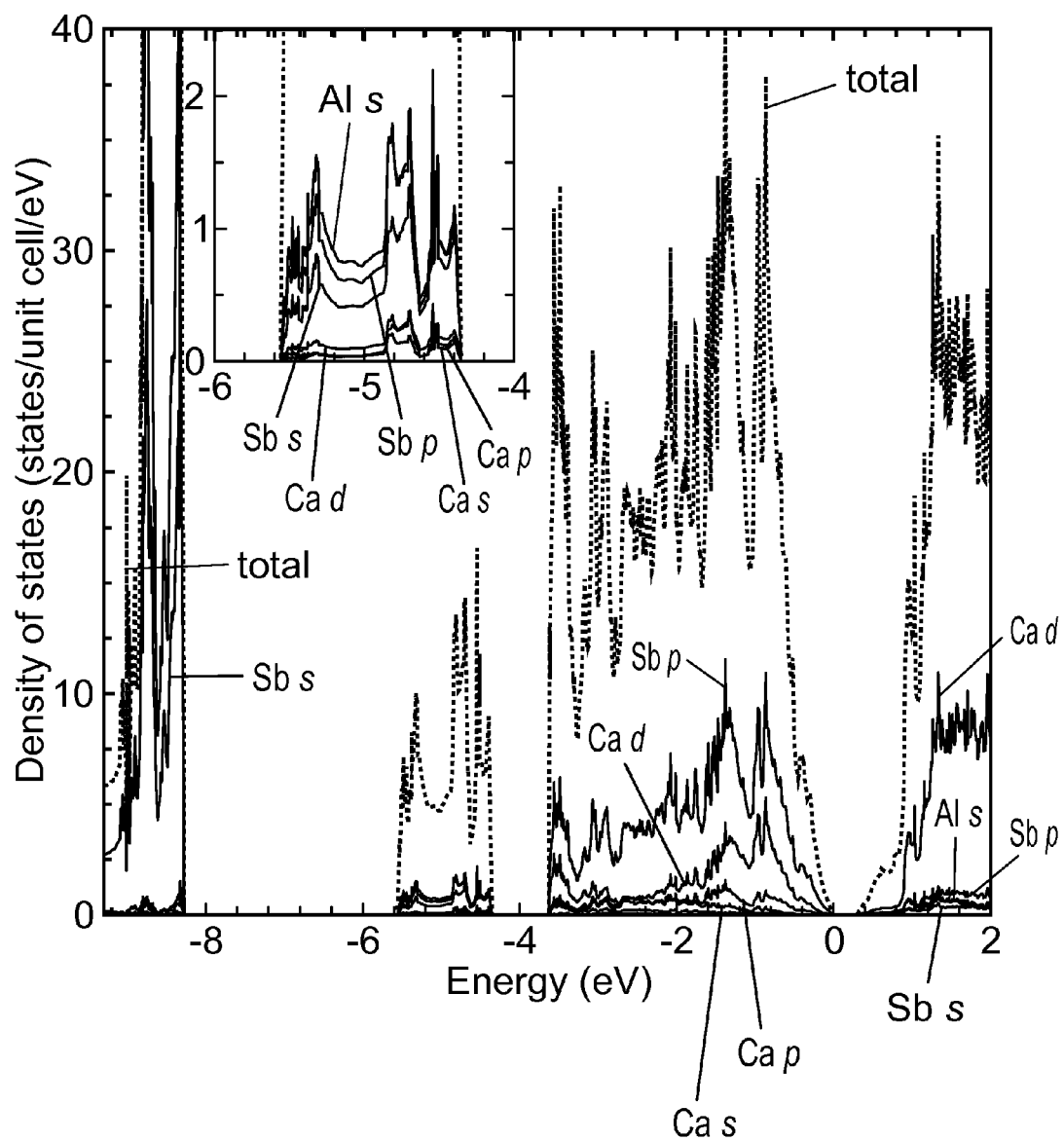
FIG. 27 demonstrates, in accordance with an embodiment of the invention, density of states of $Ca_3AlSb_3$ reveals a band gap at the Fermi level with a valence band edge dominated by Sb p states. The inset highlights interacting Al—Sb states.

As discussed above in reference to FIG. 24, the effective mass at the band edge is fundamental to electron transport. To engineer transport properties in this material, it is therefore important to have some understanding of the character of the valence band edge. Density of states calculations (DOS) (FIG. 27) indicate that Sb p states are a major component of the valence band edge, analogous to the calculated density of states for the $AZn_2Sb_2$ Zintl antimonides [30]. The isosurfaces in FIG. 26c illustrate the electron charge density at a specific energy near the valence band edge (−0.1 eV). The electron charge density is highest around the Sb sites, where oriented donut-like isosurfaces form, suggesting hole transport, and therefore hole mobility, is centered around the tetrahedral Sb, as has been found in the structurally related $A_{14}M\,Pn_{11}$ [31]. It is interesting to note that the light bands shown in the DOS span the Γ-Y, Γ-Z, and Γ-T directions, corresponding to the y-z plane containing the donut-like charge density isosurfaces.

Thermal Transport Properties

Figure 28:
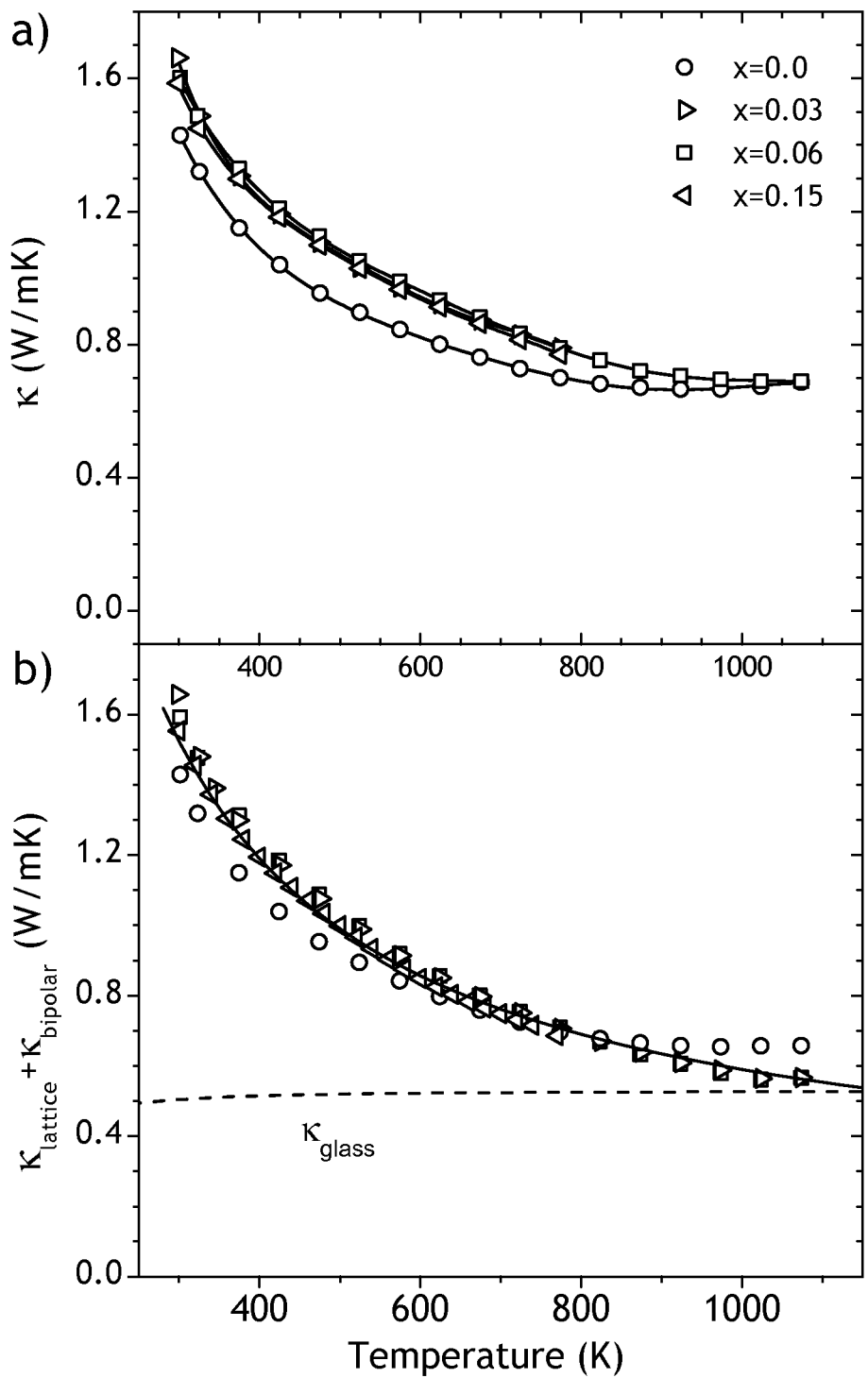
FIG. 28 demonstrates, in accordance with an embodiment of the invention, a) total thermal conductivity of $Ca_{3-x}Na_x$-$AlSb_3$ (x=0, 0.03, 0.06, 0.15). b) $k_l$ exhibits 1/T temperature dependence (upper curve). At high temperatures, $k_l+k_B$ approaches the glassy limit (lower curve).

Thermal diffusivity was measured to 1073 K. The thermal conductivity was calculated using κ=$D\rho C_p$ where D=thermal diffusivity, ρ=density, $C_p$=heat capacity. Here, the geometric density and the Dulong-Petit approximation to the heat capacity ($C_p$=0.34 J/gK) are used. Total thermal conductivity, shown in FIG. 28a, is a combination of lattice, electronic, and bipolar contributions ($\kappa_{total}=\kappa_l+\kappa_e+\kappa_B$). The Wiedemann-Franz relation $$\left(\kappa_e = \frac{LT}{\rho}\right)$$

is used to estimate the electronic contribution to the thermal conductivity. Temperature dependent Lorenz numbers (L) were calculated within a single parabolic band approximation using Eq. 4, assuming a mobility limited by acoustic phonon scattering. The reduced chemical potential, η was calculated from experimental Seebeck coefficients.

$$L = \left(\frac{k_b}{e}\right)^2 \frac{3F_0(\eta)F_2(\eta) - 4F_1(\eta)^2}{F_0(\eta)^2} \quad (4)$$

In both doped and undoped $Ca_3AlSb_3$, $\upsilon_e$ is nearly zero, due to the relatively high electrical resistivity. Subtracting $\kappa_e$ from $\kappa_{total}$ leaves the lattice and bipolar contributions (FIG.

28b). There appears to be a significant bipolar contribution at temperatures above 900 K in the undoped material, while $\kappa_l$ is the dominant contribution in the doped samples. The temperature dependence of $\kappa_l$ is well described by the 1/T relationship expected for Umklapp scattering (solid curve). Doping with sodium does not result in a significant change in lattice thermal conductivity, as might be expected for low dopant concentrations and small mass contrast.

Room temperature ultrasonic measurements of undoped Ca$_3$AlSb$_3$ yield longitudinal and transverse speeds of sound of 4170 m/s and 2440 m/s respectively. From these, a mean speed of sound of 2710 m/s and an effective Debye temperature of 261 K are calculated using Eq. 5 and Eq. 6.

$$v_m^3 = \frac{3}{v_l^{-3} + 2v_t^{-3}} \quad (5)$$

$$\phi_D = \frac{v_m \hbar}{k_b}\left(\frac{6\pi^2}{V}\right)^{1/3} \quad (6)$$

An estimate of the lower bound for the lattice thermal conductivity can be made using Eq. 7, where the sum is over three vibrational modes (one longitudinal and two transverse) and where $\Theta_i = v_i(h/k_b)(6\pi^2/V)^{1/3}$. Because this model assumes a minimum scattering length as a function of phonon frequency, this is termed the glassy limit of the thermal conductivity [32].

$$\kappa_{min} = \left(\frac{\pi}{6}\right)^{1/3} \frac{\kappa_b}{V^{2/3}} \sum_i v_i \left(\frac{T}{\phi_i}\right)^2 \int_0^{\phi_i T} \frac{x^3 e^x}{(e^x - 1)^2} dx \quad (7)$$

At high temperature, $\kappa_l$ approaches the predicted glassy limit. This low lattice thermal conductivity is most likely a result of the complex crystal structure and large unit cell size of Ca$_3$AlSb$_3$. With 28 atoms per unit cell, the phonon dispersion of Ca$_3$AlSb$_3$ has a large number of relatively flat optical modes, and therefore, the vast majority of the heat capacity is contained in near-zero group velocity modes which contribute minimally to the lattice thermal conductivity.

Figure of Merit

Figure 29:
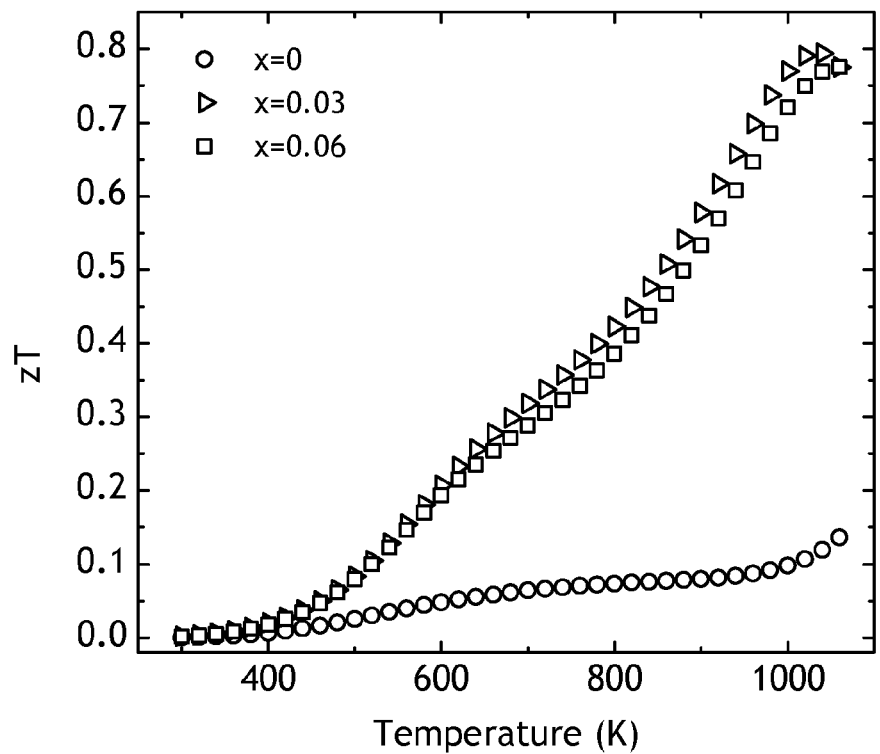
FIG. 29 demonstrates, in accordance with an embodiment of the invention, high temperature figure of merit of $Ca_{3-x}Na_xAlSb_3$ yields a maximum value of 0.8 at 1050 K.
Figure 30:
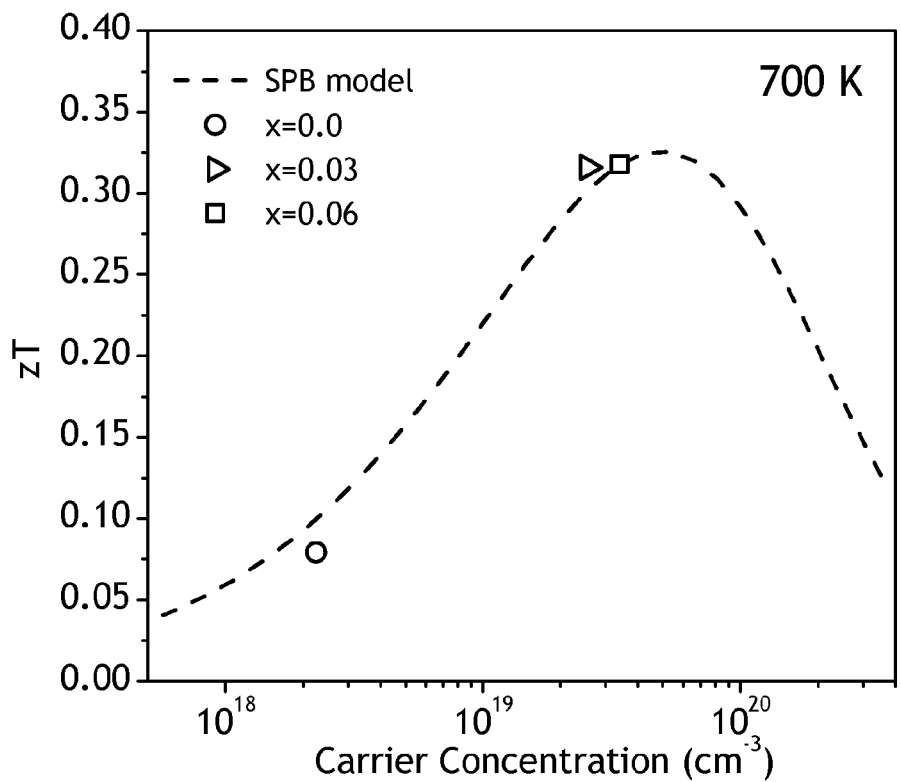
FIG. 30 demonstrates, in accordance with an embodiment of the invention, experimental zT versus carrier concentration for $Ca_{3-x}Na_xAlSb_3$. The dashed line was generated using a single parabolic band model, with an effective mass of 0.8 $m_e$, and intrinsic mobility 15 cm²/Vs and lattice thermal conductivity of 0.78 W/mK.

The figure of merit of the x=0-0.06 compositions, calculated from the high temperature results presented above, are shown in FIG. 29. The x=0.15 data is not included here, due to the significant presence of the sodium-rich impurity phase. A maximum zT value of 0.8 is obtained at 1050 K for the samples with x=0.03 and x=0.06. In FIG. 30, the experimental zT versus carrier concentration is compared to a single parabolic band model (dashed line). The inventors have again focused on transport at 700 K to avoid error associated with activated carriers at higher temperatures and to clearly be in a regime where transport is limited by phonon scattering. The measured Seebeck coefficient and carrier concentration of the x=0.06 sample were used as inputs in Eq. 1 and Eq. 2 to calculate an effective mass of 0.8 m$_e$, as described above. Eq. 4 determines the carrier concentration dependence of the Lorenz number, while a constant lattice thermal conductivity (0.78 W/mK) is used. Eq. 8 is used to determine the carrier concentration dependence of the mobility where $\mu_o$=15 cm$^2$/Vs is calculated from the mobility and reduced chemical potential ($\eta$) of the x=0.06 sample at 700 K.

$$\mu_H = \mu_0 \frac{\pi^{1/2} F_\lambda(\eta)}{2\Gamma(1+\lambda)F_{1/2}(\eta)} \quad (8)$$

The maximum carrier concentration obtained experimentally, 4×10$^{19}$ holes/cm$^3$, is close to the optimum carrier concentration of 5×10$^{19}$ holes/cm$^3$ predicted by the model at 700 K. However, the maximum zT of this material occurs at higher temperatures, at which point lightly doped material is susceptible to reduction in thermoelectric voltage due to minority carrier activation. A single parabolic band model does not take carrier activation into account, and therefore, while accurate at 700 K, likely underestimates the optimum carrier concentration for a maximum zT at higher temperatures. This, in addition to the likelihood of a heavy band located near −0.13 eV, suggest that higher carrier concentrations will result in higher zT values than reported here.

Example 16

Conclusion

The exploration of complex Zintl compounds (Yb$_{14}$MnSb$_{11}$, CaZn$_2$Sb$_2$, Ba$_8$Ga$_{16}$Ge$_{30}$, CsBi$_4$Te$_6$, Ca$_5$Al$_2$Sb$_6$) [10-13, 26, 30, 33] continues to reveal good thermoelectric materials, with properties that can be readily rationalized through simple chemical principles. Here, the inventors have described a new thermoelectric material, Ca$_3$AlSb$_3$, a p-type semiconductor composed of Earth-abundant, non-toxic elements. Electronic structure calculations suggest that the valence band edge is effectively two nested parabolic bands, which are dominated by Sb p states. Carrier concentration control has been achieved by substituting Ca$^{+2}$ with Na$^{+1}$. High temperature transport properties can be modeled with parabolic bands and acoustic phonon scattering of charge carriers to guide further optimization of the material. The lattice thermal conductivity is found to approach the glassy minimum at high temperature (0.6 W/mK at 1050 K), behavior attributed to a complex unit cell. The combination of low lattice thermal conductivity and a sufficiently large band gap to maintain degenerate behavior at high temperature leads to a zT of 0.8 at 1050 K, with higher zT likely at higher carrier concentrations.

Example 17

Identifying Additional Zintl Compounds

The inventors can take advantage of two underutilized strategies in the field of thermoelectrics—crystalline complexity for low lattice thermal conductivity, and high band degeneracy for enhanced power factor.

In order to investigate selected Zintl compounds that have not yet been studied for thermoelectric applications, a 3-tiered selection process can be employed. Using chemical intuition as a foundation, the inventors select crystal structures with potential for both intrinsically low lattice thermal conductivity, and good electronic transport. To guide the narrowing of this pool of candidates, electronic structure calculations can be used to estimate the band degeneracy, band mass, and band gap. Finally, the most promising materials can be studied experimentally; if the properties predicted by both chemistry and electronic structure calculations are confirmed, thermoelectric optimization can be pursued through doping.

As previously disclosed herein, Zintl compounds are a class of intermetallics characterized by highly electronegative cations, which donate electrons to covalently bound, anionic substructures. The prevalence of complex crystal structures in Zintl compounds arises from their need to satisfy valence requirements through the formation of covalent substructures. As discussed above, such complexity leads to extremely low lattice thermal conductivity due to confinement of heat in low velocity, optical phonon modes, as well as additional opportunities for scattering events. Indeed, among bulk materials, Zintl compounds exhibit some of the lowest reported lattice thermal conductivities. The requirement that Zintl compounds must satisfy chemical-valence means that the Fermi level is always located at the band gap. Assuming a band gap exists, a Zintl compound should exhibit semiconducting behavior, and thus doping is required to tune the Fermi level. Complexity in Zintl compounds also leads to many available sites for doping or isoelectronic substitutions, and thus to extensive opportunities to tune transport properties.

As disclosed herein, Zintl compounds have emerged as promising candidates for thermoelectric applications due to their rich chemistry and exceptionally low lattice thermal conductivity. In the past decade, a number of complex Zintl phases with desirable thermal properties have been identified as promising thermoelectric materials.

Within this family of compounds, numerous unique crystal structures have been identified, but never further investigated. The inventors have focused on this largely untapped source of materials. As disclosed herein, both $Ca_5Al_2Sb_6$ and $Ca_3AlSb_3$ exhibit extremely low lattice thermal conductivity and promising figures of merit (0.6 and 0.8 respectively). However, these are only a few out of a vast pool of unstudied Zintl compounds.

While solid-state chemistry has made enormous progress in identifying new crystal structures in the past few decades, the study of the transport properties of these new materials has not kept pace. With more crystal structures discovered every year, the number of unique structures to characterize far exceeds the capability of the field. From knowledge of the crystal structure alone, the following can be predicted:

Lattice thermal conductivity from the density and unit cell complexity can be estimated.

Bonding characteristics provide clues to a material's potential mobility. Does the covalent substructure form a connected path for transport?

The band gap trends with electronegativity. Moving down the periodic table, band gaps shrink.

Symmetry limits the maximum valley band degeneracy.

The following is a list of Zintl compounds and homologous series. The information provided acts as a guide to the suitability of each material for thermoelectric applications, based on the selection criteria described above.

TABLE 3

| Compound | Covalent substructure | atoms/cell | Space group | Symmetry | max valley | Transport properties | refs |
|---|---|---|---|---|---|---|---|
| $Sr_5Al_2Sb_6$ | Curvy chains | 52 | P n m a (62) | ortho. | 8 | no | |
| $Ca_5Sn_2As_6$ | Chains | 26 | P b a m (55) | ortho. | 8 | no | |
| $Ba_3GaSb_3$ | Staggered pairs | 54 | Pnma (62) | ortho. | 8 | no | |
| $Sr_3GaSb_3$ | Spiral chains | 28 | Cmca (64) | ortho. | 8 | no | |
| $Ba_3AlSb_3$ | Aligned pairs | 28 | Cmca (64) | ortho. | 8 | no | |
| $Na_7Al_2Sb_5$ | Kinked chains, corner and edge linked | 28 | P 1 21/m 1 (11) | mono. | 4 | no | |
| $Na_2Al_2Sb_3$ | 2D planes sandwiched between Na layers | 54 | P 1 21/c 1 (14) | mono. | 4 | no | |
| $Ba_3Ga_4Sb_5$ | 3D structure with 1D tunnels for Ba | 48 | P n m a (62) | ortho. | 8 | DOS, narrow band gap | |
| $BaGa_2Sb_2$ | 3D structure with 1D tunnels for Ba | 40 | P n m a (62) | ortho. | 8 | DOS, 0.35 eV | |
| $Eu_7Ga_6Sb_8$ | interconnected chains | 168 | P b c a (61) | ortho. | 8 | DOS, 0.6 eV | |
| $Sr_2MnSb_2$ | corrugated 2D layers | 60 | P n m a (62) | ortho. | 8 | no | |
| $Sr_3Si_2As_6$ | Kinked chains, corner and edge linked | 18 | C 1 2/c 1 (15) | mono. | 4 | no | |
| $Sr_3Ge_2As_4$ | chains of pentagons | 36 | P 1 21/c 1 (14) | mono. | 4 | no | |
| $Eu_{10}Mn_6Sb_{13}$ | complex double layers | 58 | C 1 2/m 1 (12) | mono. | 4 | small gap from transport | |
| $Ba_8In_4Sb_{16}$ | Wide zig-zag chains | | | | | DOS, transport, small gap | |
| $Ba_2In_5As_5$ | thick planes | 48 | P n m a (62) | ortho. | 8 | DOS, transport, very small gap | davis |

In a number of compounds, the low temperature transport properties (ρ and σ) or the calculated electronic density of states (DOS) have already been reported. The DOS and the temperature dependence of ρ and a can indicate whether or not a material has a band gap—a very important selection criterion.

REFERENCES

Experiments I
[1] Snyder, G. J.; Toberer, E. S. *Nature Mater.* 2008, 7, 105.
[2] Kauzlarich, S. M. *Chemistry, Structure, and Bonding of Zintl Phases and Ions*; Wiley-VCH, 1996.
[3] Kauzlarich, S. M.; Brown, S. R.; Snyder, G. J. *Dalton Trans.* 2007, 21, 2099.
[4] Toberer, E. S.; May, A. F.; Snyder, G. J. *Chem. Mater.* 2010, 22, 624-634.
[5] Brown, S. R.; Kauzlarich, S. M.; Gascoin, F.; Snyder, G. J. *Chem. Mater.* 2006, 18, 1873.
[6] Toberer, E. S.; Cox, C. A.; Brown, S. R.; Ikeda, T.; May, A. F.; Kauzlarich, S. M.; Snyder, G. J. *Adv. Funct. Mater.* 2008, 18, 2795.
[7] May, A. F.; Toberer, E. S.; Saramat, A.; Snyder, G. J. *Phys. Rev. B* 2009, 80, 125205.
[8] Wang, X.-J.; Tang, M.-B.; Zhao, J.-T.; Chen, H.-H.; Yang, X.-X. *Appl. Phys. Lett.* 2007, 90, 232107.
[9] Ponnambalam, V.; Gao, X.; Lindsey, S.; Alboni, P.; Su, Z.; Zhang, B.; Drymiotis, F.; Daw, M. S.; Trill, T. M. *J. Alloys Comp.* 2009, 484, 80-85.
[10] Brown, S. R.; Toberer, E. S.; Ikeda, T.; Cox, C. A.; Gascoin, F.; Kauzlarich, S. M.; Snyder, G. J. *Chem. Mater.* 2008, 20, 3412-3419.
[11] Toberer, E. S.; Brown, S. R.; Ikeda, T.; Kauzlarich, S. M.; Snyder, G. J. *Appl. Phys. Let.* 2008, 93, year.
[12] Gascoin, F.; Ottensmann, S.; Stark, D.; Haile, S. M.; Snyder, G. J. *Adv. Funct. Mater.* 2005, 15, 1860.
[13] Yu, C.; Zhu, T. J.; Zhang, S. N.; Zhao, X. B.; He, J.; Su, Z.; Trill, T. M. *J. Appl. Phys.* 2008, 104,.
[14] Wang, X.-J.; Tang, M.-B.; Chen, H.-H.; Yang, X.-X.; Zhao, J.-T.; Burkhardt, U.; Grin, Y. *Appl. Phys. Lett.* 2009, 94,.
[15] Brown, S. R.; Kauzarich, S. M.; Gascoin, F.; Snyder, G. J. *J. Sol. State Chem.* 2007, 180, 1414.
[16] Young, D. M.; Kauzlarich, S. M. *Chem. Mater.* 1995, 7, 206-209.
[17] Xia, S.-Q.; Hullmann, J.; Bobev, S.; Ozbay, A.; Nowak, E. R.; Fritsch, V. *J. Solid State Chem.* 2007, 180, 2088-2094.
[18] Bobev, S.; Fritsch, V.; Thompson, J. D.; Sarrao, J. L.; Eck, B.; Dronskowski, R.; Kauzlarich, S. M. *J. Solid State Chem.* 2005, 178, 1071-1079.
[19] Yi, T.; Cox, C. A.; Toberer, E. S.; Snyder, G. J.; Kauzlarich, S. M. *Chem. Mater.* 2010, 22, 935-941.
[20] Park, S.; Choi, E.; Kang, W.; Kim, S. J. *Mater. Chem.* 2002, 12, 1839-1843.
[21] Kim, S. J.; Ireland, J. R.; Kannewurf, C. R.; Kanatzidis, M. G. *J. Solid State Chem.* 2000, 155, 55-61.
[22] Todorov, I.; Chung, L., D. Y. and Ye; Freeman, A. J.; Kanatzidis, M. G. *Inorg. Chem.* 2009, 48, 4768-4776.
[23] Cordier, G.; Czech, E.; Jakowski, M.; Schaefer, H. *Rev. Chimie Minerale* 1981, 18, 9-18.
[24] Goldsmid, H. J.; Sharp, J. W. *J. Electron. Mater.* 1999, 28, 869.
[25] Cox, C. A.; Toberer, E. S.; Levchenko, A. A.; Brown, S. R.; Snyder, G. J.; Navrotsky, A.; Kauzlarich, S. M. *Chem. Mater.* 2009, 21, 13541360.
[26] Delaire, O.; May, A. F.; McGuire, M. A.; Porter, W. D.; Lucas, M. S.; Stone, M. B.; Abernathy, D. L.; Ravi, V. A.; Firdosy, S. A.; Snyder, G. J. *Phys. Rev. B* 2009, 80, 184302.
[27] Sales, B. C.; Jin, R.; Mandrus, D.; Khalifah, P. *Phys. Rev. B* 2006, 73, 224435.

Experiments II
[1] G. J. Snyder, E. S. Toberer, Nature Mater. 7 (2008) 105.
[2] E. S. Toberer, A. F. May, G. J. Snyder, Chem. Mater. 22 (2009) 624-634.
[3] M. Roufosse, P. G. Klemens, Phys. Rev. B 7 (1973) 5379-5386.
[4] G A Slack, Solid State Physics, Vol. 34, Academic Press, New York, 1979.
[5] L. E. Bell, Science 321 (2008) 1457.
[6] S. M. Kauzlarich, Chemistry, Structure, and Bonding of Zintl Phases and Ions, Wiley-VCH, 1996.
[7] S. M. Kauzlarich, S. R. Brown, G. J. Snyder, Dalton Trans. 21 (2007) 2099.
[8] G. A. Papoian, R. Hoffmann, Angewandte Chemie 39 (2000) 2408-2448.
[9] M. Mills, R. Lam, M. J. Ferguson, L. Deakin, A. Mar, Coordination Chem. Rev. 233-234 (2002) 207-222.
[10] E. S. Toberer, C. A. Cox, S. R. Brown, T. Ikeda, A. F. May, S. M. Kauzlarich, G. J. Snyder, Adv. Funct. Mater. 18 (2008) 2795.
[11] S. R. Brown, S. M. Kauzlarich, F. Gascoin, G. J. Snyder, Chem. Mater. 18 (2006) 1873.
[12] E. S. Toberer, S. R. Brown, T. Ikeda, S. M. Kauzlarich, G. J. Snyder, Appl. Phys. Let. 93 (2008) 062110.
[13] E. S. Toberer, A. Zevalkink, G. J. Snyder, Adv. Funct. Mater. Accepted.
[14] G. Cordier, H. Schaefer, M. Stelter, Z. Naturforsch 39b (1984) 727-732.
[15] G. Cordier, M. Stelter, H. Schaefer, J. of Less Common Metals 98 (1984) 285-290.
[16] G. Cordier, M. Stelter, H. Schaefer, Z. Naturforschung 37 (1982) 975-980.
[17] H. Schaefer, Ann. Rev. Mater. Sci 15 (1985) 1-41.
[18] G. Cordier, E. Czech, M. Jakowski, H. Schaefer, Rev. Chemie Minerale 18 (1981) 9-18.
[19] C. Wood, D. Zoltan, G Stapfer, Rev. Sci. Instruments 56 (1985) 719.
[20] G. Kresse, J. Hafner, Phys. Rev. B 47 (1993) 558-561.
[21] G. Kresse, J. Furthmuller, Comput. Mater. Sci. 6 (1996) 15-50.
[22] J. P. Perdew, K. Burke, M. Ernzerhof, Phys. Rev. Lett. 77 (1996) 3865-3868.
[23] G. Kresse, D. Joubert, Phys. Rev. B 59 (1999) 1758-1775.
[24] E. Flage-Larsen, O. M. Lvvik, O. Prytz, J. Taft, Comp. Mater. Sci. 47 (2010) 752-757.
[25] U. I. Ravich, B. A. Efimova, I. A. Smirnov, Semiconducting lead chalcogenides, Plenum Press, 1970.
[26] A. F. May, E. S. Toberer, A. Saramat, G. J. Snyder, Phys. Rev. B 80 (2009) 125205.
[27] V. I. Fistul, Heavily Doped Semiconductors, Plenum Press, 1969.
[28] H. J. Goldsmid, J. W. Sharp, J. Electron. Mater. 28 (1999) 869.
[29] A. F. May, D. J. Singh, G. J. Snyder, Phys. Rev. B B 79 (2009) 153101.
[30] E. S. Toberer, A. F. May, B. C. Melot, E. Flage-Larsen, G. J. Snyder, Dalton Trans. 39 (2009) 1046-10054.
[31] D. S'anchez-Portal, R. M. Martin, S. M. Kauzlarich, W. E. Pickett, Phys. Rev. B 65 65 (2002) 144414.
[32] D. G. Cahill, R. 0. Pohl, Ann. Rev. Phys. Chem. 39 (1988) 93-121.

[33] D-Y Chung, T. Hogan, P. Brazis, M Rocci-Lane, C. Kannewurf, M. Bastea, C. Uher, M. Kanatzidis, Science 287 (2000) 1024-1027.

Additional References

Rehr, A.; Guerra, F.; Parkin, S.; Hope, H.; Kauzlarich, S. M., "KSB2, A NEW STRUCTURE COMPOSED OF RIBBONS OF EDGE-SHARED 6-MEMBERED SB RINGS." *Inorganic Chemistry* 1995, 34 (24), 6218-&.

Brauer, G.; Zintl, E., "Konstitution von Phosphiden, Arseniden, Antimoniden und Wismutiden des Lithiums, Natriums und Kaliums." *Z. Phys. Chem. Abt. B* 1937, 37, 323-352.

Hoenle, W.; G, v. S. H., "Zur Struktur von Li P und K Sb." *Z. Kristallogr.* 1981, 155, 307-314.

Kim, S. J.; Hu, S. Q.; Uher, C.; Kanatzidis, M. G., "Ba4In8Sb16: Thermoelectric properties of a new layered zintl phase with infinite zigzag Sb chains and pentagonal tubes." *Chemistry of Materials* 1999, 11 (11), 3154-3159.

Eisenmann, B.; Gieck, C.; Rossler, U., "Crystal structure of barium diantimonide, BaSb2." *Zeitschrift Fur Kristallographie-New Crystal Structures* 2001, 216 (1), 36-36.

Condron, C. L.; Kauzlarich, S. M.; Gascoin, F.; Snyder, G. J., "Thermoelectric properties and microstructure of Mg3Sb2." *J. Solid State Chem.* 2006, 179 (8), 2252-2257.

Deller, K.; Eisenmann, B., "BASB3 AN ANTIMONIDE WITH AN INFINITE 2-DIMENSIONAL SB32-N-ANION." *Zeitschrift Fur Naturforschung Section B-a Journal of Chemical Sciences* 1978, 33 (6), 676-677.

Derrien, G.; Monconduit, L.; Tillard, M.; Belin, C., "Pentabarium tetraantimonide, beta-Ba5Sb4: a more symmetrical arrangement for the Ba5Sb4 compound." *Acta Crystallographica Section C-Crystal Structure Communications* 1999, 55, 1044-1046.

Wang, X. J.; Tang, M. B.; Zhao, J. T.; Chen, H. H.; Yang, X. X., "Thermoelectric properties and electronic structure of Zintl compound BaZn2Sb2." *Applied Physics Letters* 2007, 90 (23).

Eisenmann, B.; Jordan, H.; Schafer, H., "ON BA2SB3, A NEW ZINTL PHASE WITH SB-6-CHAINS." *Zeitschrift Fur Naturforschung Section B-a Journal of Chemical Sciences* 1985, 40 (12), 1603-1606.

May, A. F.; Toberer, E. S.; Snyder, G. J., "Transport properties of the layered Zintl compound SrZnSb2." *Journal of Applied Physics* 2009, 106 (1).

Emmerling, F.; Laengin, N.; Pickhard, F.; Wendorff, M.; Roehr, C., "Verbindungen mit Pentelid-Hanteln M2: AI11 M6 and AII11 M10 (A=Rb, Cs, Ba; M=Sb, Bi)" *Z. Naturforsch., B* 2004, 59, 7-16.

Leon-Escamilla, E. A.; Corbett, J. D., "Hydrogen in polar intermetallics. Binary pnictides of divalent metals with Mn5Si3-type structures and their isotypic ternary hydride solutions." *Chemistry of Materials* 2006, 18 (20), 4782-4792.

Deller, K.; Eisenmann, B., "INTERMETALLIC COMPOUNDS CA11SB10 AND CA11BI10." *Zeitschrift Fur Naturforschung Section B-a Journal of Chemical Sciences* 1976, 31 (1), 29-34.

Deller, K.; Eisenmann, B., "PREPARATION AND CRYSTAL-STRUCTURE OF CASB2." *Zeitschrift Fur Anorganische Und Allgemeine Chemie* 1976, 425 (2), 104-108.

Cordier, G.; Schafer, H.; Stelter, M., "PREPARATION AND STRUCTURE OF CA14ALSB11." *Zeitschrift Fur Anorganische Und Allgemeine Chemie* 1984, 519 (12), 183-188.

Somer, M.; Peters, K.; Vonschnering, H. G., "CRYSTAL-STRUCTURE OF POTASSIUM CESIUM ANTIMONIDE TRIANTIMONIDOALUMINATE, K3CS6SB(ALSB3)." *Zeitschrift Fur Kristallographie* 1991, 195 (3-4), 316-317.

Cordier, G.; Stelter, M.; Schafer, H., "ZINTL PHASES WITH COMPLEX ANIONS—DATA ON SR6AL2SB6." *Journal of the Less-Common Metals* 1984, 98 (2), 285-290.

Cordier, G.; Stelter, M., "SR5AL2SB6 AND BA5IN2SB6-2 NEW ZINTL PHASES WITH DIFFERENT CHAIN ANIONS." *Zeitschrift Fur Naturforschung Section B-a Journal of Chemical Sciences* 1988, 43 (4), 463-466.

Cordier, G.; Schafer, H.; Stelter, M., "NEW ZINTL PHASES WITH CHAIN ANIONS—ON CA3ALSB3 AND CA5AL2BI6." *Zeitschrift Fur Naturforschung Section B-a Journal of Chemical Sciences* 1984, 39 (6), 727-732.

Cordier, G.; Ochmann, H.; Schafer, H., "NEW TYPES OF POLYANIONS IN ZINTL PHASES-ON NA7AL2SB5." *Zeitschrift Fur Anorganische Und Allgemeine Chemie* 1984, 517 (10), 118-124.

Cordier, G.; Ochmann, H.; Schafer, H., "NA2AL2SB3 AND K2AL2SB3, 2 NEW ZINTL PHASES WITH LAYERED ANIONS." *Revue De Chimie Minerale* 1984, 21 (3), 282-291.

Cordier, G.; Ochmann, H., "CRYSTAL-STRUCTURE OF POTASSIUM TECTO-TETRAANTIMONIDOALUMINATE, KALSB4." *Zeitschrift Fur Kristallographie* 1991, 195 (3-4), 308-309.

Owen, E. A.; Preston, G. D., "The atomic structure of two intermetallic compounds." *Proceedings of the Physical Society of London* 1924, 36, 341-348.

Cordier, G.; Schaefer, H.; Stelter, M. Zeitschrift fuer Naturforschung, Teil B. Anorganische Chemie, Organische Chemie (33, 1978-41, 1986) (1985) 40, p5-p8

Park, S.-M.; Choi, E. S.; Kang, W.; Kim, S.-J. Journal of Materials Chemistry (2002) 12, p1839-p1843

Verdier, P.; l'Haridon, P.; Maunaye, M.; Laurent, Y. Acta Crystallographica B (24, 1968-38, 1982) (1976) 32, p726-p728

Eisenmann, B.; Jordan, H.; Schaefer, H. Zeitschrift fuer Anorganische and Allgemeine Chemie (1985) 530, p74-p78

Eisenmann, B.; Jordan, H.; Schaefer, H. Journal of the Less-Common Metals (1986) 116, p251-p258

Sun Zhongming; Mao Jianggao; Pan Dachun Journal of Alloys Compd. (2006) 421, p190-p194

Fornasini, M. L.; Manfrinetti, P. Zeitschrift fuer Kristallographie—New Crystal Structures (2009) 224, (3) p345-p346 804645 Q [High Quality Data] [download]

Todorov, I.; Chung Duckyoung; Ye Linhui; Freeman, A. J.; Kanatzidis, M. G. Inorganic Chemistry (2009) 48, (11) p4768-p4776

Kim, S.-J.; Ireland, J. R.; Kannewurf, C. R.; Kanatzidis, M. G. Journal of Solid State Chemistry (2000) 155, p55-p61

Cordier, G.; Schaefer, H.; Stelter, M. Zeitschrift fuer Naturforschung, Teil B. Anorganische Chemie, Organische Chemie (33, 1978-41, 1986) (1985) 40, p1100-p1104 20863 Q [High Quality Data]

Cordier, G.; Schaefer, H.; Stelter, M. Zeitschrift fuer Naturforschung, Teil B. Anorganische Chemie, Organische Chemie (42, 1987-) (1987) 42, p1268-p1272

Cordier, G.; Savelsberg, G.; Schaefer, H. Zeitschrift fuer Naturforschung, Teil B. Anorganische Chemie, Organische Chemie (33, 1978-41, 1986) (1982) 37, p975-p980 15444 Q [High Quality Data]

Somer, M.; Carrillo-Cabrera, W.; Peters, K.; von Schnering, H. G.; Cordier, G. Zeitschrift fuer Kristallographie (149, 1979-) (1996) 211, p632-p632

Jiang, J.; Payne, A. C.; Olmstead, M. M.; Lee, H.-O.; Klavins, P.; Fisk, Z.; Kauzlarich, S. M.; Hermann, R. P.; Grandjean, F.; Long, G.-J. Inorganic Chemistry (2005) 44, (7) p2189-p2197

Alex Zevalkink, Eric S. Toberer, Tim Bleith, Espen Flage-Larsen, and

G. Jeffrey Snyder, Improved carrier concentration control in Zn-doped $Ca_5Al_2Sb_6$, J. Appl. Phys 110, 013721 (2011)

Alex Zevalkink, Jessica Swallow and G. Jeffrey Snyder, Thermoelectric properties of Mn-doped $Ca_5Al_2Sb_6$, J. Elect. Mater. Accepted 2011.

DiSalvo, *J. Science* 295, 703 (1999).

Iwanaga S., Toberer E. S., Lalonde A. & Snyder G. J. A high temperature apparatus for measurement of the Seebeck coefficient. *Rev. Sci. Instrum.* 82, 063905 (2011).

May, A. F., Toberer, E. S., Saramat, A. & Snyder, G. J. Characterization and analysis of thermoelectric transport in n-type Ba8Ga16☐xGe30☐x. *Phys. Rev. B* 80, 125205 (2009).

Pei, Y. et al. Convergence of bands for high thermoelectric performance. Nature (Accepted).

Slack, G. A. *Solid State Physics*, vol. 34 (Academic Press, New York, 1979).

Toberer, E. S., Zevalkink, A. & Snyder, G. J. Phonon engineering through crystal chemistry. submitted (2011).

Toberer, E. S., Zevalkink, A., Crisosto, N. & Snyder, G. J. The Zintl compound Ca5Al2Sb6 for low cost thermoelectric power generation. *Adv. Funct. Mat.* 20, 4375{4380 (2010).

Yan, Y. L., & Wang, Y. X. Crystal structure, electronic structure, and thermoelectric properties of Ca5Al2Sb6. *J. Mat. Chem* 21, 12497 (2011).

Zevalkink, A., Toberer, E. S., Bleith, T., Flage-Larsen, E., & Snyder, G. J. Improved carrier concentration control in Zn-doped Ca5Al2Sb6. *J. App. Phys.* 110, 013721 (2011).

Zevalkink, A., Swallow, J.,& Snyder, G. J. Thermoelectric properties of Mn-doped Ca5Al2Sb6.

Submitted.

What is claimed is:

1. A Zintl compound of the formula $A_5B_2C_6$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting either Na or K on the A site.

2. A Zintl compound of the formula $A_5B_2C_6$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting either Mn or Zn on the B site.

3. A Zintl compound of the formula $A_5B_2C_6$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting either Sn or Ge on the C site.

4. A Zintl compound of the formula $A_3BC_3$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting an element selected from either Na or K on the A site.

5. A Zintl compound of the formula $A_3BC_3$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting an element selected from either Mn or Zn on the B site.

6. A Zintl compound of the formula $A_3BC_3$, wherein A is selected from the group consisting of: Ca, Sr, and Ba; B is selected from the group consisting of: Al, In, Ga, and Sn; and C is selected from the group consisting of: P, As, Sb, and Bi, and wherein the compound has a carrier concentration adapted to be controlled by substituting an element selected from either Sn or Ge on the C site.

* * * * *